United States Patent
Shinozuka

(10) Patent No.: US 11,543,497 B2
(45) Date of Patent: Jan. 3, 2023

(54) SENSOR CHIP, ELECTRONIC EQUIPMENT, AND APPARATUS

(71) Applicant: Sony Semiconductor Solutions Corporation, Kanagawa (JP)

(72) Inventor: Yasuhiro Shinozuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 781 days.

(21) Appl. No.: 16/478,906

(22) PCT Filed: Sep. 12, 2018

(86) PCT No.: PCT/JP2018/033860
§ 371 (c)(1),
(2) Date: Jul. 18, 2019

(87) PCT Pub. No.: WO2019/123738
PCT Pub. Date: Jun. 27, 2019

(65) Prior Publication Data
US 2019/0383917 A1 Dec. 19, 2019

(30) Foreign Application Priority Data

Dec. 22, 2017 (JP) .............................. JP2017-245944

(51) Int. Cl.
*G01S 7/4865* (2020.01)
*G01S 7/08* (2006.01)
(Continued)

(52) U.S. Cl.
CPC ............ *G01S 7/4865* (2013.01); *G01S 17/08* (2013.01); *G01S 17/894* (2020.01); *H01L 27/14634* (2013.01); *H01L 27/14636* (2013.01)

(58) Field of Classification Search
CPC ......... G01C 3/08; G01S 7/497; G01S 7/4873; G01S 7/4865; G01S 17/08
See application file for complete search history.

(56) References Cited

U.S. PATENT DOCUMENTS 7,719,662 B2 * 5/2010 Bamji ................... G01S 17/894
356/5.1
9,658,336 B2 * 5/2017 Sun ......................... G01S 17/10
(Continued)

FOREIGN PATENT DOCUMENTS

EP 2 402 783 A1 1/2012
JP 2012-049547 A 3/2012
(Continued)

OTHER PUBLICATIONS

International Search Report and English translation thereof dated Dec. 11, 2018 in connection with International Application No. PCT/JP2018/033860.
(Continued)

*Primary Examiner* — Rowina J Cattungal
(74) *Attorney, Agent, or Firm* — Wolf, Greenfield & Sacks, P.C.

(57) ABSTRACT

[Problem]
The present disclosure proposes a technology that makes it possible to further reduce the influence of an error arising from a resolution of processing relating to measurement of the distance.
[Solving Means]
A sensor chip is provided which includes a light reception section configured to receive light projected from a light source and reflected by an imaging target to detect, for each given detection period, a reception light amount of the reflected light within the given period, a measurement section configured to measure a distance to the imaging object based on the reception light amount, and a control section configured to apply at least one of a first delay amount or a second delay amount, whose resolutions relating to control are different from each other, to control of a first timing at which the light reception section is to detect the reception light amount thereby to control a relative time
(Continued)

difference between the first timing and a second timing at which the light source is to project light with a resolution finer than the resolutions of the first delay amount and the second delay amount in response to the first delay amount and the second delay amount.

14 Claims, 46 Drawing Sheets

(51) Int. Cl.
    *G01S 17/08*     (2006.01)
    *G01S 17/894*     (2020.01)
    *H01L 27/146*     (2006.01)

(56) References Cited

U.S. PATENT DOCUMENTS

| | | | |
|---|---|---|---|
| 2008/0158555 A1* | 7/2008 | Mori | G01S 17/931 356/239.2 |
| 2009/0045359 A1* | 2/2009 | Kumahara | G01S 7/493 250/559.38 |
| 2010/0303299 A1* | 12/2010 | Cho | G01B 11/026 382/106 |
| 2013/0181119 A1* | 7/2013 | Bikumandla | G01S 7/4865 250/214.1 |
| 2013/0278917 A1* | 10/2013 | Korekado | G01S 7/484 356/5.01 |
| 2016/0061941 A1 | 3/2016 | Guo et al. | |
| 2016/0161611 A1 | 6/2016 | Ito et al. | |
| 2016/0363654 A1 | 12/2016 | Wyland | |
| 2017/0227643 A1* | 8/2017 | Nagai | G01S 7/4914 |

FOREIGN PATENT DOCUMENTS

| | | |
|---|---|---|
| JP | 2013-195306 A | 9/2013 |
| JP | 2017-032342 A | 2/2017 |
| JP | 2017-053769 A | 3/2017 |
| WO | WO 2015/025497 A1 | 2/2015 |
| WO | WO 2016/204992 A1 | 12/2016 |

OTHER PUBLICATIONS

International Written Opinion and English translation thereof dated Dec. 11, 2018 in connection with International Application No. PCT/JP2018/033860.
Extended European Search Report dated Jan. 28, 2020 in connection with European Application No. 18891672.0.
International Preliminary Report on Patentability and English translation thereof dated Jul. 2, 2020 in connection with International Application No. PCT/JP2018/033860.

\* cited by examiner

SENSOR CHIP, ELECTRONIC EQUIPMENT, AND APPARATUS

CROSS-REFERENCE TO RELATED APPLICATIONS

This application claims the benefit under 35 U.S.C. § 371 as a U.S. National Stage Entry of International Application No. PCT/JP2018/033860, filed in the Japanese Patent Office as a Receiving Office on Sep. 12, 2018, which claims priority to Japanese Patent Application Number JP2017-245944, filed in the Japanese Patent Office on Dec. 22, 2017, each of which is hereby incorporated by reference in its entirety.

TECHNICAL FIELD

The present disclosure relates to a sensor chip, electronic equipment, and an apparatus.

BACKGROUND ART

In recent years, in a sensor chip of a CMOS (Complementary Metal Oxide Semiconductor) image sensor, a ToF (Time of Flight) sensor, a fluorescence detection sensor or the like, it is demanded to perform control at a high speed. For example, in a sensor chip for which such high speed driving as exceeds a modulation frequency of 1 MHz is demanded, it is necessary to control pulses of a control signal on the order of sub microseconds or 10 nanoseconds.

For example, PTL 1 discloses a ToF sensor that outputs measurement information at random such that signal processing for tracking an object measured in a three-dimensional image can be carried out immediately.

CITATION LIST

Patent Literature

[PTL 1]
Japanese Patent Laid-Open No. 2012-049547

SUMMARY

Technical Problem

Incidentally, in the case where the ToF sensor described above is utilized to perform distance measurement, operation relating to projection of light to an object that becomes a target of light measurement (imaging object) and operation relating to detection of the light reflected by the object are sometimes synchronized with each other. In such a case as just described, upon measurement of the distance, an error arising from a resolution in processing relating to the synchronization reveals as an error of a distance measurement result and, after all, sometimes has an influence on the accuracy of the measurement.

Therefore, the present disclosure proposes a technology that makes it possible to further reduce the influence of an error arising from a resolution of processing relating to measurement of the distance.

Solution to Problem

According to the present disclosure, there is provided a sensor chip including a light reception section configured to receive light projected from a light source and reflected by an imaging target to detect, for each given detection period, a reception light amount of the reflected light within the given period, a measurement section configured to measure a distance to the imaging object based on the reception light amount, and a control section configured to apply at least one of a first delay amount or a second delay amount, whose resolutions relating to control are different from each other, to control of a first timing at which the light reception section is to detect the reception light amount thereby to control a relative time difference between the first timing and a second timing at which the light source is to project light with a resolution finer than the resolutions of the first delay amount and the second delay amount in response to the first delay amount and the second delay amount According to the present disclosure, there is provided electronic equipment including a light source, a light reception section configured to receive light projected from the light source and reflected by an imaging target to detect, for each given detection period, a reception light amount of the reflected light within the given period, a measurement section configured to measure a distance to the imaging object based on the reception light amount, and a control section configured to apply each of a first delay amount and a second delay amount, whose resolutions relating to control are different from each other, to control of one of a first timing at which the light reception section is to detect the reception light amount and a second timing at which the light source is to project light thereby to control a relative time difference between the first timing and the second timing with a resolution finer than the resolutions of the first delay amount and the second delay amount.

According to the present disclosure, there is provided an apparatus including a light source, a light reception section configured to receive light projected from the light source and reflected by an imaging target to detect, for each given detection period, a reception light amount of the reflected light within the given period, a measurement section configured to measure a distance to the imaging object based on the reception light amount, and a control section configured to apply each of a first delay amount and a second delay amount, whose resolutions relating to control are different from each other, to control of one of a first timing at which the light reception section is to detect the reception light amount and a second timing at which the light source is to project light thereby to control a relative time difference between the first timing and the second timing with a resolution finer than the resolutions of the first delay amount and the second delay amount.

Advantageous Effect of Invention

As described above, according to the present disclosure, a technology that can further reduce the influence of an error arising from a resolution of processing relating to measurement of the distance.

It is to be noted that the advantageous effect described above is not necessarily restrictive, and some advantageous effects indicated in the present specification or other advantageous effects that can be recognized from the present specification may be applicable together with the advantageous effect described above or in place of the advantageous effect described above.

DESCRIPTION OF EMBODIMENTS

Figure 1:
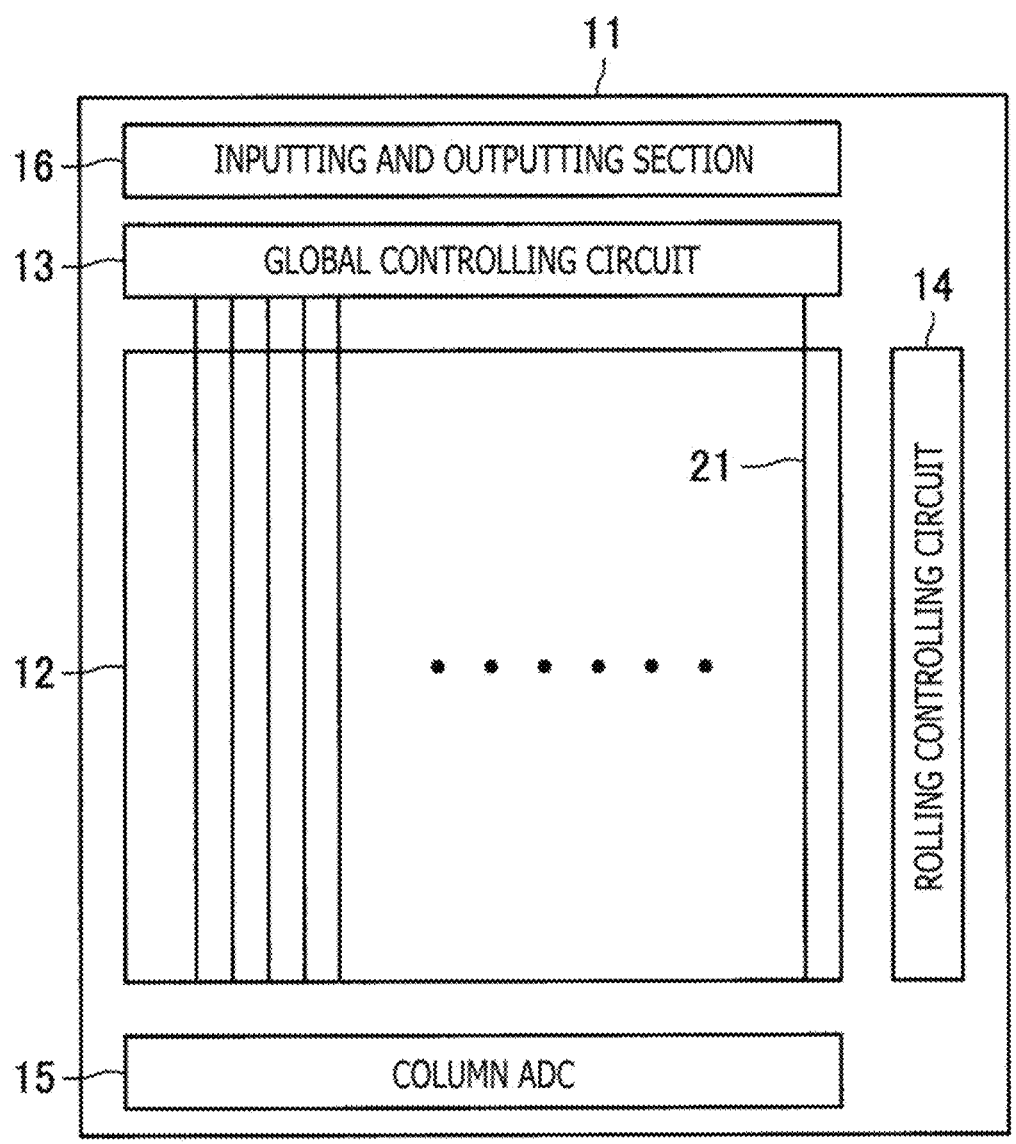
FIG. 1 is a block diagram depicting a configuration example of a first embodiment of a sensor chip to which the present technology is applied.

In the following, a preferred embodiment of the present disclosure is described in detail with reference to the accompanying drawings. It is to be noted that, in the present specification and drawings, components having substantially same functional configurations are denoted by like reference characters and overlapping description of them is omitted.

It is to be noted that the description is given in the following order.

1. Configuration Example
2. Overview of ToF
3. Technical Feature
4. Usage Example and Application Example
5. Conclusion <<1. Configuration Example>>

First, an example of a configuration of a sensor chip applied to a distance image sensor according to an embodiment of the present disclosure and an example of a configuration of the distance image sensor are described.

<First Configuration Example of Sensor Chip>

FIG. 1 is a block diagram depicting a configuration example of a first embodiment of a sensor chip to which the present technology is applied.

As depicted in FIG. 1, the sensor chip 11 is configured including a pixel array section 12, a global controlling circuit 13, a rolling controlling circuit 14, a column ADC (Analog-to-Digital Converter) 15 and an inputting and outputting section 16, which are disposed on a semiconductor substrate.

The pixel array section 12 is a rectangular region in which various sensor elements according to functions of the sensor chip 11, for example, photoelectric conversion elements that perform photoelectric conversion of light, are disposed in an array. In the example depicted in FIG. 1, the pixel array section 12 is a horizontally elongated rectangular region having a long side extending in the horizontal direction and a short side extending in the vertical direction.

The global controlling circuit 13 is a control circuit that outputs a global controlling signal for controlling the plurality of sensor elements disposed in the pixel array section 12 such that they are driven all at once (simultaneously) at a substantially same timing. In the configuration example of FIG. 1, the global controlling circuit 13 is disposed on the upper side of the pixel array section 12 such that the longitudinal direction thereof extends along a long side of the pixel array section 12. Accordingly, in the sensor chip 11, a control line 21 for supplying the global controlling signal outputted from the global controlling circuit 13 to the sensor elements of the pixel array section 12 is disposed in the upward and downward direction of the pixel array section 12 for each column of the sensor elements disposed in a matrix in the pixel array section 12.

The rolling controlling circuit 14 is a control circuit that outputs rolling controlling signals for controlling the plurality of sensor elements disposed in the pixel array section 12 such that the sensor elements are successively (sequentially) driven in order for each row. In the configuration example depicted in FIG. 1, the rolling controlling circuit 14 is disposed on the right side of the pixel array section 12 such that the longitudinal direction thereof extends along a short side of the pixel array section 12.

The column ADC 15 converts analog sensor signals outputted from the sensor elements of the pixel array section 12 to digital values with AD (Analog-to-Digital)) in parallel for the individual columns. At this time, the column ADC 15 can remove reset noise included in the sensor signals, for example, by performing a CDS (Correlated Double Sampling: correlated double sampling) process for the sensor signals.

The inputting and outputting section 16 has provided thereon terminals for performing inputting and outputting between the sensor chip 11 and an external circuit, and for example, power necessary for driving the global controlling circuit 13 is inputted to the sensor chip 11, for example, through the inputting and outputting section 16. In the configuration example depicted in FIG. 1, the inputting and outputting section 16 is disposed along the global controlling circuit 13 such that it is positioned adjacent the global controlling circuit 13. For example, since the global controlling circuit 13 has high power consumption, in order to reduce the influence of an IR drop (voltage drop), preferably the inputting and outputting section 16 is disposed in the proximity of the global controlling circuit 13.

The sensor chip 11 is configured in this manner, and a layout in which the global controlling circuit 13 is disposed so as to extend along a long side of the pixel array section 12 is adopted. Consequently, the distance from the global controlling circuit 13 to a sensor element disposed at the remote end of the control line 21 (the lower end in the example of FIG. 1) can be made shorter than that in an alternative layout in which the global controlling circuit 13 is disposed so as to extend along a short side of the pixel array section 12.

Accordingly, since the sensor chip 11 can improve the delay amount and the slew rate that occur with a global controlling signal outputted from the global controlling circuit 13, it can perform control for the sensor elements at a high speed. Especially, in the case where the sensor chip 11 is an image sensor that performs global shutter driving, high speed control of a transfer signal or a reset signal to be supplied to the pixels, an overflow gate signal and so forth becomes possible. On the other hand, in the case where the sensor chip 11 is a ToF sensor, high speed control of a MIX signal becomes possible.

For example, in a ToF sensor, a fluorescence detection sensor or the like, if the slew rate of a global controlling signal or the delay amount of a global controlling signal, which occurs in accordance with the distance from a driving element, or the like differs for each sensor element, then this gives rise to a detection error. In contrast, since the sensor chip 11 can improve the delay amount and the slew rage that occur in the global controlling signal as described above, such a detection error as described above can be suppressed.

Further, in the case where the sensor chip 11 is a ToF sensor, a fluorescence detection sensor or the like, not only such a number of times of on/off control as may exceed 100 times is required for an exposure period but also the current consumption increases because the toggle frequency is high. In contrast, in the sensor chip 11, the inputting and outputting section 16 can be disposed in the proximity of the global controlling circuit 13 as described above such that an independent wiring line can be provided for the power supply.

Further, while, in the sensor chip 11, the global controlling circuit 13 frequently operates during an exposure period, the rolling controlling circuit 14 remains stopping. On the other hand, in the sensor chip 11, while the rolling controlling circuit 14 operates within a reading out period, the global controlling circuit 13 frequently is stopping. Therefore, in the sensor chip 11, it is demanded to control the global controlling circuit 13 and the rolling controlling circuit 14 independently of each other. Further, in the sensor chip 11, in order to secure in-plane synchronization, it is general to adopt such a clock tree structure depicted in FIG. 2C as hereinafter described, preferably the global controlling circuit 13 is disposed independently of the rolling controlling circuit 14.

Accordingly, in the case where higher speed control is demanded as in the sensor chip 11, better control can be anticipated by adopting the layout in which the global controlling circuit 13 and the rolling controlling circuit 14 are individually and independently of each other. It is to be noted, if the global controlling circuit 13 and the rolling controlling circuit 14 are disposed individually and independently of each other, then any one of a layout in which they extend along a same direction and another layout in which they extend orthogonally to each other may be adopted.

It is to be noted that, although, in the description of the present embodiment, it is described that the upper side in each figure is the upper side of the pixel array section 12 and the lower side in each figure is the lower side of the pixel array section 12 in accordance with the configuration example depicted, if, for example, the global controlling circuit 13 is disposed so as to extend along a long side of the pixel array section 12, then similar working effects can be achieved on whichever one of the upper side and the lower side the global controlling circuit 13 is disposed. Further, this similarly applies also to the pixel array section 12 and the column ADC 15.

A configuration of the global controlling circuit 13 is described with reference to FIG. 2.

Figure 2:
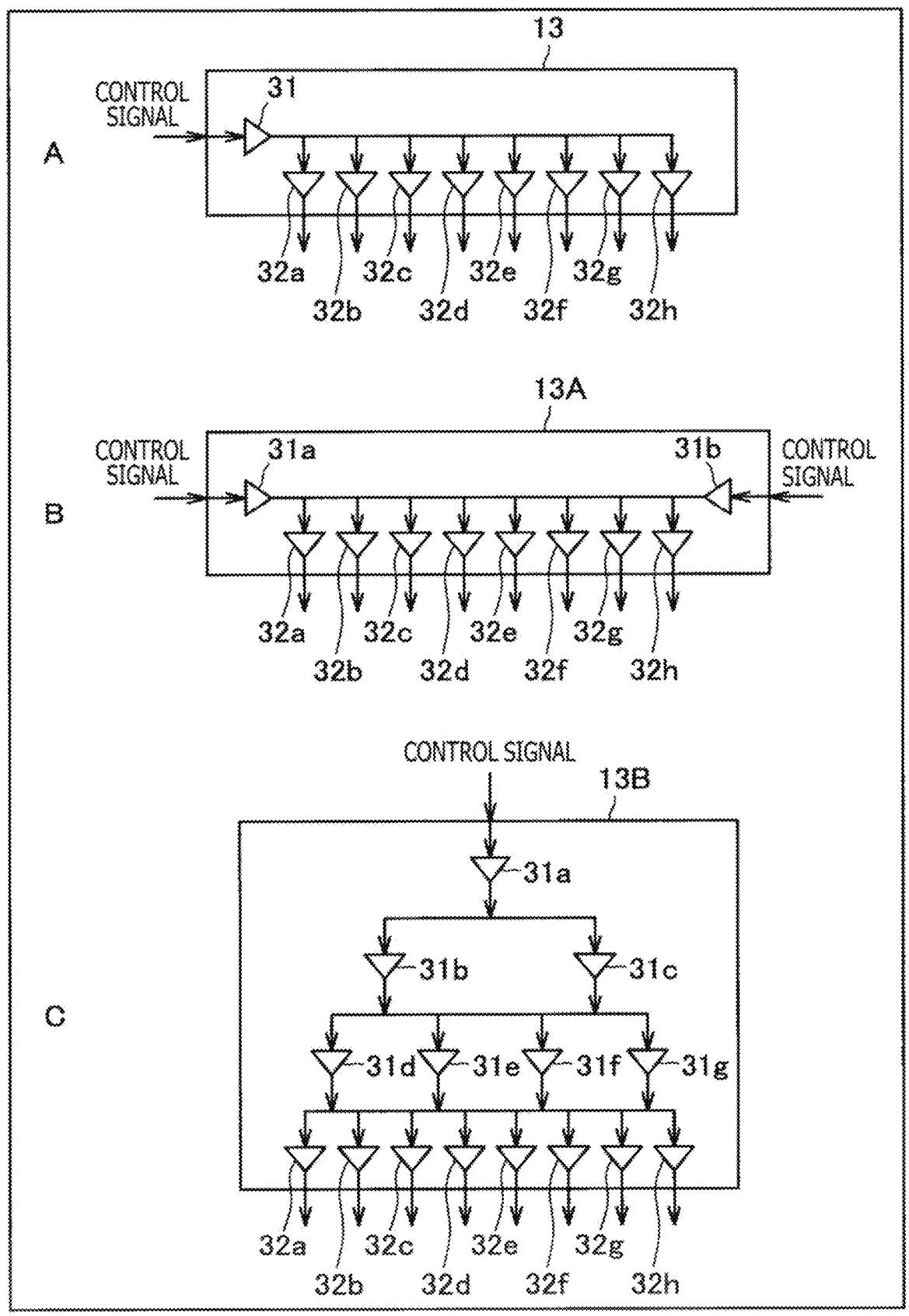
FIG. 2 is a view depicting a configuration example of a global controlling circuit.

FIG. 2A depicts a first configuration example of the global controlling circuit 13; FIG. 2B depicts a second configuration example of the global controlling circuit 13; and FIG. 2C depicts a third configuration example of the global controlling circuit 13. It is to be noted that, although the global controlling circuit 13 is configured such that it simultaneously outputs global controlling signals in accordance with the number of columns of sensor elements disposed in the pixel array section 12, in FIG. 2, as part of the configuration, a configuration that outputs eight global controlling signals at the same time is schematically depicted.

The global controlling circuit 13 depicted in FIG. 2A is configured including one internal buffer 31 and eight driving elements 32a to 32h.

As depicted in FIG. 2A, the global controlling circuit 13 has such a connection configuration that the internal buffer 31 is connected to one end of an internal wiring line provided along the longitudinal direction and the driving elements 32a to 32h are connected to the internal wiring line toward one direction according to the positions of the control lines 21. Accordingly, a global controlling signal inputted to the global controlling circuit 13 is supplied from one end side of the internal wiring line (in the example of FIG. 2, the left side) to the driving elements 32a to 32h through the internal buffer 31 and is simultaneously outputted to the control lines 21 individually connected to the driving elements 32a to 32h.

The global controlling circuit 13A depicted in FIG. 2B is configured including two internal buffers 31a and 31b and eight driving elements 32a to 32h.

As depicted in FIG. 2B, the global controlling circuit 13A has such a connection configuration that the internal buffers 31a and 31b are connected to the opposite ends of an internal wiring line provided along the longitudinal direction of the global controlling circuit 13A and the driving elements 32a to 32h are connected to the internal wiring line toward one direction according to the positions of the control lines 21 of FIG. 1. Accordingly, a global controlling signal inputted to the global controlling circuit 13A is supplied from the opposite ends of the internal wiring line through the internal buffers 31a and 31b to the driving elements 32a to 32h and is simultaneously outputted to the control lines 21 individually connected to the driving elements 32a to 32h.

The global controlling circuit 13B depicted in FIG. 2C is configured including seven internal buffers 31a to 31g and eight driving elements 32a to 32h.

As depicted in FIG. 2C, the global controlling circuit 13B has such a connection configuration that a clock tree structure is configured from the internal buffers 31a to 31g and, in the final stage, it is connected to the driving elements 32a to 32h disposed along one direction according to the positions of the control lines 21. For example, the clock tree structure is such a structure that a structure that, in the first stage, an output of one internal buffer 31 is inputted to two internal buffers 31 and, in the second state, inputs of the two internal buffers 31 are inputted to four internal buffers 31 is repeated in a plurality of stages. Accordingly, a global controlling signal inputted to the global controlling circuit 13B is supplied to the driving elements 32a to 32h through the clock tree structure configured from the internal buffers 31a to 31g and is simultaneously outputted to the control lines 21 connected to the driving elements 32a to 32h.

The global controlling circuit 13B having such a configuration as described above can avoid occurrence of a delay between the driving elements 32a to 32h and can ensure in-plane uniformity, for example, in comparison with the global controlling circuits 13 and 13A. In other words, it is preferable to adopt the global controlling circuit 13B in an application in which synchronization is requested strongly over a direction in which the driving elements 32 are lined up.

A configuration of the rolling controlling circuit 14 is described with reference to FIG. 3.

Figure 3:
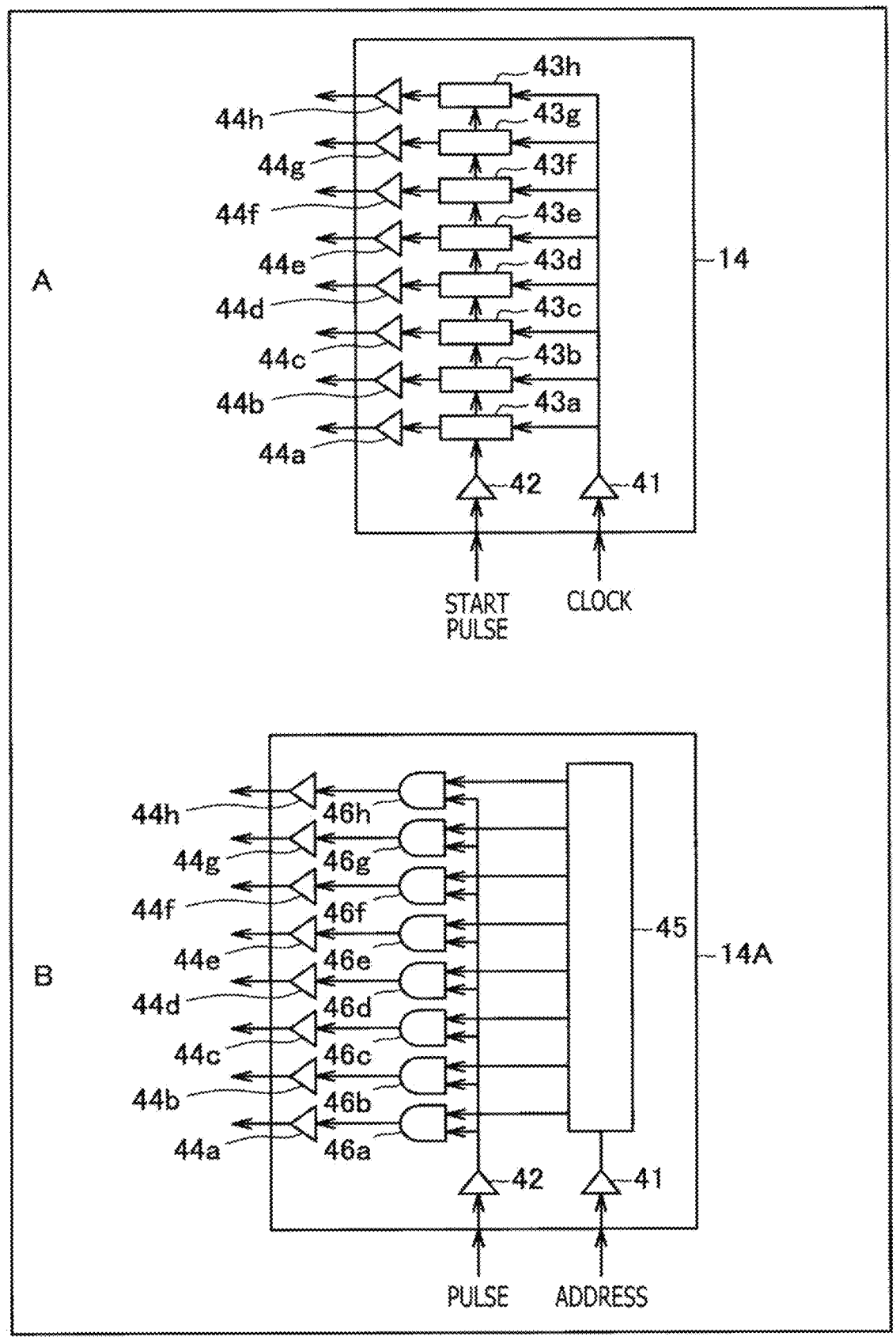
FIG. 3 is a view depicting a configuration of a rolling controlling circuit.

FIG. 3A depicts a first configuration example of the rolling controlling circuit 14, and FIG. 3B depicts a second configuration example of the rolling controlling circuit 14. It is to be noted that, although the rolling controlling circuit 14 is configured such that it sequentially outputs rolling controlling signals according to the row number of the sensor elements disposed in the pixel array section 12, in FIG. 3, as part of the configuration, a configuration that outputs eight rolling controlling signals sequentially is schematically depicted.

The rolling controlling circuit 14 depicted in FIG. 3A adopts a shift register system and is configured including two internal buffers 41 and 42, eight registers 43a to 43h and eight driving elements 44a to 44h. It is to be noted that, although the configuration example in which two internal buffers 41 and 42 are disposed is depicted for simplification, a configuration may otherwise be adopted in which a plurality of internal buffers are disposed according to wiring line lengths of the internal buffers.

As depicted in FIG. 3A, the rolling controlling circuit 14 has such a connection configuration that the internal buffer 41 is connected to one end of an internal wiring line provided along the longitudinal direction and the registers 43a to 43h are connected to the internal wiring line according to the positions of the rows of the sensor elements disposed in the pixel array section 12. Further, the rolling controlling circuit 14 has such a connection configuration that the internal buffer 42 is connected to the register 43a and the registers 43a to 43h are connected sequentially and besides the driving elements 44a to 44h are connected to the registers 43a to 43h, respectively.

Accordingly, in the rolling controlling circuit 14, a start pulse supplied to the register 43a through the internal buffer 42 is sequentially shifted to the registers 43a to 43h in accordance with a clock supplied through the internal buffer 41 and is sequentially outputted as rolling controlling signals from the driving elements 44a to 44h connected to the registers 43a to 43h, respectively.

The rolling controlling circuit 14A depicted in FIG. 3B adopts a decoder system and is configured including two internal buffers 41 and 42, a decoder 45, eight AND gates 46a to 46h and eight driving elements 44a to 44h. It is to be noted that, for the decoder 45, any one of a decoder of a type that includes a latch and a decoder of another type that does not include a latch may be used. For example, in the case where the decoder 45 is of the type that latches a signal, a system by which addresses are sent at once, another system by which addresses are sent divisionally or the like can be adopted.

As depicted in FIG. 3B, in the rolling controlling circuit 14A, the internal buffer 41 is connected to the decoder 45, and the internal buffer 42 is connected to an input terminal of the AND gates 46a to 46h and the decoder 45 is connected to an input terminal of the AND gates 46a to 46h for each row. Further, the rolling controlling circuit 14A has a connection configuration in which output terminals of the AND gates 46a to 46h are connected to the driving elements 44a to 44h, respectively.

Accordingly, in the rolling controlling circuit 14A, a pulse supplied to the AND gates 46a to 46h through the internal buffer 42 is sequentially outputted as rolling controlling signals from the driving elements 44a to 44h of rows designated by addresses supplied to the decoder 45 through the internal buffer 41.

As described with reference to FIGS. 2 and 3, the global controlling circuit 13 and the rolling controlling circuit 14 have circuit configurations different from each other.

Figure 4:
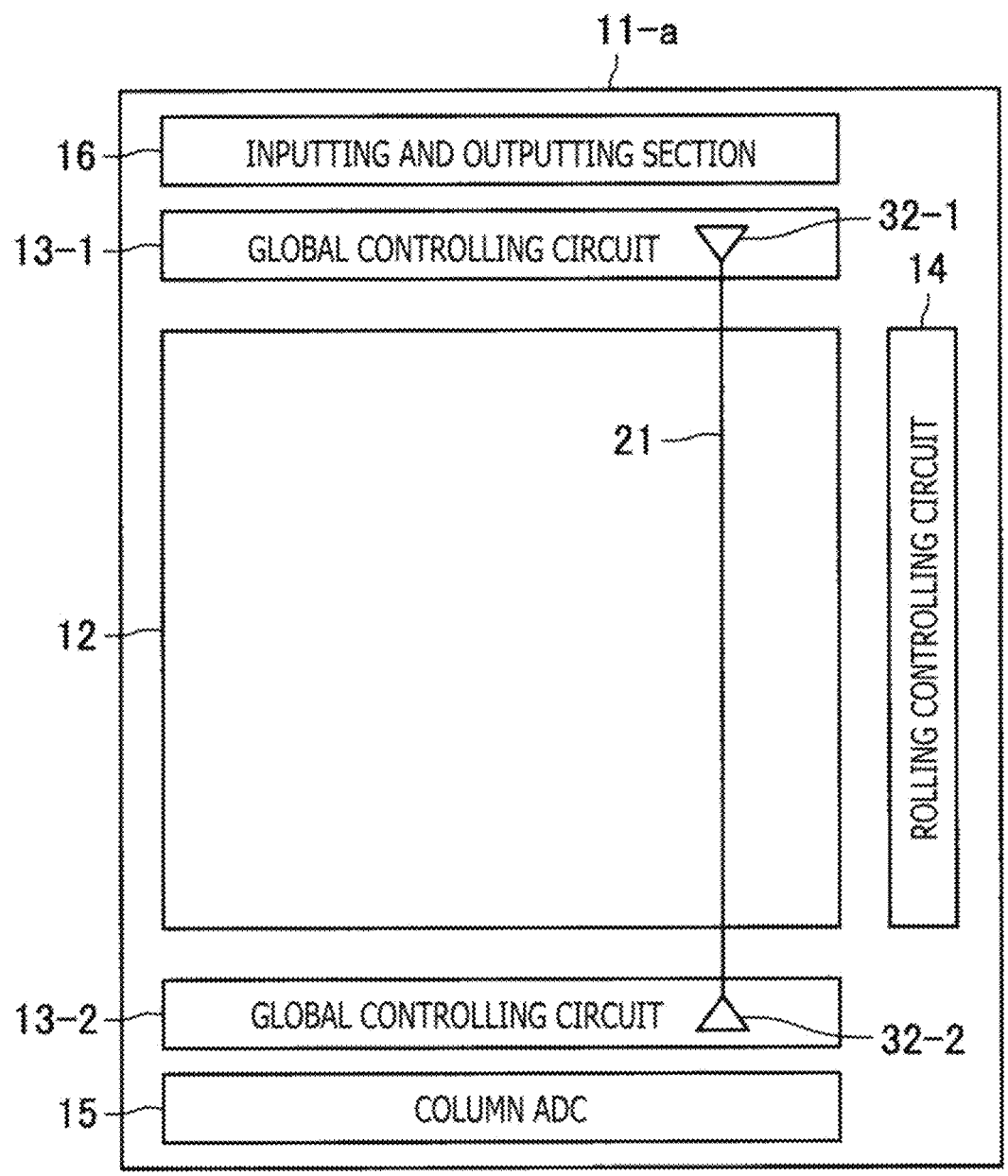
FIG. 4 is a block diagram depicting a first modification of a sensor chip of FIG. 1.

FIG. 4 is a block diagram depicting a first modification of the sensor chip 11 depicted in FIG. 1. It is to be noted that, from among blocks configuring the sensor chip 11-a depicted in FIG. 4, components common to those of the sensor chip 11 of FIG. 1 are denoted by like reference characters, and detailed description of them is omitted.

In particular, as depicted in FIG. 4, the sensor chip 11-a has a configuration common to the sensor chip 11 of FIG. 1 in terms of the disposition of the pixel array section 12, rolling controlling circuit 14, column ADC 15 and inputting and outputting section 16.

Figure 11:
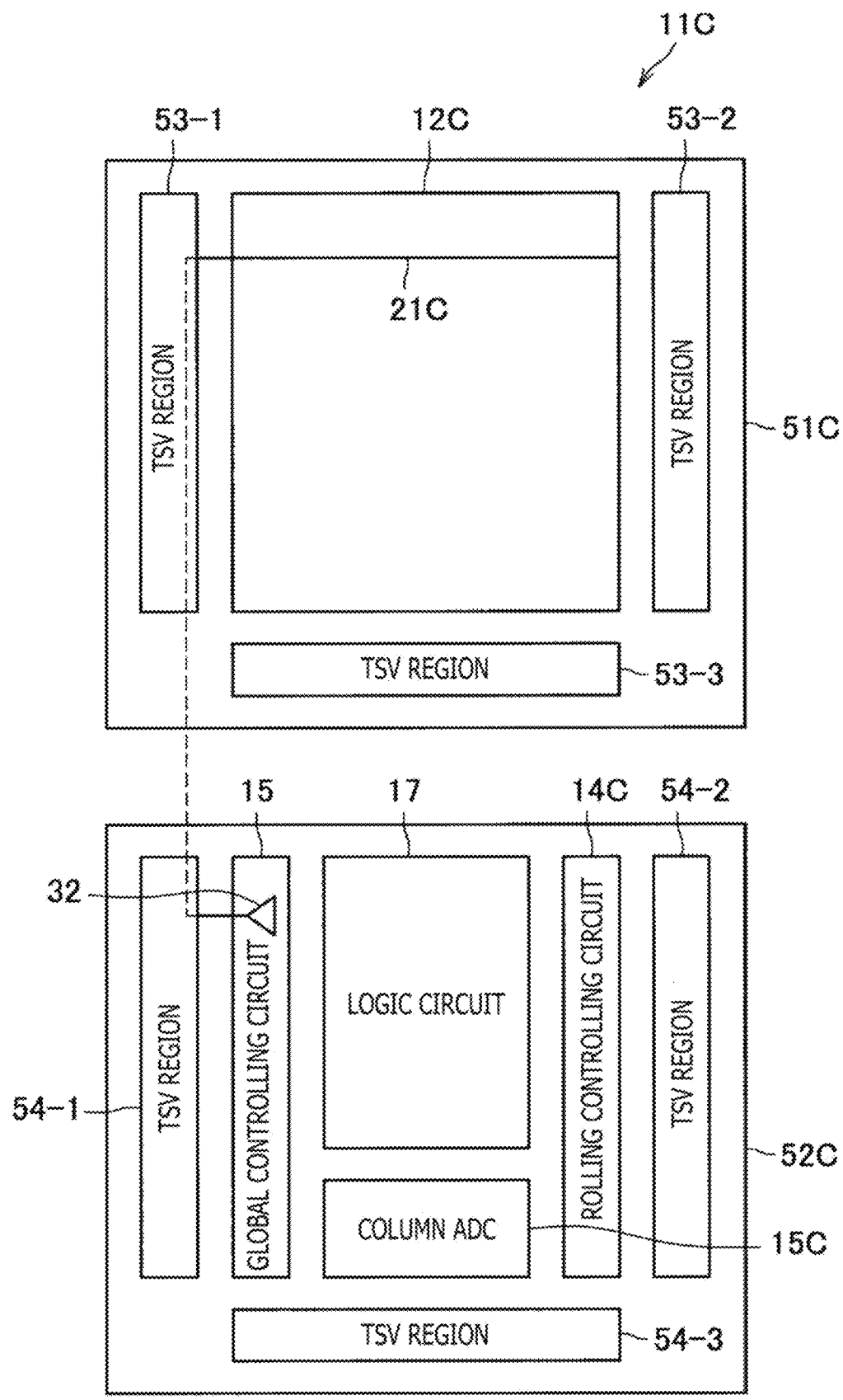
FIG. 11 is a block diagram depicting a configuration example of a fourth embodiment of the sensor chip.

Meanwhile, the sensor chip 11-a has a configuration different from that of the sensor chip 11 of FIG. 11 in that two global controlling circuits 13-1 and 13-2 are disposed so as to extend along the upper side and the lower side of the pixel array section 12, respectively, and the driving elements 32-1 and 32-2 are connected to the opposite ends of the control line 21. In particular, the sensor chip 11-a is configured such that the driving element 32-1 included in the global controlling circuit 13-1 supplies a global controlling signal from the upper end of the control line 21 and the driving element 32-2 included in the global controlling circuit 13-2 supplies a global controlling signal from the lower end of the control line 21.

The sensor chip 11-a configured in this manner can suppress a skew between the two driving element 32-1 and driving element 32-2 and can eliminate a dispersion in delay time that occurs in global controlling signals propagated along the control line 21. Consequently, in the sensor chip 11-a, control for the sensor elements can be performed at a higher speed. It is to be noted that, in the sensor chip 11-a, it is necessary to perform the control such that the delay difference in outputting of global controlling signals is avoided from becoming great such that through current may not be generated.

Figure 5:
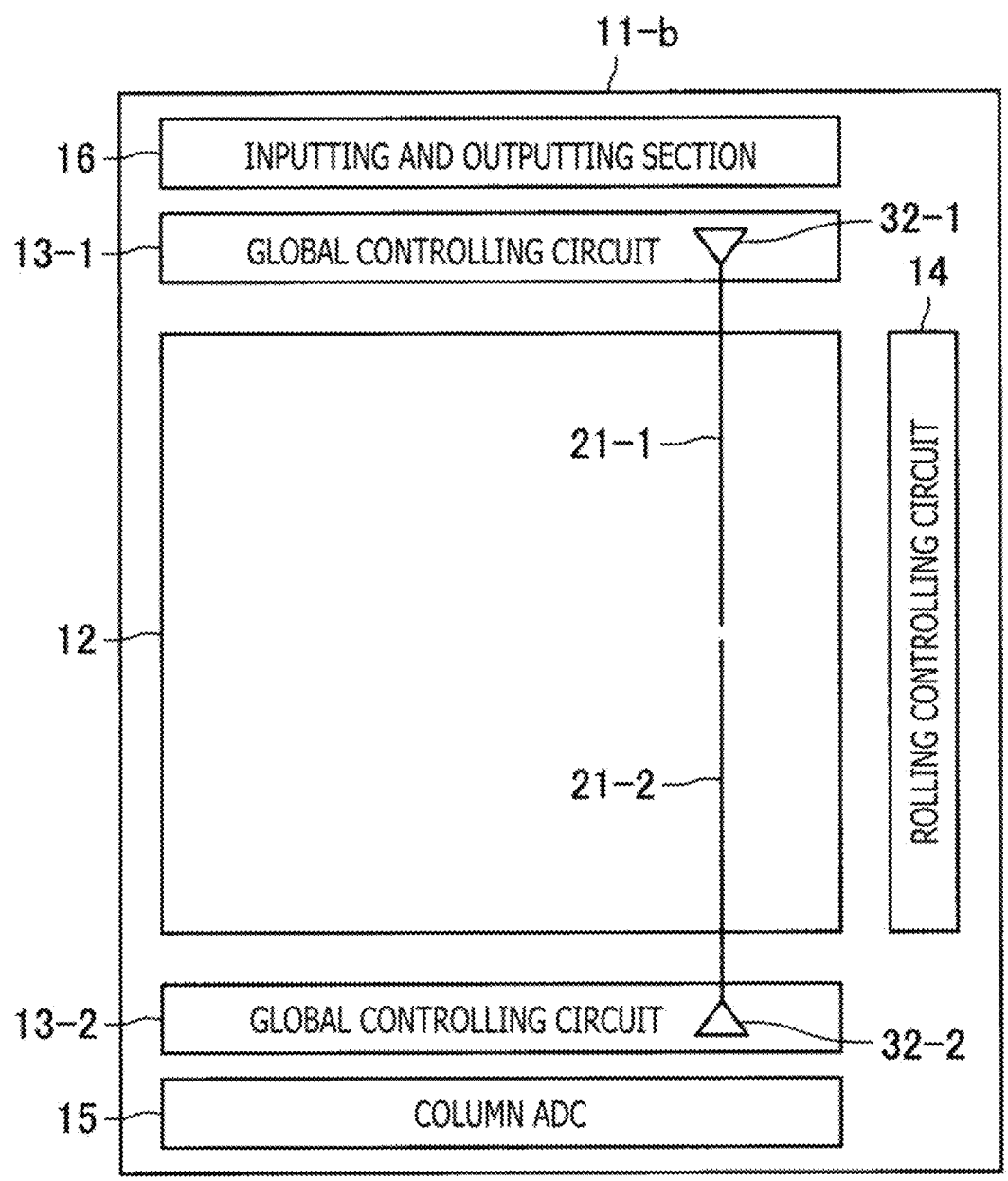
FIG. 5 is a block diagram depicting a second modification of the sensor chip of FIG. 1.

FIG. 5 is a block diagram depicting a second modification of the sensor chip 11 depicted in FIG. 1. It is to be noted that, from among blocks configuring the sensor chip 11-b depicted in FIG. 5, components common to those of the sensor chip 11 of FIG. 1 are denoted by like reference characters, and detailed description of them is omitted.

In particular, as depicted in FIG. 5, the sensor chip 11-b is configured commonly to the sensor chip 11 of FIG. 1 in terms of the disposition of the sensor chip 11-b, pixel array section 12, rolling controlling circuit 14, column ADC 15 and inputting and outputting section 16.

On the other hand, the sensor chip 11-b has a different configuration from that of the sensor chip 11 of FIG. 1 in that the two global controlling circuits 13-1 and 13-2 are disposed so as to extend along the upper side and the lower side of the pixel array section 12, respectively, and the two control lines 21-1 and 21-2 are disposed such that they are separate at the center of a column of the sensor elements disposed in a matrix in the pixel array section 12. Further, in the sensor chip 11-b, the driving element 32-1 is connected to an upper end of the control line 21-1, and the driving element 32-2 is connected to a lower end of the control line 21-2.

Accordingly, the sensor chip 11-b is configured such that, to the sensor elements disposed on the upper side with respect to the center of the pixel array section 12, the driving element 32-1 included in the global controlling circuit 13-1 supplies a global controlling signal from the upper end of the control line 21-1. Further, the sensor chip 11-b is configured such that, to the sensor elements disposed on the lower side with respect to the center of the pixel array section 12, the driving element 32-2 included in the global controlling circuit 13-2 supplies a global controlling signal from the lower end of the control line 21-2.

According to the sensor chip 11-b configured in this manner, the distance from the driving element 32-1 to a sensor element disposed at the remote end (in the example of FIG. 5, the lower end) of the control line 21-1 and the distance from the driving element 32-2 to a sensor element disposed at the remote end (in the example of FIG. 5, the upper end) of the control line 21-2 can made shorter, for example, than that in the sensor chip 11 of FIG. 1. Consequently, the sensor chip 11-b can perform control for the sensor elements at a further higher speed because the delay amount and the slew rate occurring with global controlling signals outputted from the global controlling circuits 13-1 and 13-2 can be further reduced.

<Second Configuration Example of Sensor Chip>

A second embodiment of a sensor chip to which the present technology is applied is described with reference to FIG. 6. It is to be noted that, from among blocks configuring the sensor chip 11A depicted in FIG. 6, components common to those of the sensor chip 11 of FIG. 1 are denoted by like reference characters, and detailed description of them is omitted.

Figure 6:
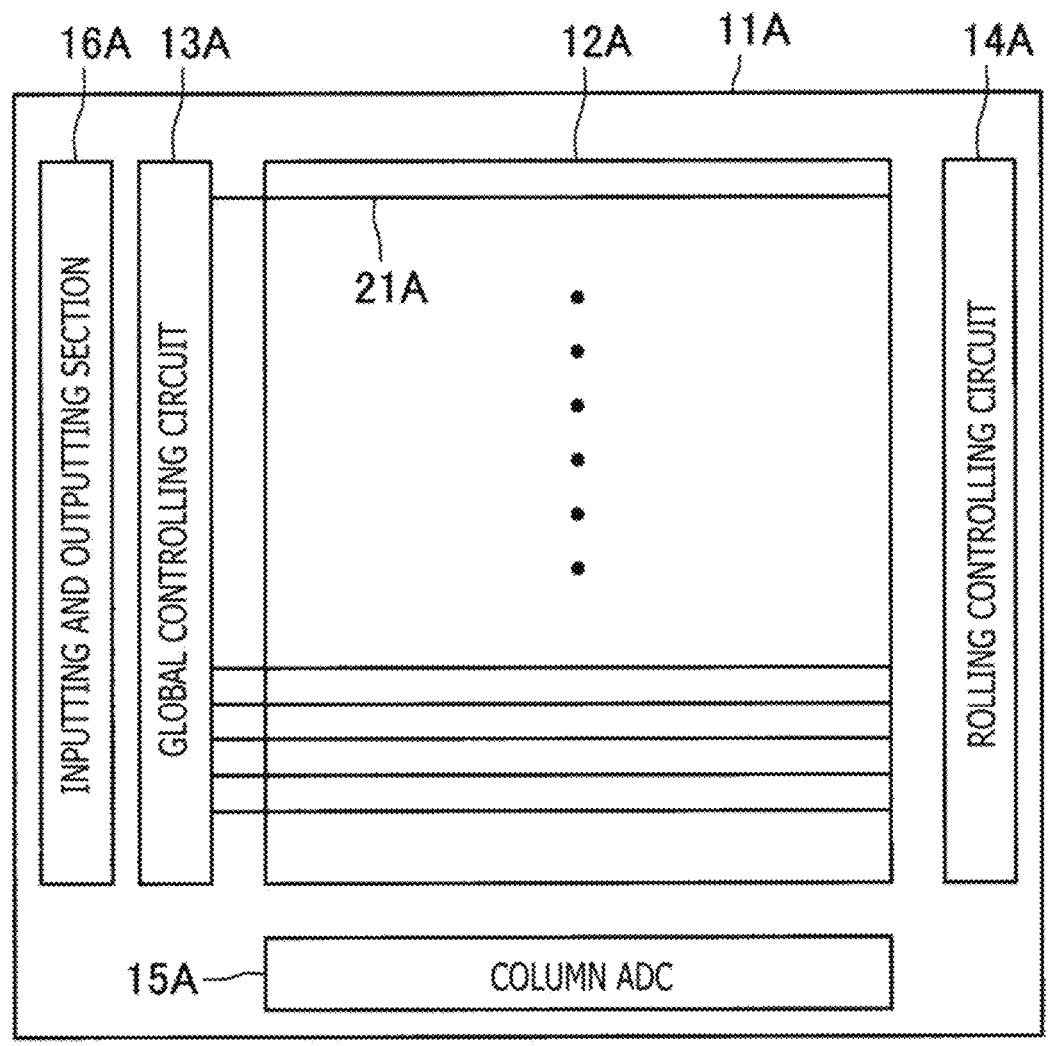
FIG. 6 is a block diagram depicting a configuration example of a second embodiment of the sensor chip.

As depicted in FIG. 6, the sensor chip 11A is configured such that a pixel array section 12A, a global controlling circuit 13A, a rolling controlling circuit 14A, a column ADC 15A and an inputting and outputting section 16A are disposed on a semiconductor substrate.

The sensor chip 11A is different in configuration from the sensor chip 11 of FIG. 1 in that the pixel array section 12A is a vertically elongated rectangular area in which the longer sides are provided to extend in the vertical direction and the shorter sides are provided to extend in the horizontal direction. Accordingly, in the sensor chip 11A, the global controlling circuit 13A and the inputting and outputting section 16A are disposed on the left side of the pixel array section 12A so as to extend along a long side of the pixel array section 12A. With this, a control line 21A is disposed, for each row of the sensor elements disposed in a matrix in the pixel array section 12A, toward the leftward and rightward direction of the pixel array section 12A.

Further, in the sensor chip 11A, the rolling controlling circuit 14A is disposed on the right side of the pixel array section 12A (on the side opposing to the global controlling circuit 13A) so as to extend along a long side of the pixel array section 12A. It is to be noted that, although the global controlling circuit 13A and the pixel array section 12A may be disposed on the same side with respect to the pixel array section 12A, in this case, since it is supposed that the wiring line length of any one of them becomes longer, it is preferable to adopt such arrangement as depicted in FIG. 6.

Further, in the sensor chip 11A, the column ADC 15A is disposed on the lower side of the pixel array section 12A so as to extend along a short side of the pixel array section 12A.

The reason why the column ADC 15A is disposed in a direction orthogonal to the rolling controlling circuit 14A in this manner is that it is necessary to turn on the sensor elements connected to one AD converter one by one, and such a layout that individual wiring lines overlap with each other is avoided.

According to the sensor chip 11A configured in this manner, the wiring line length of the control line 21A can be reduced by the layout in which the global controlling circuit 13A is disposed so as to extend along a long side of the pixel array section 12A similarly to the sensor chip 11 of FIG. 1. Accordingly, the sensor chip 11A can perform control for the sensor elements at a higher speed similarly to the sensor chip 11 of FIG. 1.

<Third Configuration Example of Sensor Chip>

A third embodiment of a sensor chip to which the present technology is applied is described with reference to FIGS. 7 to 10. It is to be noted that, from among blocks configuring the sensor chip 11B depicted in FIGS. 7 to 10, components common to those of the sensor chip 11 of FIG. 1 are denoted by like reference characters, and detailed description of them is omitted.

Figure 7:
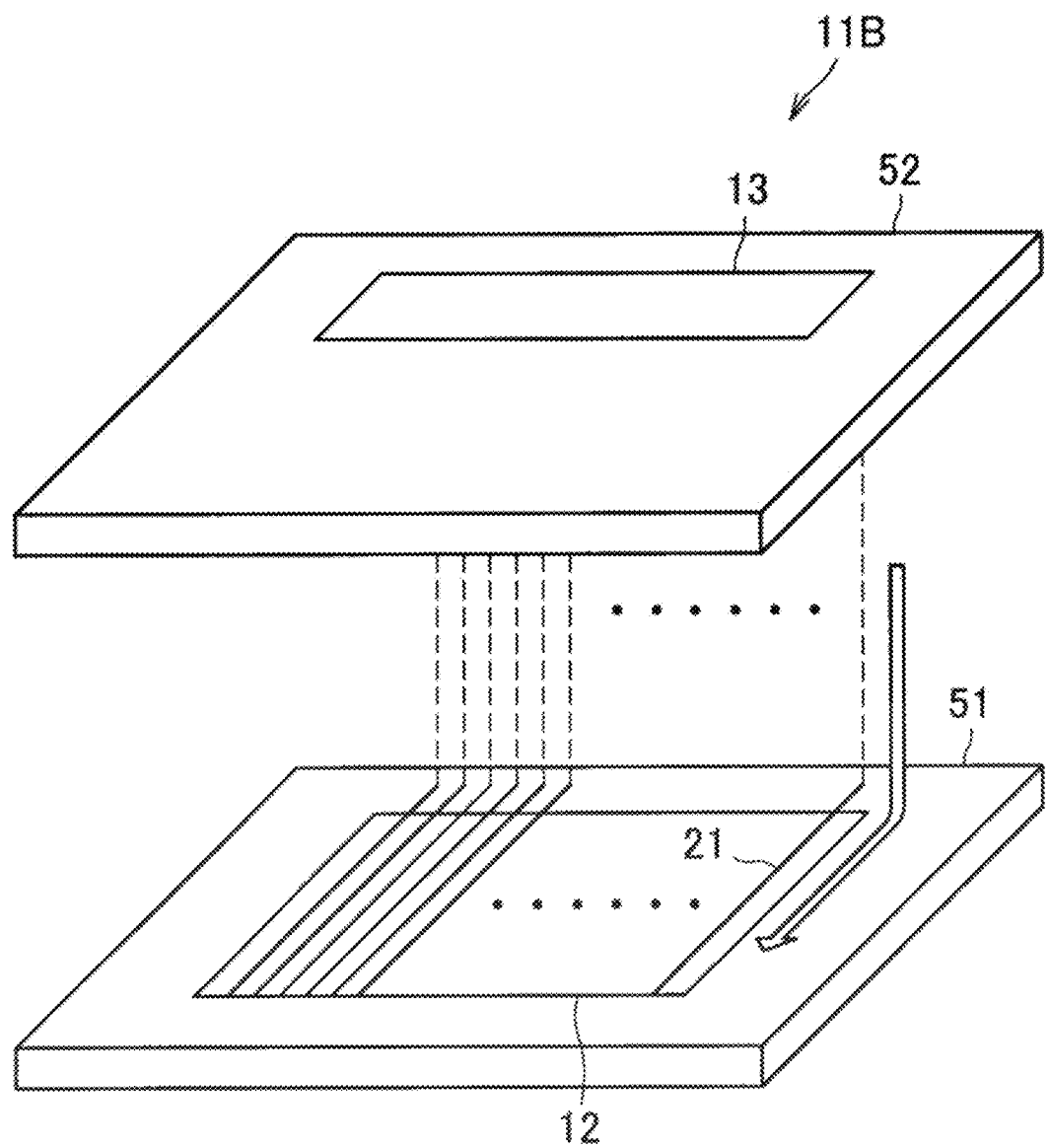
FIG. 7 is a perspective view depicting a configuration example of a third embodiment of the sensor chip.
Figure 8:
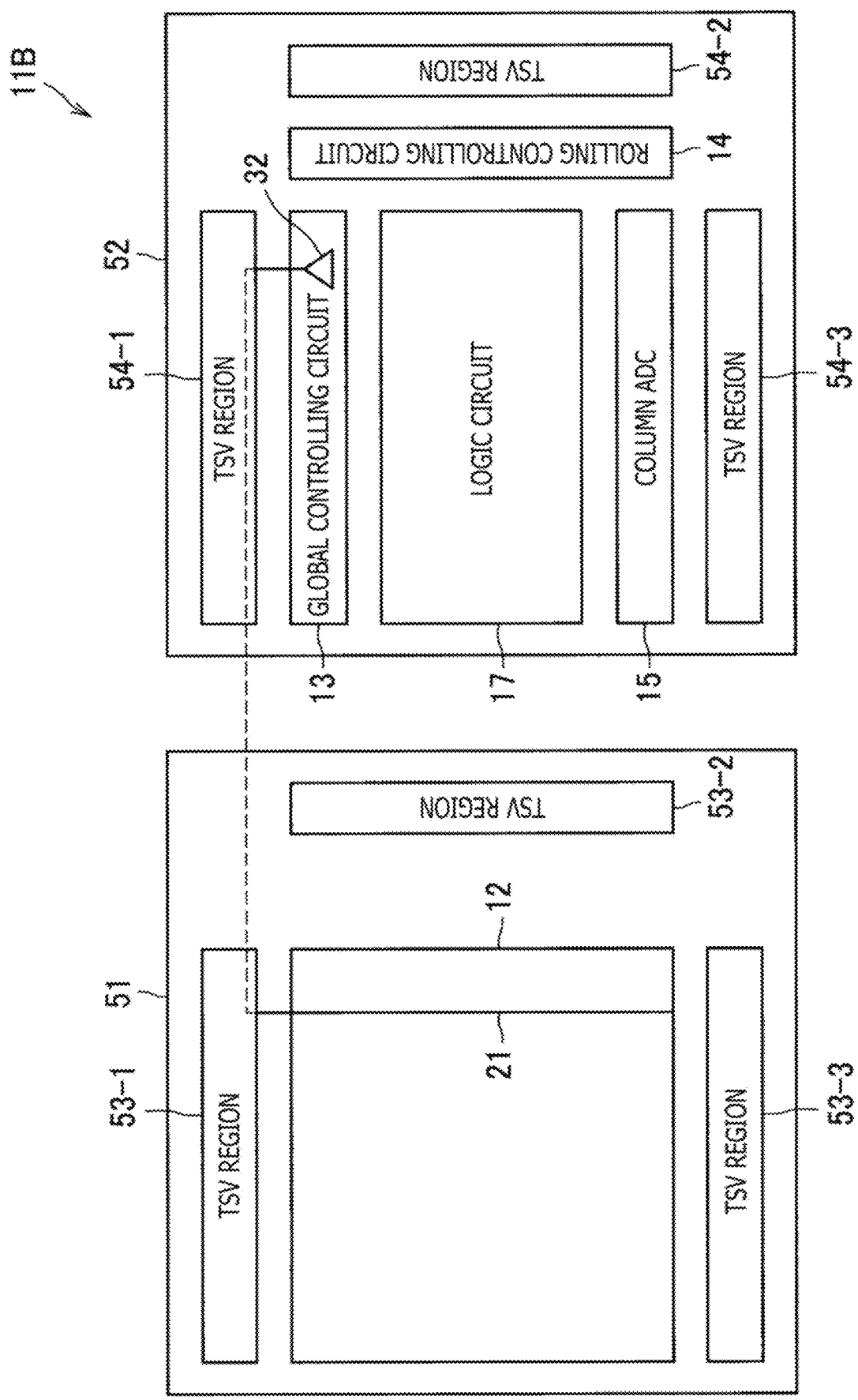
FIG. 8 is a block diagram depicting the configuration example of the third embodiment of the sensor chip.

FIG. 7 depicts a perspective view of the sensor chip 11B, and FIG. 8 depicts a block diagram of the sensor chip 11B.

As depicted in FIG. 7, the sensor chip 11B has a stacked structure in which a sensor substrate 51 on which a pixel array section 12 is formed and a logic substrate 52 on which a global controlling circuit 13 is formed are stacked. Further, the sensor chip 11B has such a connection structure that, in a peripheral region of the sensor chip 11B in which it does not overlap with the pixel array section 12 as viewed in plan, control lines 21 of the sensor substrate 51 and the global controlling circuit 13 of the logic substrate 52 are connected to each other. In particular, in the example depicted in FIG. 7, in the sensor chip 11B, a plurality of control lines 21 disposed along a column direction of the sensor elements disposed in a matrix in the pixel array section 12 are connected to the global controlling circuit 13 side on the upper side of the sensor substrate 51.

Accordingly, in the sensor chip 11B, a global controlling signal outputted from the global controlling circuit 13 is supplied to the sensor elements of the pixel array section 12 from the upper side of the sensor substrate 51 as indicated by a void arrow mark in FIG. 7. At this time, the global controlling circuit 13 is configured such that it is disposed such that the longitudinal direction thereof extends along a long side of the pixel array section 12 and the sensor chip 11B has the shortest distance from the global controlling circuit 13B to the sensor elements of the pixel array section 12.

A configuration of the sensor chip 11B is described further with reference to FIG. 8.

The sensor substrate 51 has a pixel array section 12 and TSV (Through Silicon Via) regions 53-1 to 53-3 disposed thereon. The logic substrate 52 has a global controlling circuit 13, a rolling controlling circuit 14, a column ADC 15, a logic circuit 17 and TSV regions 54-1 to 54-3 disposed thereon. For example, in the sensor chip 11B, a sensor signal outputted from each sensor element of the pixel array section 12 is AD converted by the column ADC 15 and is subjected to various signal processes by the logic circuit 17, whereafter it is outputted to the outside.

The TSV regions 53-1 to 53-3 and the TSV regions 54-1 to 54-3 are regions in which through-electrodes for electrically connecting the sensor substrate 51 and the logic substrate 52 to each other are formed, and a through electrode is disposed for each control line 21. Accordingly, the TSV regions 53-1 to 53-3 and the TSV regions 54-1 to 54-3 are disposed such that they overlap with each other when the sensor substrate 51 and the logic substrate 52 are stacked. It is to be noted that not only through electrodes can be used for connection in the TSV regions 54, but also, for example, micro bump or copper (Cu—Cu) connection can be utilized.

According to the sensor chip 11B configured in this manner, the wiring line length of the control line 21 can be made short by the layout in which the global controlling circuit 13 is disposed so as to extend along a long side of the pixel array section 12 similarly to the sensor chip 11 of FIG. 1. Accordingly, the sensor chip 11B can perform control for the sensor elements at a higher speed similarly to the sensor chip 11 of FIG. 1.

Figure 9:
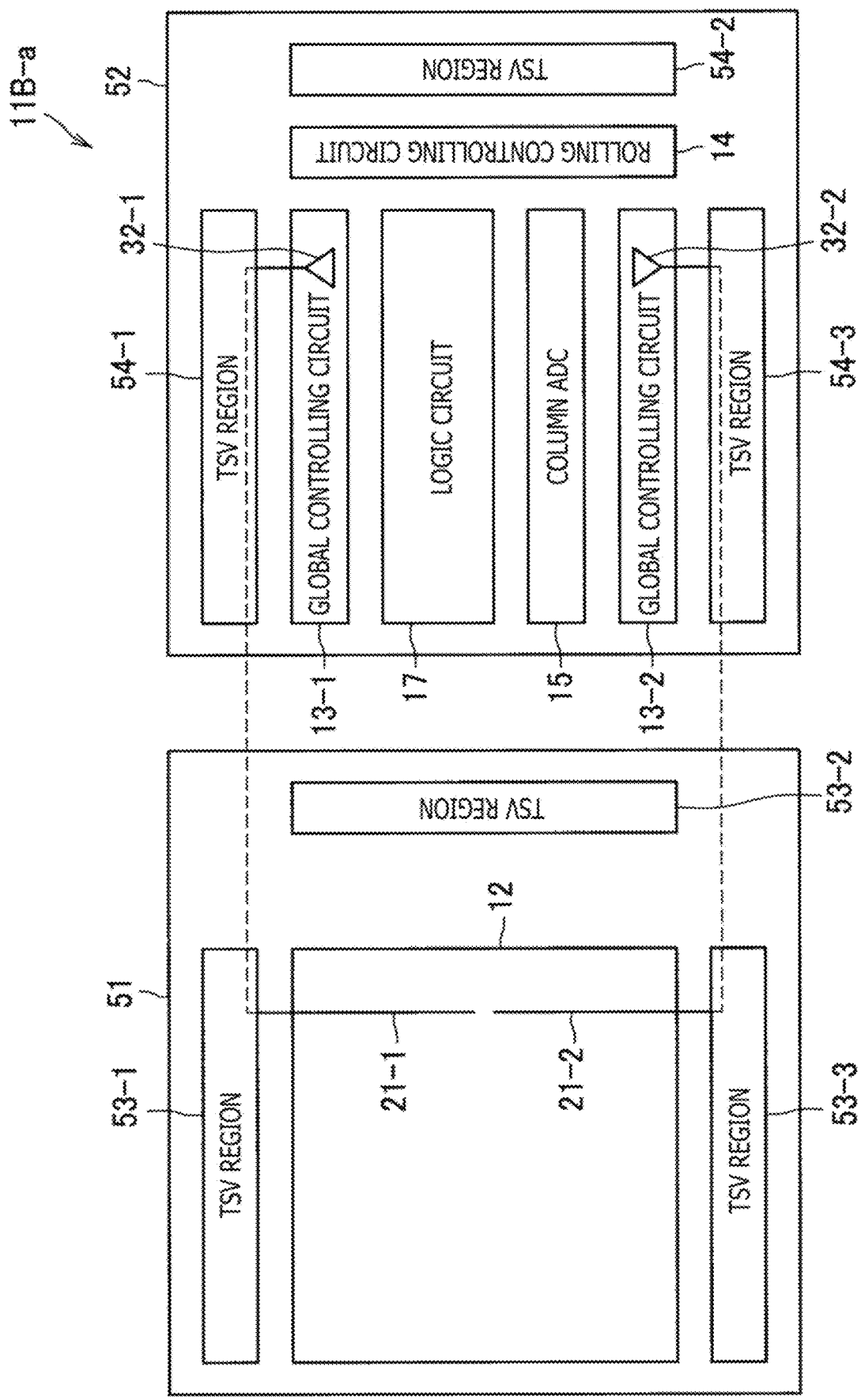
FIG. 9 is a block diagram depicting a first modification of the sensor chip of FIG. 8.

FIG. 9 is a block diagram depicting a first modification of the sensor chip 11B depicted in FIG. 8. It is to be noted that, from among blocks configuring the sensor chip 11B-a depicted in FIG. 9, components common to those of the sensor chip 11B of FIG. 8 are denoted by like reference characters, and detailed description of them is omitted.

As depicted in FIG. 9, in particular, the sensor chip 11B-a is configured commonly to the sensor chip 11B of FIG. 8 in that it has such a stacked structure that the sensor substrate 51 on which the pixel array section 12 is formed and the logic substrate 52 on which the global controlling circuit 13 is formed are stacked.

On the other hand, the sensor chip 11B-a is different in configuration from the sensor chip 11B of FIG. 8 in that the two global controlling circuits 13-1 and 13-2 are disposed on the logic substrate 52 so as to extend along the upper side and the lower side of the pixel array section 12, respectively, and two control lines 21-1 and 21-2 are disposed such that they are separate from each other at the center of the columns of the sensor elements disposed in a matrix on the pixel array section 12.

In particular, in the sensor chip 11B-a, the driving element 32-1 is connected to an upper end of the control line 21-1 and the driving element 32-2 is connected to the lower end of the control line 21-2 similarly as in the sensor chip 11-*b* depicted in FIG. 5. Accordingly, the sensor chip 11B-a is configured such that, to the sensor elements disposed on the upper side with respect to the center of the pixel array section 12, the driving element 32-1 included in the global controlling circuit 13-1 supplies a global controlling signal from the upper end of the control line 21-1. Further, the sensor chip 11B-a is configured such that, to the sensor elements disposed on the lower side with respect to the center of the pixel array section 12, the driving element 32-2 included in the global controlling circuit 13-2 supplies a global controlling signal from the lower end of the control line 21-2.

In the sensor chip 11B-a configured in such a manner as described above, the distance from the driving element 32-1 to a sensor element disposed at the remote end (in the example of FIG. 9, at the lower end) of the control line 21-1 and the distance from the driving element 32-2 to a sensor element disposed at the remote end (in the example of FIG. 9, at the upper end) of the control line 21-2 can be made shorter, for example, than that in the sensor chip 11B of FIG. 8. Consequently, the sensor chip 11B-a can perform control for the sensor elements at a higher speed because the delay amount and the slew rate occurring with global signals outputted from the global controlling circuits 13-1 and 13-2 can be further reduced.

Figure 10:
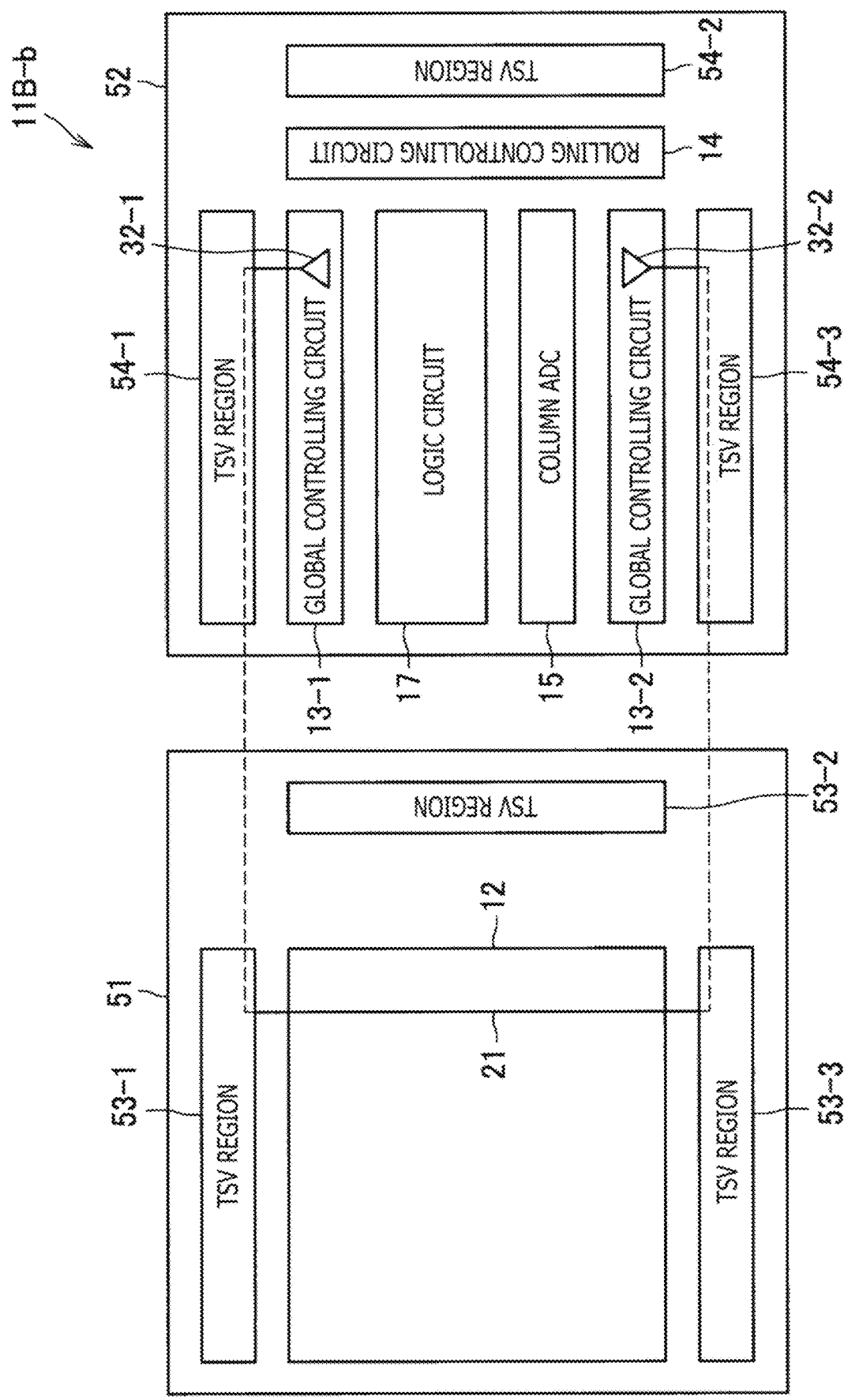
FIG. 10 is a block diagram depicting a second modification of the sensor chip of FIG. 8.

FIG. 10 is a block diagram depicting a second modification of the sensor chip 11B depicted in FIG. 8. It is to be noted that, from among blocks configuring the sensor chip 11B-b depicted in FIG. 10, components common to those of the sensor chip 11B of FIG. 8 are denoted by like reference characters, and detailed description of them is omitted.

In particular, as depicted in FIG. 10, the sensor chip 11B-b is common in configuration to the sensor chip 11B of FIG. 8 in that it has a stacked structure in which a sensor substrate 51 on which a pixel array section 12 is formed and a logic substrate 52 on which a global controlling circuit 13 is formed are stacked.

On the other hand, the sensor chip 11B-b is different in configuration from the sensor chip 11B of FIG. 8 in that two global controlling circuits 13-1 and 13-2 are disposed on the logic substrate 52 so as to extend along the upper side and the lower side of the pixel array section 12, respectively, and driving elements 32-1 and 32-2 are connected to the opposite ends of a control line 21.

In particular, in the sensor chip 11B-b, the driving element 32-1 included in the global controlling circuit 13-1 supplies a global controlling signal from the upper end of the control line 21 and the driving element 32-2 included in the global controlling circuit 13-2 supplies a global controlling signal from the lower end of the control line 21 similarly to the sensor chip 11-a depicted in FIG. 4.

The sensor chip 11B-b configured in this manner can suppress a skew between the two driving element 32-1 and driving element 32-2 and can eliminate a dispersion in delay time that occurs in a global controlling signal propagated along the control line 21. Consequently, in the sensor chip 11B-b, control for the sensor elements can be performed at a higher speed. It is to be noted that, in the sensor chip 11B-b, it is necessary to perform the control such that the delay difference in outputting of global controlling signals is avoided from becoming great such that through current may not be generated.

In the sensor chip 11B configured in such a manner as described above, control for the sensor elements in the stacked structure in which the sensor substrate 51 and the logic substrate 52 are stacked can be performed at a higher speed similarly as in the sensor chip 11 of FIG. 1.

It is to be noted that, in the configuration examples depicted in FIGS. 8 to 10, the column ADC 15 is configured such that sensor signal is read out from the lower end side of the pixel array section 12 through the TSV region 53-3 and the TSV region 54-3 disposed on the lower side. In addition to such a configuration as just described, for example, two column ADCs 15 are disposed in the proximity of the upper and lower sides and configured such that a sensor signal is read out from the upper end side and the lower end side of the pixel array section 12 by the two column ADCs 15.

<Fourth Configuration Example of Sensor Chip>

A fourth embodiment of a sensor chip to which the present technology is applied is described with reference to FIG. 11. It is to be noted that, from among blocks configuring the sensor chip 11C depicted in FIG. 11, components common to those of the sensor chip 11B of FIG. 8 are denoted by like reference characters, and detailed description of them is omitted.

In particular, as depicted in FIG. 11, the sensor chip 11C is common in configuration to the sensor chip 11B of FIG. 8 in that it has a stacked structure in which a sensor substrate 51 on which a pixel array section 12 is formed and a logic substrate 52 on which a global controlling circuit 13 is formed are stacked.

On the other hand, the sensor chip 11C is different in configuration from the sensor chip 11B of FIG. 8 in that a pixel array section 12C has a vertically elongated rectangular region similarly to the pixel array section 12A of the sensor chip 11A depicted in FIG. 6. Accordingly, in the sensor chip 11C, the global controlling circuit 13C is disposed on the left side of the logic substrate 52 so as to extend along a long side of the pixel array section 12C. With this, a control line 21C is disposed toward the leftward and rightward direction of the pixel array section 12C for each row of the sensor elements disposed in a matrix in the pixel array section 12C.

Further, in the sensor chip 11C, a rolling controlling circuit 14C is disposed on the right side of the logic substrate 52 (side opposing to the global controlling circuit 13C) so as to extend along a long side of the pixel array section 12C. It is to be noted that, although the global controlling circuit 13C and the pixel array section 12C may be disposed on the same side with respect to the logic substrate 52, in this case, since it is supposed that the wiring line length of any one of them becomes longer, it is preferable to adopt such arrangement as depicted in FIG. 11.

Furthermore, in the sensor chip 11C, the column ADC 15C is disposed on the lower side of the logic substrate 52 so as to extend along a short side of the pixel array section 12C. The reason why the column ADC 15C is disposed in a direction orthogonal to the rolling controlling circuit 14C in this manner is that it is necessary to turn on the sensor elements connected to one AD converter one by one, and such a layout that individual wiring lines overlap with each other is avoided.

According to the sensor chip 11C configured in this manner, the wiring line length of the control line 21C can be reduced by the layout in which the global controlling circuit 13C is disposed so as to extend along a long side of the pixel array section 12C similarly to the sensor chip 11B of FIG. 8. Accordingly, the sensor chip 11C can perform control for the sensor elements at a higher speed similarly to the sensor chip 11B of FIG. 8.

<Fifth Configuration Example of Sensor Chip>

A fifth embodiment of a sensor chip to which the present technology is applied is described with reference to FIG. 12. It is to be noted that, from among blocks configuring the sensor chip 11D depicted in FIG. 12, components common to those of the sensor chip 11B of FIG. 8 are denoted by like reference characters, and detailed description of them is omitted.

Figure 12:
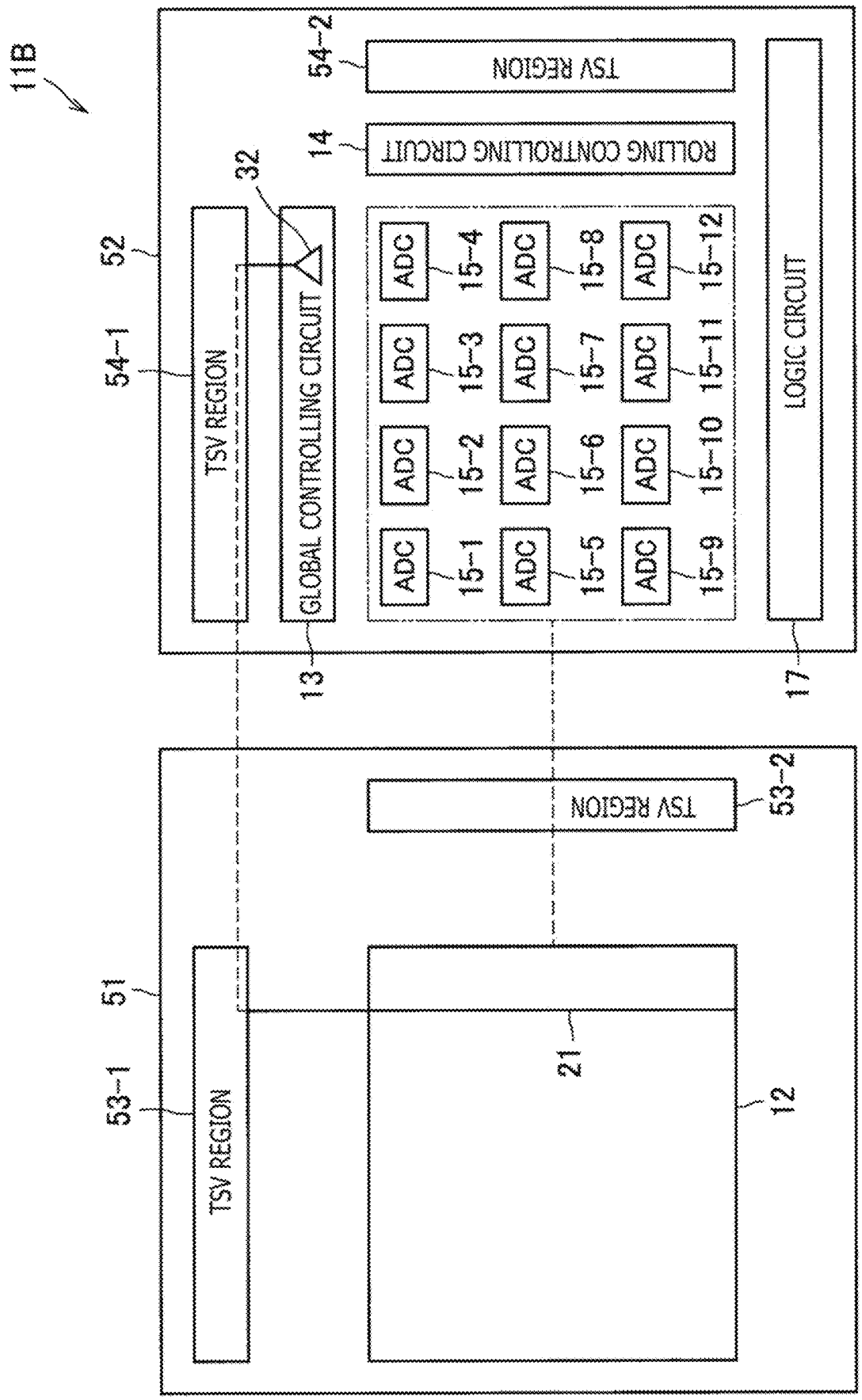
FIG. 12 is a block diagram depicting a configuration example of a fifth embodiment of the sensor chip.

In particular, as depicted in FIG. 12, the sensor chip 11D is common in configuration to the sensor chip 11B of FIG. 8 in that it has a stacked structure in which a sensor substrate 51 on which a pixel array section 12 is formed and a logic substrate 52 on which a global controlling circuit 13 is formed are stacked.

On the other hand, the sensor chip 11D is different in configuration from the sensor chip 11B of FIG. 8 in that, a plurality of column ADCs 15, in the example of FIG. 12, ADCs 15-1 to 15-12, are disposed corresponding to a region of the sensor substrate 51, in which the pixel array section 12 is formed, are disposed on the logic substrate 52.

For example, the sensor chip 11D is configured such that an ADC 15 is disposed for each predetermined region of the pixel array section 12. In the case where the 12 ADCs 15-1 to 15-12 are used as depicted in FIG. 12, an ADC 15 is disposed for each of 12 divisional regions into which the pixel array section 12 is divided equally, and AD conversion of sensor signals outputted from the sensor elements provided in the individual regions is performed in parallel. It is to be noted that, in addition to the configuration in which an ADC 15 is disposed for each of predetermined regions of the pixel array section 12, for example, a configuration in which one ADC 15 is disposed for each of sensor elements included in the pixel array section 12 may be applied.

According to the sensor chip 11D configured in this manner, the wiring line length of the control line 21 can be made short by the layout in which the global controlling circuit 13 is disposed so as to extend along a long side of the pixel array section 12 similarly to the sensor chip 11B of FIG. 8. Accordingly, the sensor chip 11D can perform control for the sensor elements at a higher speed similarly to the sensor chip 11B of FIG. 8.

Further, in the sensor chip 11D, restriction of the positional relationship between the rolling controlling circuit 14 and the column ADC 15 to such constraints to the column ADC 15 depicted in FIG. 8 is eliminated. For example, although, in the sensor chip 11D depicted in FIG. 12, the rolling controlling circuit 14 is disposed on the right side of the logic substrate 52, the rolling controlling circuit 14 may be disposed on any of the upper side and the lower side. In other words, the rolling controlling circuit 14 may be disposed at any place if there is no restriction in regard to the location of the pixel array section 12 with respect to the sensor chip 11D (for example, the center position of the sensor chip 11D with respect to the optical center).

As an alternative, for example, in the case where there is a strong restriction to the optical center and the center position of the sensor chip 11D, the layout can be balanced well by disposing the rolling controlling circuit 14 at a position on the opposite side to the region in which the column ADC 15 is disposed with respect to the global controlling circuit 13. This makes it possible to improve the characteristic of the sensor chip 11D.

<Sixth Configuration Example of Sensor Chip>

A sixth embodiment of a sensor chip to which the present technology is applied is described with reference to FIGS. 13 to 22. It is to be noted that, from among blocks configuring the sensor chip 11E depicted in FIGS. 13 to 22, components common to those of the sensor chip 11B of FIGS. 7 and 8 are denoted by like reference characters, and detailed description of them is omitted.

Figure 13:
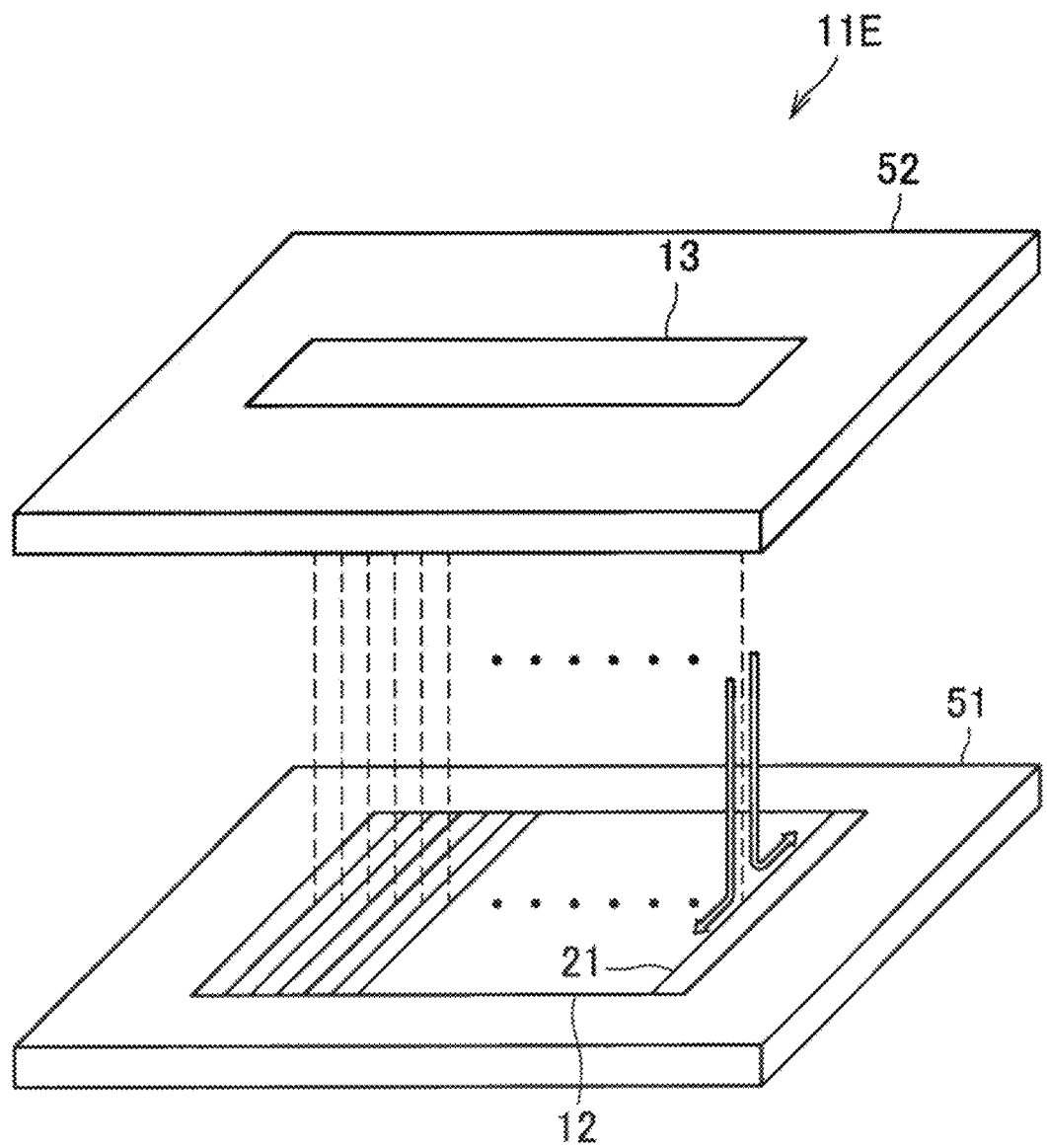
FIG. 13 is a perspective view depicting a configuration example of a sixth embodiment of the sensor chip.

As depicted in FIG. 13, the sensor chip 11E has a stacked structure in which a sensor substrate 51 on which a pixel array section 12 is formed and a logic substrate 52 on which a global controlling circuit 13 is formed are stacked similarly to the sensor chip 11B depicted in FIG. 7. Further, the sensor chip 11E has such a connection structure that the global controlling circuit 13 is disposed such that it overlaps with the center of the pixel array section 12 when the sensor chip 11E is viewed in plan and the global controlling circuit 13 is connected to the control line 21 at the central portion of the pixel array section 12.

For example, in the case where the sensor chip 11E is connectable at the pixel array section 12 by interconnection of copper (Cu) configuring wiring lines, connection utilizing micro bumps or TSVs or like connection, the distance from the driving element 32 to a sensor element disposed at the remote end of the control line 21 can be made short.

A configuration of the sensor chip 11E is further described with reference to FIG. 14.

Figure 14:
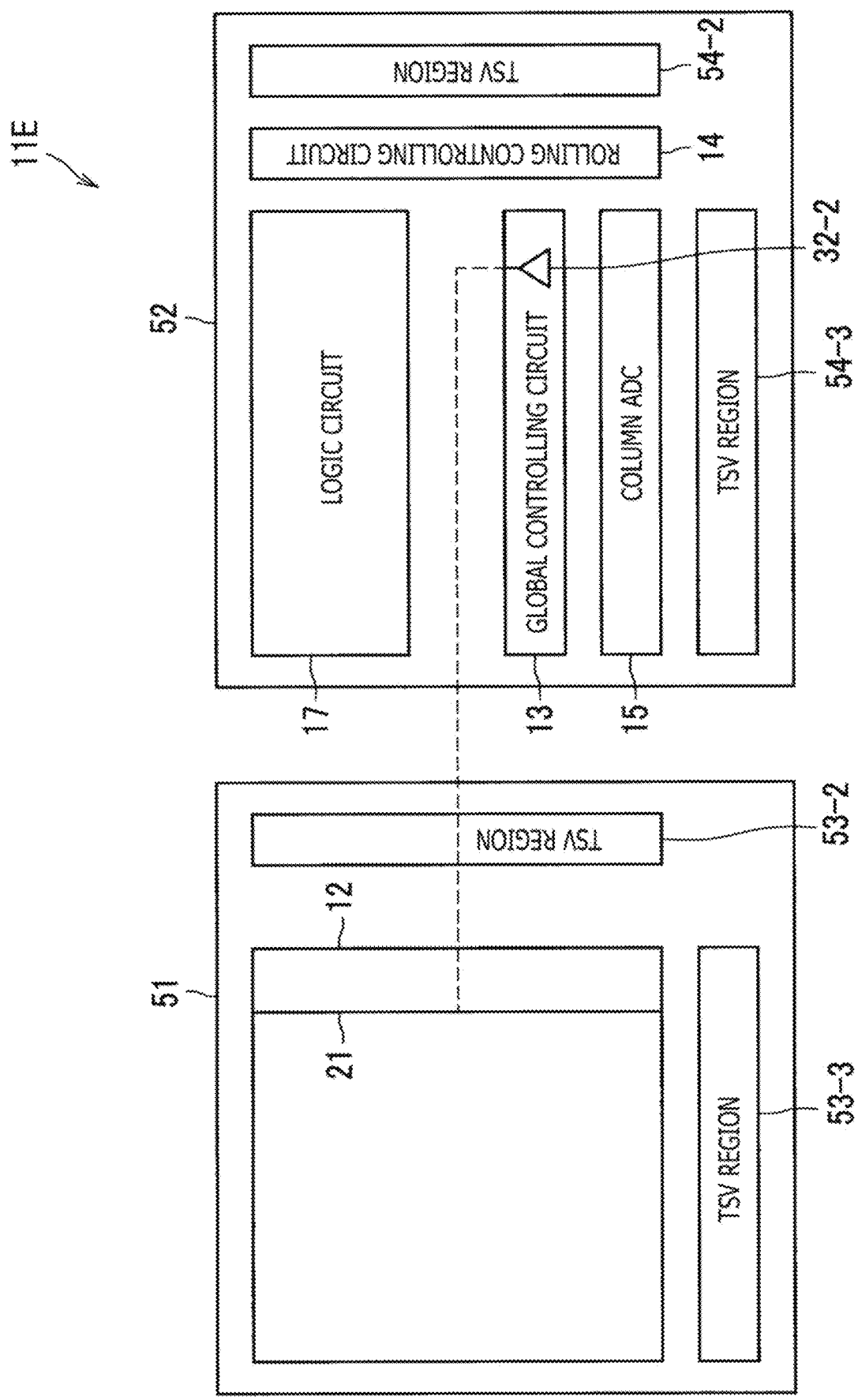
FIG. 14 is a block diagram depicting the configuration example of the sixth embodiment of the sensor chip.

As depicted in FIG. 14, in the sensor substrate 51, the pixel array section 12 is a horizontally elongated rectangular region having long sides extending in the horizontal direction and short sides extending in the vertical direction. Accordingly, on the logic substrate 52, the global controlling circuit 13 is disposed such that the longitudinal direction thereof extends along a long side of the pixel array section 12. Further, the global controlling circuit 13 is disposed substantially at the center of the logic substrate 52 such that a wiring line for outputting from the driving element 32 of the global controlling circuit 13 is connected to the center of a control line 21 disposed toward the upward and downward direction of the pixel array section 12. It is to be noted that such a configuration may be used that a wiring line for outputting from the driving element 32 extends through the substrate from the global controlling circuit 13 directly toward the pixel array section 12.

In the sensor chip 11E configured in this manner, the distances from the driving element 32 to sensor elements at the opposite ends of the control line 21 can be made short. Accordingly, since the delay amount and the slew rate of a global controlling signal can be improved, the sensor chip 11E can perform control for the sensor elements at a higher speed.

Further, such a configuration as indicated by the sensor chip 11E is preferable for application, for example, to a ToF sensor.

Figure 15:
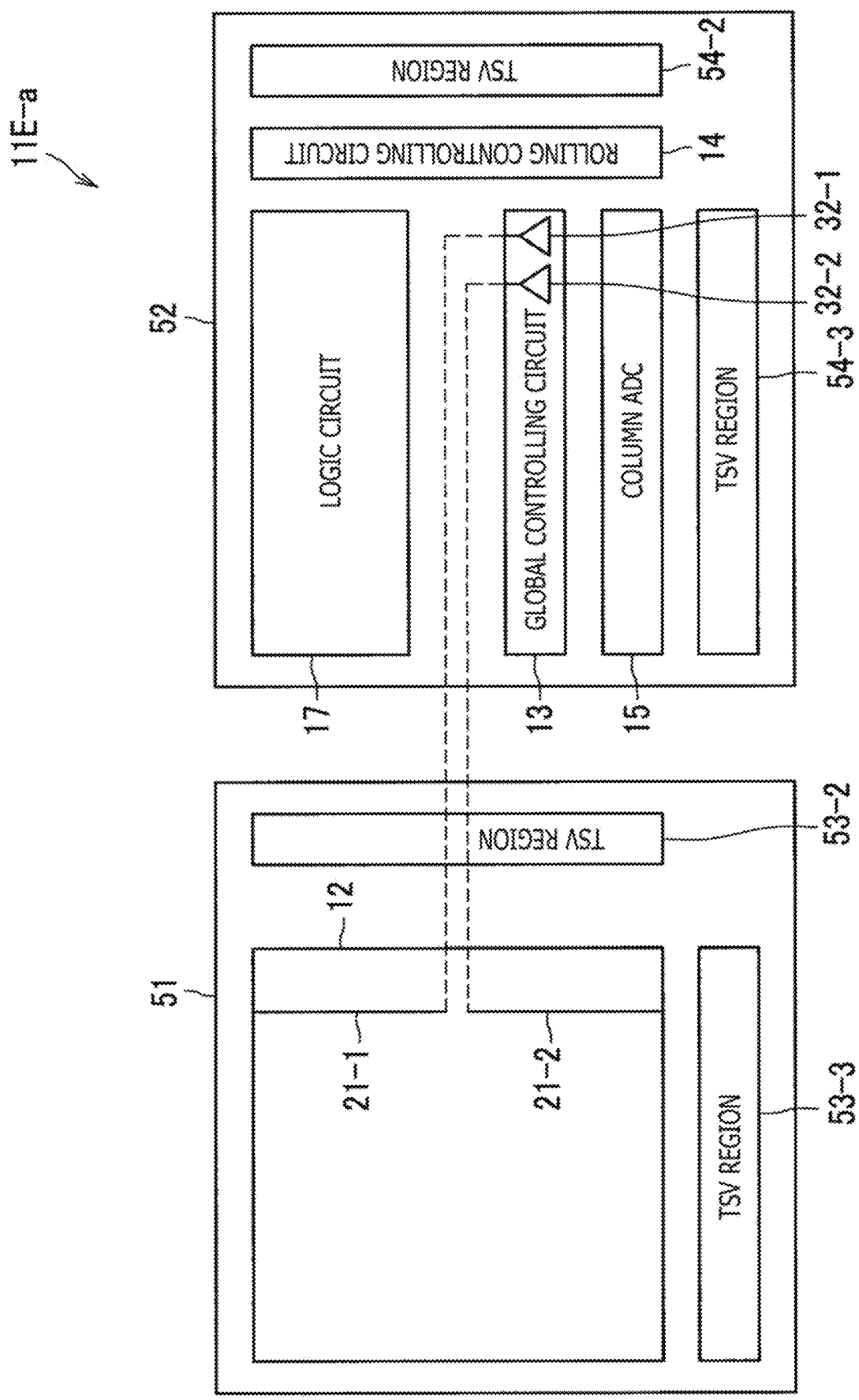
FIG. 15 is a block diagram depicting a first modification of the sensor chip of FIG. 14.

FIG. 15 is a block diagram depicting a first modification of the sensor chip 11E depicted in FIG. 14. It is to be noted that, from among blocks configuring the sensor chip 11E-a depicted in FIG. 15, components common to those of the sensor chip 11E of FIG. 14 are denoted by like reference characters, and detailed description of them is omitted.

In particular, as depicted in FIG. 15, the sensor chip 11E-a is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, on the sensor substrate 51, the sensor chip 11E-a is different in configuration from the sensor chip 11E of FIG. 14 in that two control lines 21-1 and 21-2 divided at the center are disposed for one row of sensor elements disposed in a matrix in the pixel array section 12. Further, the sensor chip 11E-a is different in configuration from the sensor chip 11E of FIG. 14 in that the global controlling circuit 13 on the logic substrate 52 includes two driving elements 32-1 and 32-2 for one row of the sensor elements.

Further, the sensor chip 11E-a has such a connection structure that the driving element 32-1 is connected to a center side end portion of the control line 21-1 and the driving element 32-2 is connected to a center side end portion of the control line 21-2. In particular, the sensor chip 11E-a is configured such that, from among a plurality of sensor elements disposed on one row of the pixel array section 12, the sensor elements disposed on the upper side with respect to the center are driven by the driving element 32-1 through the control line 21-1, and the sensor elements disposed on the lower side with respect to the center are driven by the driving element 32-2 through the control line 21-2.

According to the sensor chip 11E-a configured in this manner, the distance from the driving element 32-1 to a sensor element disposed at the remote end of the control line 21-1 and the distance from the driving element 32-2 to a sensor element disposed at the remote end of the control line 21-2 can be made short similarly to the sensor chip 11E of FIG. 14. Accordingly, the sensor chip 11E-a can improve the delay amount and the slew rate of a global controlling signal similarly to the sensor chip 11E of FIG. 14.

Further, in the sensor chip 11E-a, since the load per one driving element 32 can be reduced, the size of the driving element 32 can be reduced from that of the sensor chip 11E of FIG. 14. Furthermore, where the sensor chip 11E-a is configured such that two driving elements 32 are disposed for one column of sensor elements, the layout of the driving elements 32 is integrated to one place, and the overall layout structure can be simplified.

Figure 16:
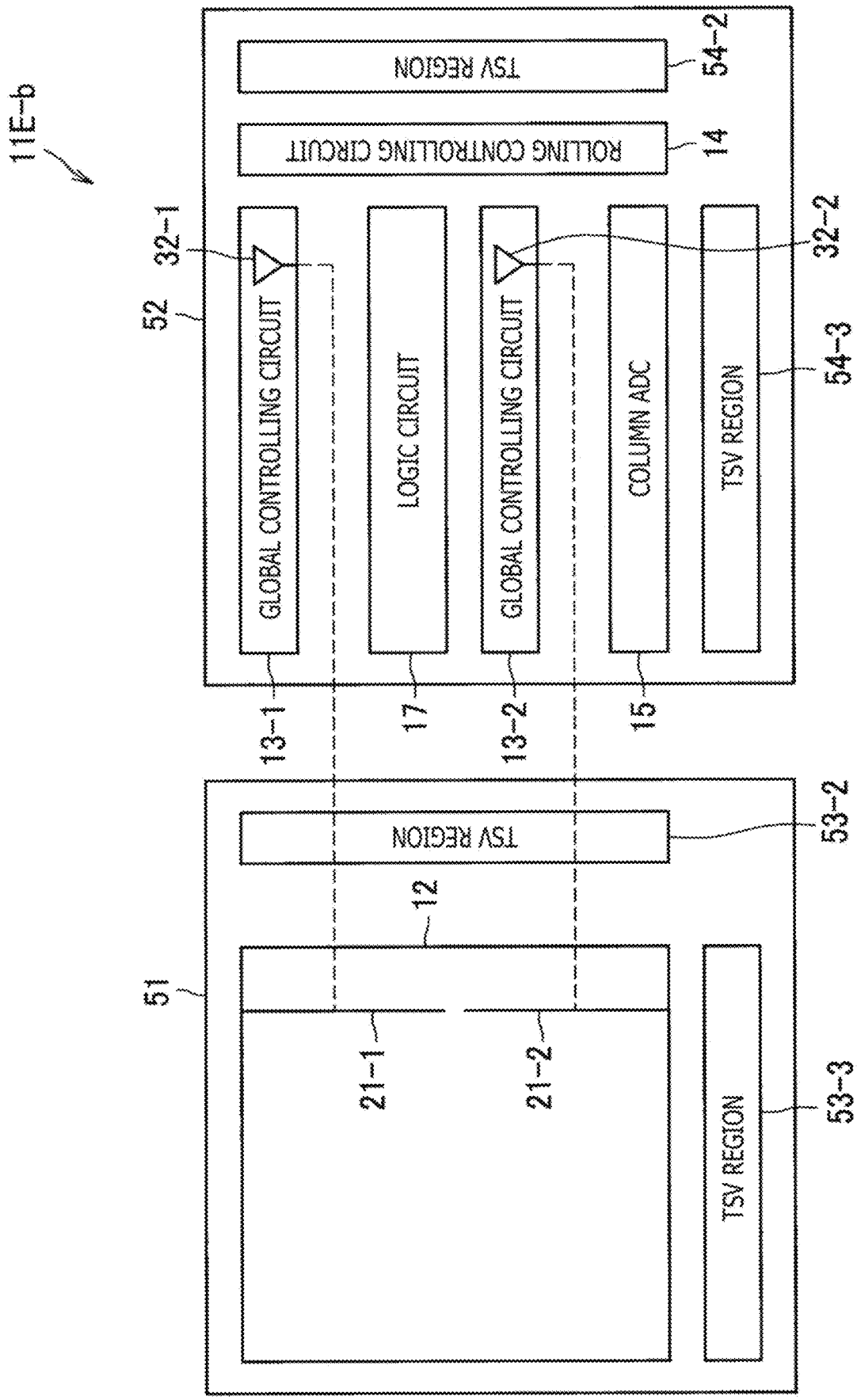
FIG. 16 is a block diagram depicting a second modification of the sensor chip of FIG. 14.

FIG. 16 is a block diagram depicting a second modification of the sensor chip 11E depicted in FIG. 14. It is to be noted that, from among blocks configuring the sensor chip 11E-b depicted in FIG. 16, components common to those of the sensor chip 11E of FIG. 14 are denoted by like reference characters, and detailed description of them is omitted.

In particular, the sensor chip 11E-b depicted in FIG. 16 is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, the sensor chip 11E-b is different in configuration from the sensor chip 11E of FIG. 14 in that, on the sensor substrate 51, two control lines 21-1 and 21-2 separate at the center are disposed for one row of sensor elements disposed in a matrix in the pixel array section 12. Further, the sensor chip 11E-b is different in configuration from the sensor chip 11E of FIG. 14 in that, on the logic substrate 52, two global controlling circuits 13-1 and 13-2 are disposed.

Further, the sensor chip 11E-b has such a connection structure that the driving element 32-1 is connected to the center of the control line 21-1 and the driving element 32-2 is connected to the center of the control line 21-2. In particular, the sensor chip 11E-b is configured such that, from among a plurality of sensor elements disposed in one row of the pixel array section 12, the sensor elements disposed on the upper side with respect to the center are driven by the driving element 32-1 through the control line 21-1 and the sensor elements disposed on the lower side with respect to the center are driven by the driving element 32-2 through the control line 21-2.

In the sensor chip 11E-b configured in this manner, the distance from the driving element 32-1 to a sensor element disposed at the remote end of the control line 21-1 and the distance from the driving element 32-2 to a sensor element disposed at the remote end of the control line 21-2 can be made shorter in comparison with the sensor chip 11E of FIG. 14. Consequently, the sensor chip 11E-b can achieve driving at a higher speed than the sensor chip 11E of FIG. 14 and can achieve further improvement of the delay amount and the slew rate of a global controlling signal.

Further, as depicted in FIG. 16, in the sensor chip 11E-b, since the global controlling circuits 13-1 and 13-2 can be disposed divisionally, the logic circuit 17 can be disposed at a central location between them. It is to be noted that, though not depicted, the column ADC 15 may be disposed at a central location between the global controlling circuits 13-1 and 13-2.

Further, such a configuration as indicated by the sensor chip 11E-b is suitable for application, for example, to a ToF sensor.

Figure 17:
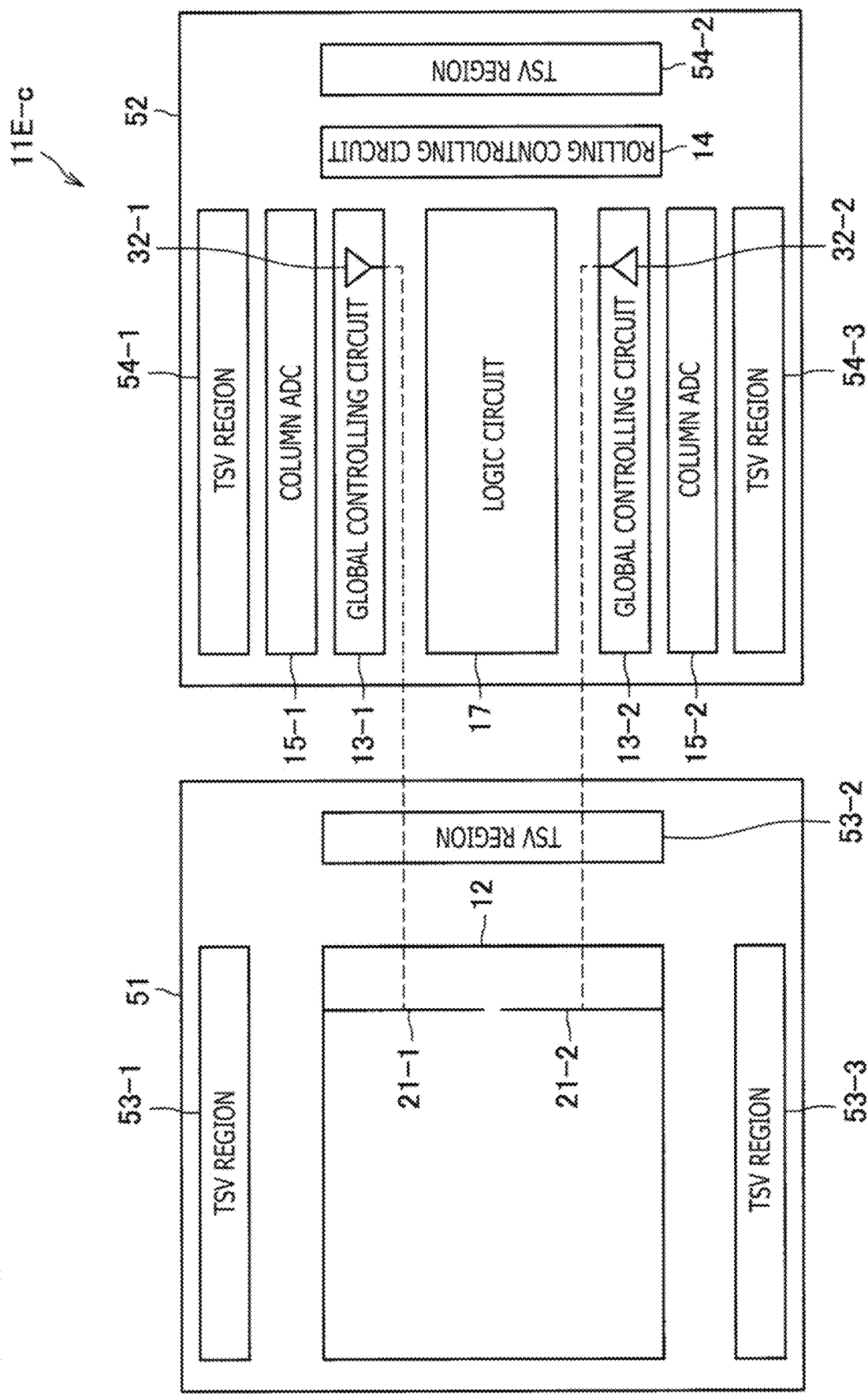
FIG. 17 is a block diagram depicting a third modification of the sensor chip of FIG. 14.

FIG. 17 is a block diagram depicting a third modification of the sensor chip 11E depicted in FIG. 14. It is to be noted that, from among blocks configuring the sensor chip 11E-c depicted in FIG. 17, components common to those of the sensor chip 11E of FIG. 14 are denoted by like reference characters, and detailed description of them is omitted.

In particular, the sensor chip 11E-c depicted in FIG. 17 is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, the sensor chip 11E-c is different in configuration from the sensor chip 11E of FIG. 14 in that, on the sensor substrate 51, two control lines 21-1 and 21-2 divided at the center are disposed for one row of sensor elements disposed in a matrix in the pixel array section 12. Further, the sensor chip 11E-c is different in configuration from the sensor chip 11E of FIG. 14 in that two global controlling circuits 13-1 and 13-2 are disposed on the logic substrate 52.

Further, the sensor chip 11E-c has such a connection structure that the driving element 32-1 is connected to the center of the control line 21-1 and the driving element 32-2 is connected to the center of the control line 21-2 similarly to the sensor chip 11E-b of FIG. 16. Accordingly, the sensor chip 11E-c can achieve driving at a higher speed than the sensor chip 11E of FIG. 14 and can achieve further improvement of the delay amount and the slew rate of a global controlling signal in comparison with the sensor chip 11E of FIG. 14 similarly to the sensor chip 11E-b of FIG. 16.

Further, in the sensor chip 11E-c, the column ADC 15-1 is disposed on the upper side of the logic substrate 52 and the column ADC 15-2 is disposed on the lower side of the logic substrate 52. In the sensor chip 11E-c configured in this manner, since it has a structure in which the layout thereof is symmetrical upwardly and downwardly, it is improved in symmetry, and consequently, the sensor chip 11E-c can be improved in characteristic.

Figure 18:
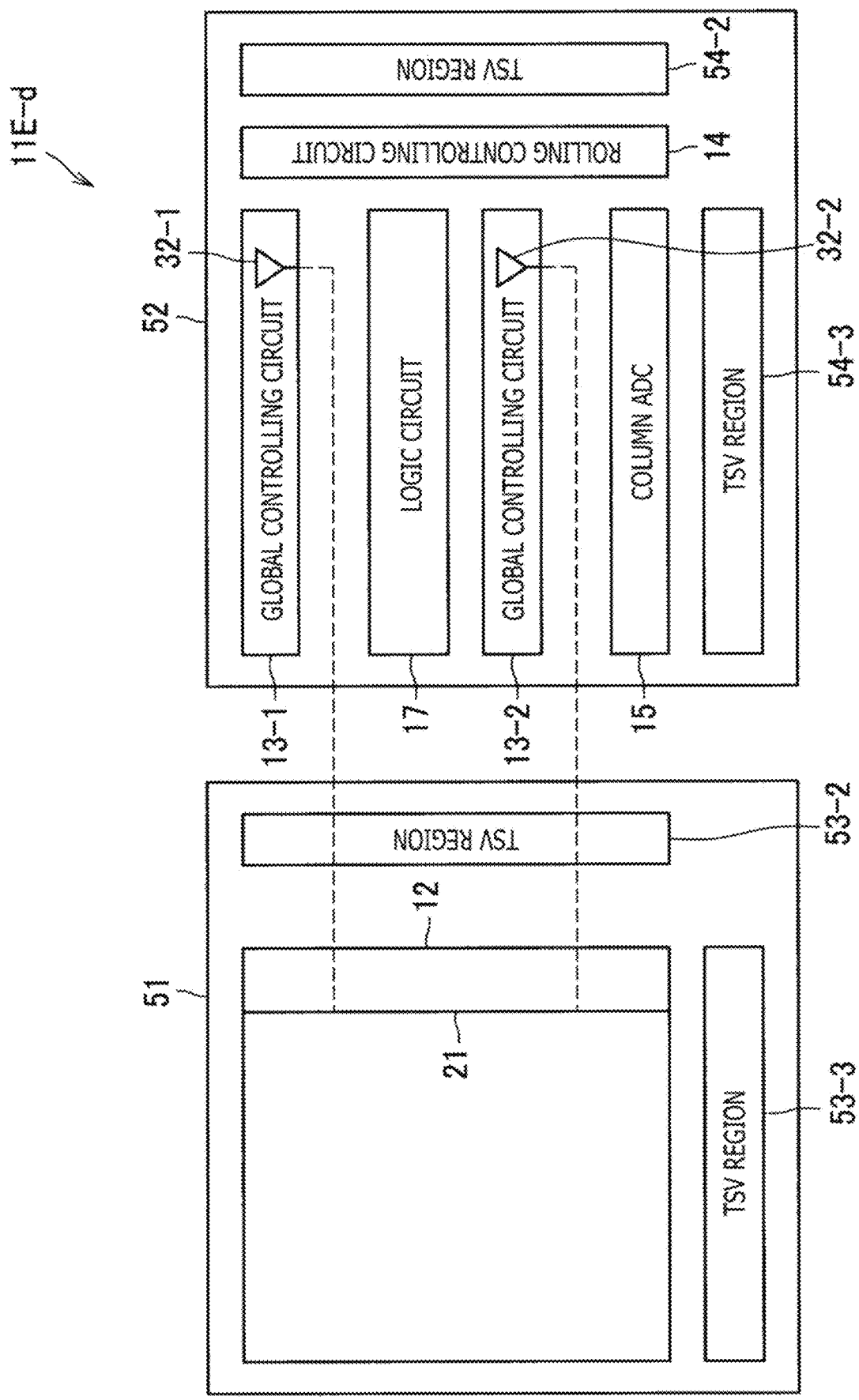
FIG. 18 is a block diagram depicting a fourth modification of the sensor chip of FIG. 14.

FIG. 18 is a block diagram depicting a fourth modification of the sensor block 11E depicted in FIG. 14. It is to be noted that, from among blocks configuring the sensor chip 11E-d depicted in FIG. 18, components common to those of the sensor chip 11E of FIG. 14 are denoted by like reference characters, and detailed description of them is omitted.

In particular, the sensor chip 11E-d depicted in FIG. 18 is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, the sensor chip 11E-d is different in configuration from the sensor chip 11E of FIG. 14 in that, on the logic substrate 52, two global controlling circuits 13-1 and 13-2 are disposed and that the sensor chip 11E-d has such a connection structure that the global controlling circuit 13-1 is connected to a substantially center of an upper half of the control line 21 and the global controlling circuit 13-2 is connected to a substantially center of a lower half of the control line 21. In other words, the sensor chip 11E-d is configured such that it uses a single control line 21 to which the control lines 21-1 and 21-2 of FIG. 17 are connected.

The sensor chip 11E-d configured in this manner can suppress a skew between the two driving element 32-1 and driving element 32-2 and can eliminate a dispersion in delay time that occurs in a global controlling signal propagated along the control line 21. Consequently, in the sensor chip 11E-d, control for the sensor elements can be performed at a higher speed. It is to be noted that, in the sensor chip 11E-d, it is necessary to perform the control such that the delay difference in outputting of global controlling signals is avoided from becoming great such that through current may not be generated.

Figure 19:
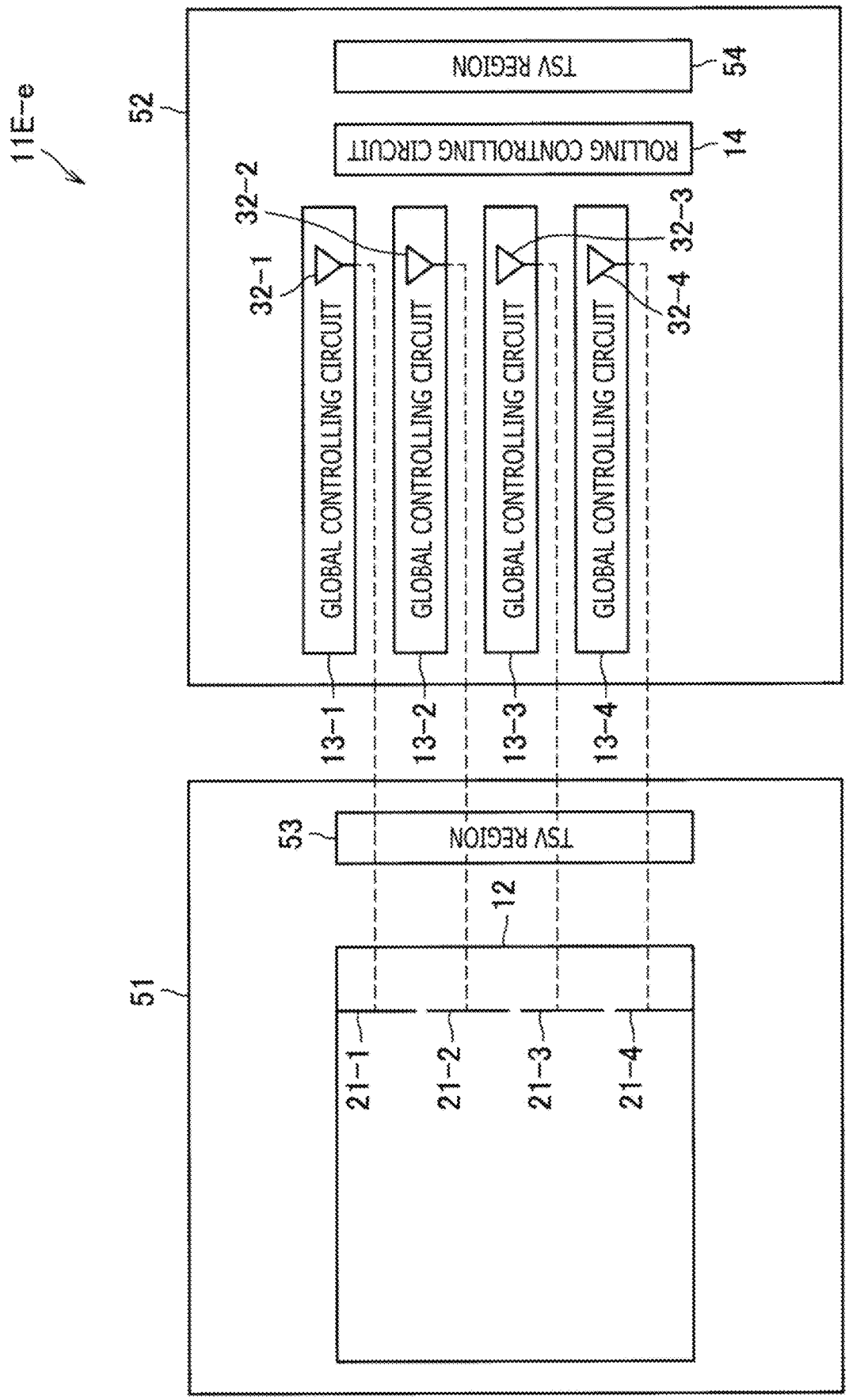
FIG. 19 is a block diagram depicting a fifth modification of the sensor chip of FIG. 14.

FIG. 19 is a block diagram depicting a fifth modification of the sensor block 11E depicted in FIG. 14. It is to be noted that, from among blocks configuring the sensor chip 11E-e depicted in FIG. 19, components common to those of the sensor chip 11E of FIG. 14 are denoted by like reference characters, and detailed description of them is omitted. Further, in the sensor chip 11E-e depicted in FIG. 19, in order to avoid the illustration from becoming complicated, illustration of part of blocks configuring the sensor chip 11E-e is omitted.

In particular, the sensor chip 11E-e depicted in FIG. 19 is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, the sensor chip 11E-e is different in configuration from the sensor chip 11E of FIG. 14 in that, on the sensor substrate 51, four divisional control lines 21-1 to 21-4 are disposed for one row of sensor elements disposed in a matrix in the pixel array section 12. Further, the sensor chip 11E-e is different in configuration from the sensor chip 11E of FIG. 14 in that, on the logic substrate 52, four global controlling circuits 13-1 to 13-4 are disposed.

Further, the sensor chip 11E-e has such a connection configuration that driving elements 32-1 to 32-4 of the global controlling circuits 13-1 to 13-4 are connected to central points of the control lines 21-1 to 21-4, respectively. Accordingly, in the sensor chip 11E-e, the distance from the driving elements 32-1 to 32-4 to sensor elements disposed at the remote end of the respective control lines 21-1 to 21-4 can be further reduced. Consequently, the sensor chip 11E-e can achieve further increase in speed of control for the sensor elements. It is to be noted that, although it is supposed that the column ADC 15A, logic circuit 17 and so forth are disposed separately, also in such a case as just described, it is necessary to adopt a layout in which this does not have an influence on a characteristic.

It is to be noted that, although the configuration example depicted in FIG. 19 is described using the four divisional control lines 21-1 to 21-4, the control line 21 may otherwise be divided into three control lines or five or more control lines. Thus, such a configuration can be taken that, to substantially central portions of the divisional control lines 21, respectively corresponding global controlling circuits 13 are connected.

Figure 20:
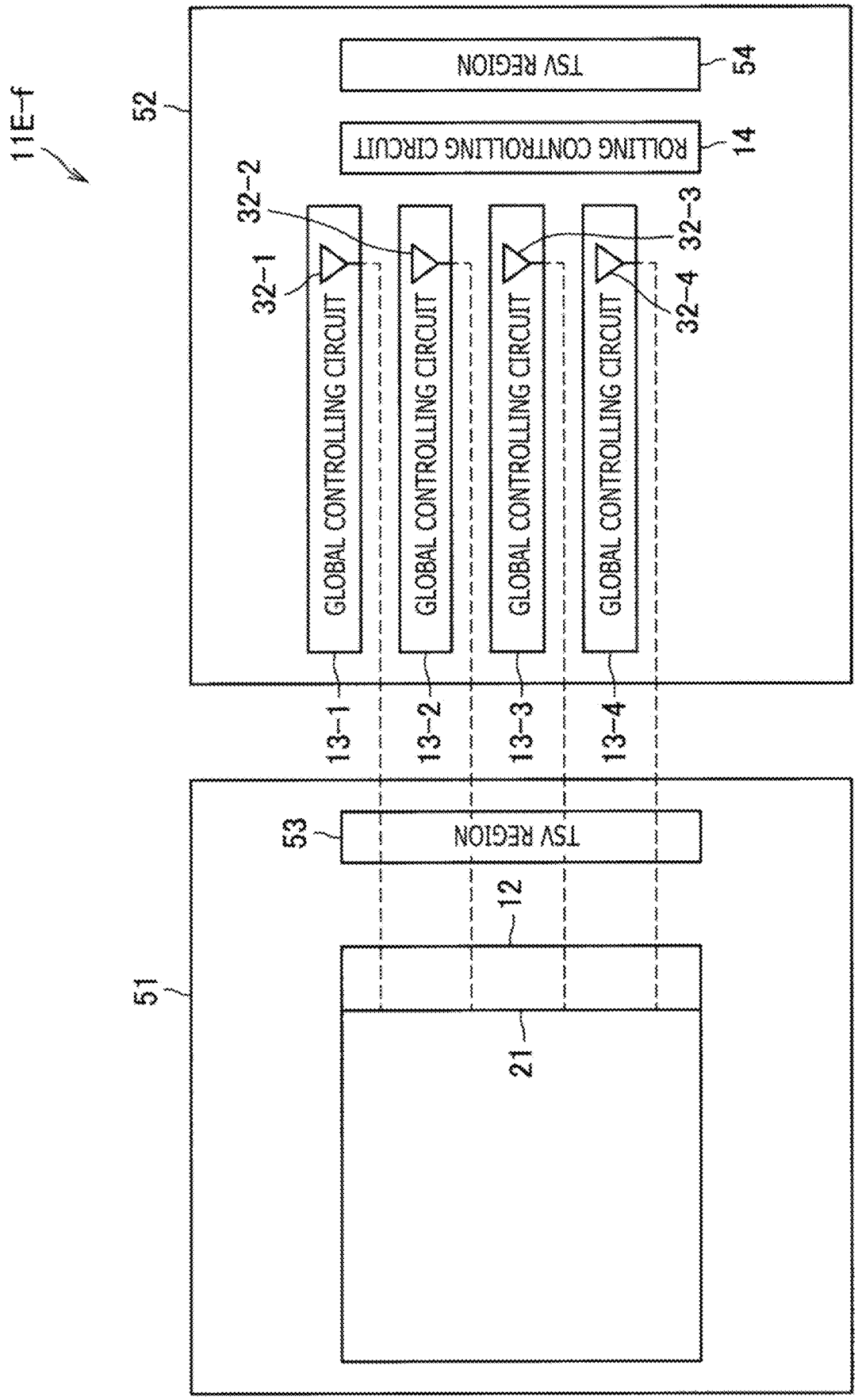
FIG. 20 is a block diagram depicting a sixth modification of the sensor chip of FIG. 14.

FIG. 20 is a block diagram depicting a sixth modification of the sensor block 11E depicted in FIG. 14. It is to be noted that, from among blocks configuring the sensor chip 11E-f depicted in FIG. 20, components common to those of the sensor chip 11E of FIG. 14 are denoted by like reference characters, and detailed description of them is omitted.

In particular, the sensor chip 11E-f depicted in FIG. 20 is common in configuration to the sensor chip 11E of FIG. 14 in that it has a stacked structure in which a sensor substrate 51 on which a pixel array section 12 is formed and a logic substrate 52 on which a global controlling circuit 13 is formed are stacked.

On the other hand, the sensor chip 11E-f is different in configuration from the sensor chip 11E of FIG. 14 in that four global controlling circuits 13-1 to 13-4 are disposed on the logic substrate 52 and global controlling circuits 13-1 to 13-4 are connected at equal distances to the control line 21. In other words, the sensor chip 11E-d is configured such that it uses a single control line 21 to which the control lines 21-1 to 21-4 of FIG. 19 are connected.

The sensor chip 11E-f configured in this manner can suppress a skew among the four driving elements 32-1 to 32-4 and can eliminate a dispersion in delay time that occurs in a global controlling signal propagated along the control line 21. Consequently, in the sensor chip 11E-f, control for the sensor elements can be performed at a higher speed. It is to be noted that, in the sensor chip 11E-f, it is necessary to perform the control such that the delay difference in outputting of global controlling signals becomes great such that through current may not be generated.

Figure 21:
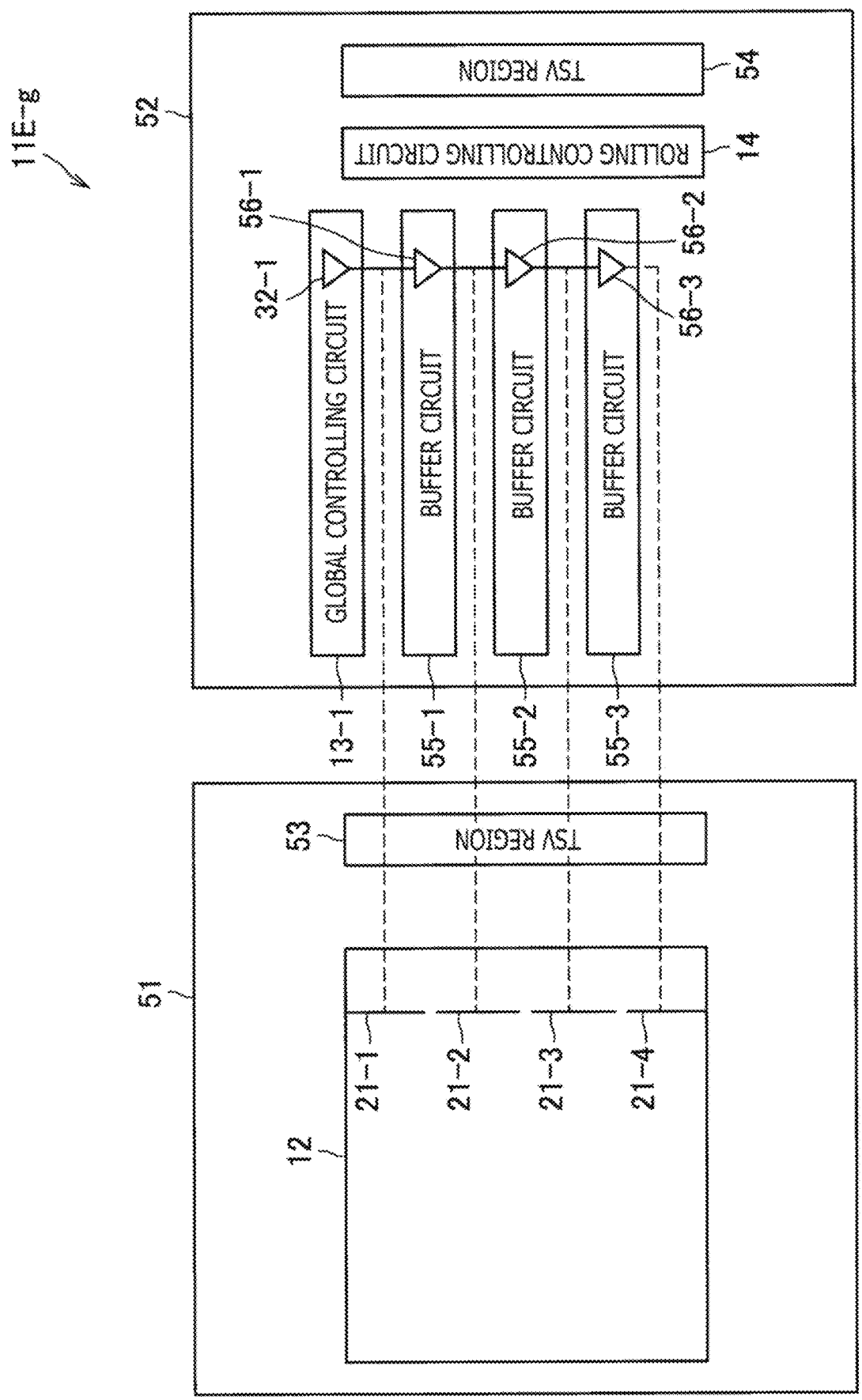
FIG. 21 is a block diagram depicting a seventh modification of the sensor chip of FIG. 14.

FIG. 21 is a block diagram depicting a seventh modification of the sensor block 11E depicted in FIG. 14. It is to be noted that, from among blocks configuring the sensor chip 11E-g depicted in FIG. 21, components common to those of the sensor chip 11E-e of FIG. 19 are denoted by like reference characters, and detailed description of them is omitted.

In particular, the sensor chip 11E-g is configured including a single global controlling circuit 13 and is configured including buffer circuits 55-1 to 55-3 in place of the global controlling circuits 13-2 to 13-4 of the sensor chip 11E-e of FIG. 19. The buffer circuits 55-1 to 55-3 have buffers 56-1 to 56-3, respectively, and an output of the driving element 32 of the global controlling circuit 13 is branched by the buffers 56-1 to 56-3 and connected to four divisional control lines 21-1 to 21-4.

Also with the sensor chip 11E-g configured in this manner, further increase in speed of control for the sensor elements can be achieved similarly with the sensor chip 11E-e of FIG. 19.

Figure 22:
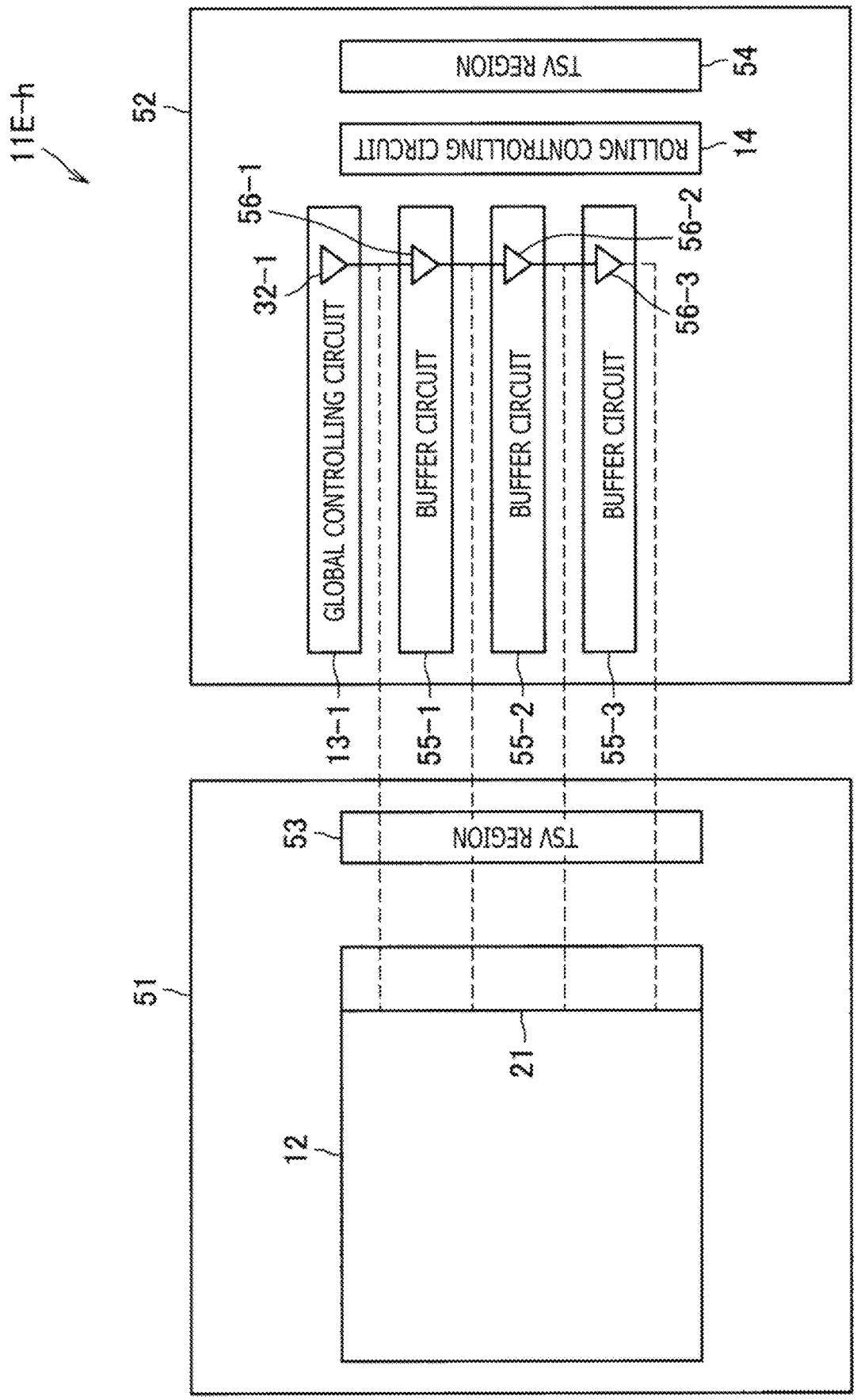
FIG. 22 is a block diagram depicting an eighth modification of the sensor chip of FIG. 14.

FIG. 22 is a block diagram depicting an eighth modification of the sensor block 11E depicted in FIG. 14. It is to be noted that, from among blocks configuring the sensor chip 11E-h depicted in FIG. 22, components common to those of the sensor chip 11E-f of FIG. 20 are denoted by like reference characters, and detailed description of them is omitted.

In particular, the sensor chip 11E-g is configured including a single global controlling circuit 13 and is configured including buffer circuits 55-1 to 55-3 in place of the global controlling circuits 13-2 to 13-4 of the sensor chip 11E-f of FIG. 20. The buffer circuits 55-1 to 55-3 have buffers 56-1 to 56-3, respectively, and an output of the driving element 32 of the global controlling circuit 13 is branched by the buffers 56-1 to 56-3 and connected to a control line 21.

Also with the sensor chip 11E-h configured in this manner, further increase in speed of control for the sensor elements can be achieved similarly with the sensor chip 11E-f of FIG. 20.

<Seventh Configuration Example of Sensor Chip>

A seventh embodiment of a sensor chip to which the present technology is applied is described with reference to FIGS. 23 to 25. It is to be noted that, from among blocks configuring the sensor chip 11F depicted in FIGS. 23 to 25, components common to those of the sensor chip 11E of FIG. 13 are denoted by like reference characters, and detailed description of them is omitted.

Figure 23:
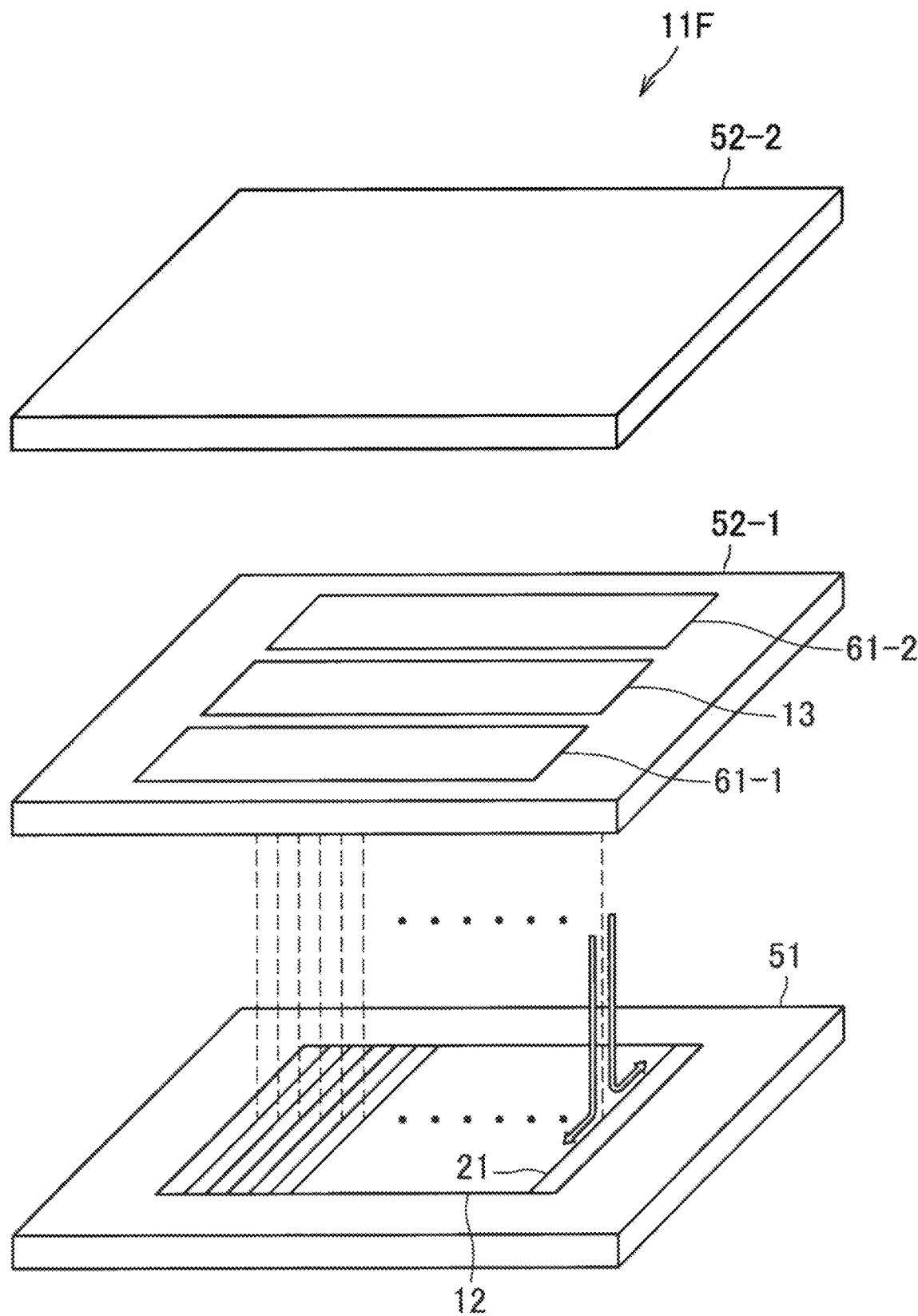
FIG. 23 is a perspective view depicting a configuration example of a seventh embodiment of the sensor chip.

In particular, the sensor chip 11F depicted in FIG. 23 has a stacked structure in which a sensor substrate 51 and two logic substrates 52-1 and 52-2 are stacked. In other words, the present technology can be applied to a structure in which three semiconductor substrates are stacked.

As depicted in FIG. 23, the sensor chip 11F is configured such that a pixel array section 12 is formed on a sensor substrate 51 of the first layer and a global controlling circuit 13 and memories 61-1 and 61-2 are formed on a logic substrate 52-1 of the second layer while, for example, a column ADC 15, a logic circuit 17 and forth not depicted are formed on a logic substrate 52-2 of the third layer.

Also in the sensor chip 11F configured in this manner, by disposing the global controlling circuit 13 on the logic substrate 52-1 along the longitudinal direction of the pixel array section 12 of the sensor substrate 51, control for the sensor elements can be performed at a higher speed similarly as in the sensor chip 11E of FIG. 13.

Further, in the sensor chip 11F in which the sensor substrate 51, logic substrate 52-1 and logic substrate 52-2 are slacked in this order, preferably the global controlling circuit 13 is disposed at the center of the logic substrate 52-1 stacked between the sensor substrate 51 and the logic substrate 52-2. Consequently, the distance from the global controlling circuit 13 to a sensor element disposed at the remote end of the logic substrate 52-1 can be made short. Naturally, if the distance from the global controlling circuit 13 to a sensor element disposed at the remote end of the control line 21 can be made short, then the layout is not limited to such a layout as depicted in FIG. 23.

Figure 24:
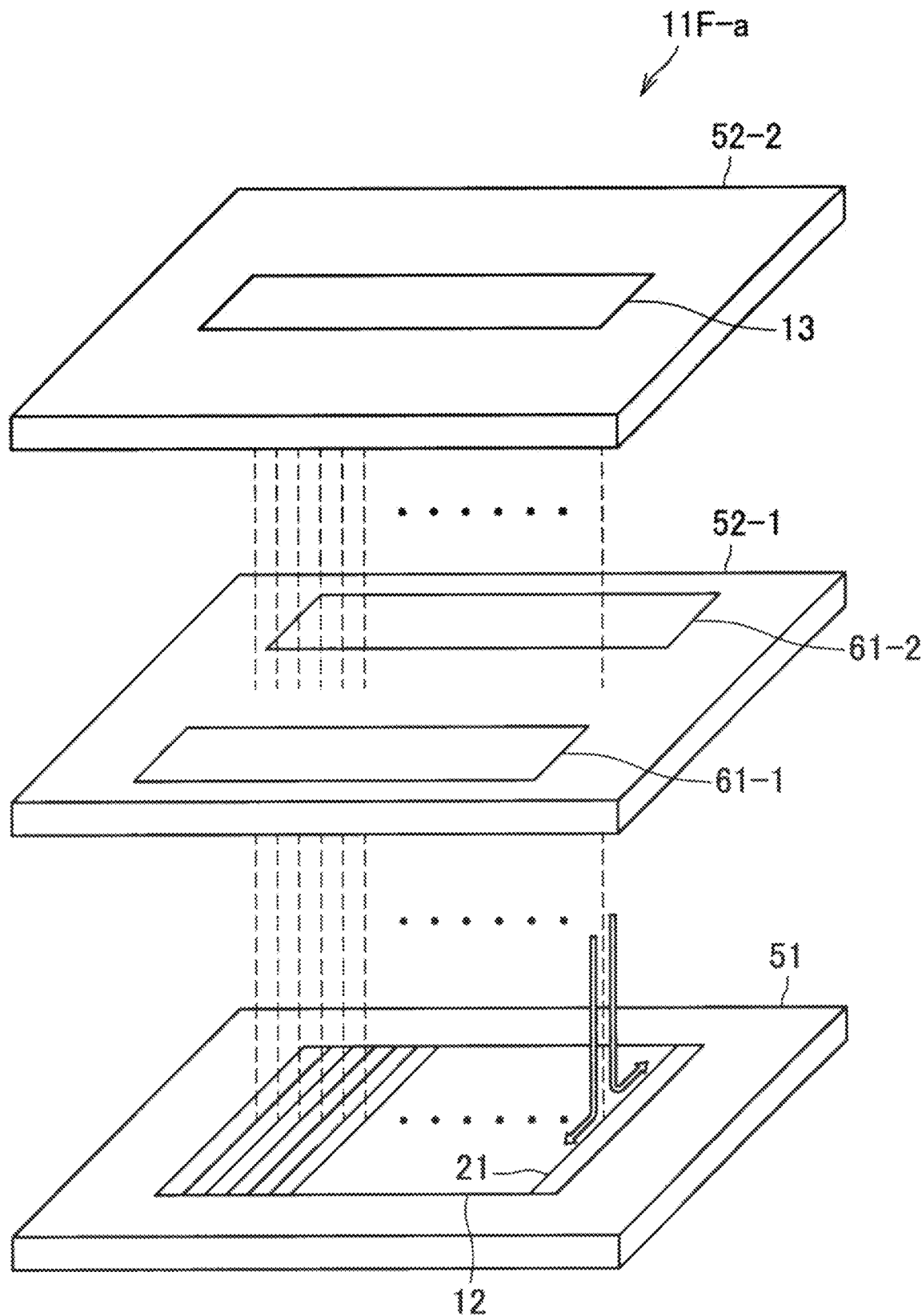
FIG. 24 is a perspective view depicting a first modification of the sensor chip of FIG. 23.

FIG. 24 is a perspective view depicting a first modification of the sensor chip 11F depicted in FIG. 23.

As depicted in FIG. 24, the sensor chip 11F-a is configured such that the pixel array section 12 is formed on the sensor substrate 51 of the first layer; the memories 61-1 and 61-2 are formed on the logic substrate 52-1 of the second layer; and, for example, the global controlling circuit 13, the column ADC 15 and logic circuit 17 not depicted and so forth are formed on the logic substrate 52-2 of the third layer.

Also in the sensor chip 11F-a configured in this manner, by disposing the global controlling circuit 13 on the logic substrate 52-2 so as to extend along the longitudinal direction of the pixel array section 12 of the sensor substrate 51, control for the sensor elements can be performed at a higher speed similarly as in the sensor chip 11E of FIG. 13.

Figure 25:
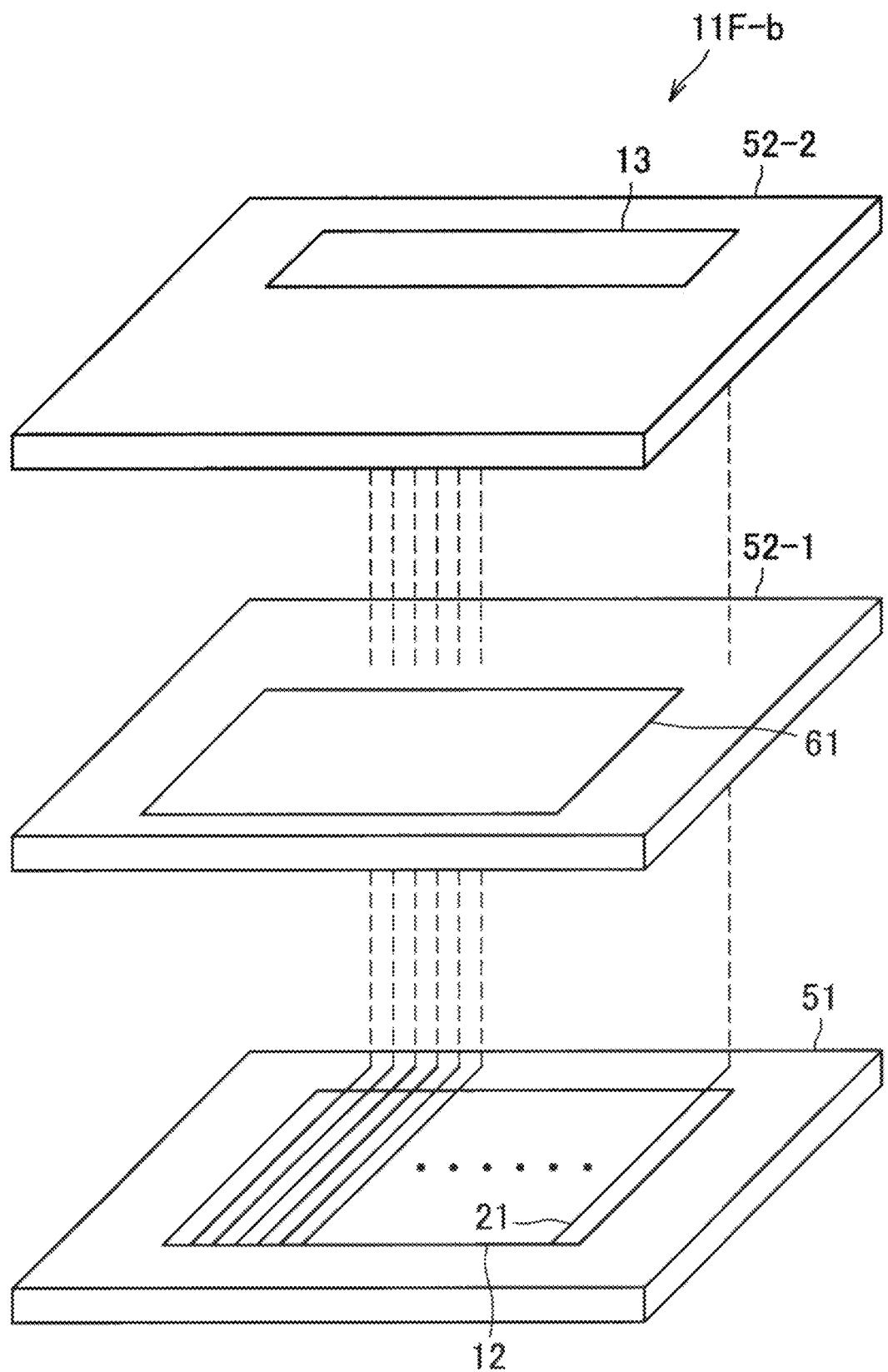
FIG. 25 is a perspective view depicting a second modification of the sensor chip of FIG. 23.

FIG. 25 is a perspective view depicting a second modification of the sensor chip 11F depicted in FIG. 23.

As depicted in FIG. 25, the sensor chip 11F-b is configured such that the pixel array section 12 is formed on the sensor substrate 51 of the first layer; the memory 61 is formed on the logic substrate 52-1 of the second layer; and, for example, the global controlling circuit 13, the column ADC 15 and logic circuit 17 not depicted and so forth are formed on the logic substrate 52-2 of the third layer. It is to be noted that the sensor chip 11F-b has such a connection configuration that the control line 21 is connected to the global controlling circuit 13 utilizing a TSV region formed in a peripheral region of the sensor chip 11F-b, for example, similarly to the sensor chip 11B of FIG. 8.

Also in the sensor chip 11F-b configured in this manner, by disposing the global controlling circuit 13 on the logic substrate 52-2 so as to extend along the longitudinal direction of the pixel array section 12 of the sensor substrate 51, control for the sensor elements can be performed at a higher speed similarly as in the sensor chip 11E of FIG. 13.

It is to be noted that, for example, three or more semiconductor substrates may be stacked, and a global controlling circuit 13 may be disposed at two locations as described hereinabove with reference to FIG. 16 or a global controlling circuit 13 may be disposed at a plurality of locations equal to or greater than two locations. In this case, a semiconductor substrate on which the memory 61 is disposed, the location or divisional number of the memory 61 can be laid out suitably in response to the disposition of the global controlling circuit 13.

For example, such a configuration may be adopted that the pixel array section 12 is disposed on a semiconductor substrate of the first layer; the column ADC 15, logic circuit 17 and so forth are disposed on a semiconductor substrate of the second layer; and the memory 61 is disposed on a semiconductor substrate of the third layer. Also in such a configuration as just described, by disposing the global controlling circuit 13 on the semiconductor substrate of the second layer, the wiring line length can be made short. However, the global controlling circuit 13 may otherwise be disposed on a semiconductor substrate on which the memory 61 is disposed.

<Eighth Configuration Example of Sensor Chip>

An eighth embodiment of a sensor chip to which the present technology is applied is described with reference to FIG. 26. It is to be noted that, from among blocks configuring the sensor chip 11G depicted in FIG. 26, components common to those of the sensor chip 11E of FIG. 14 are denoted by like reference characters, and detailed description of them is omitted.

Figure 26:
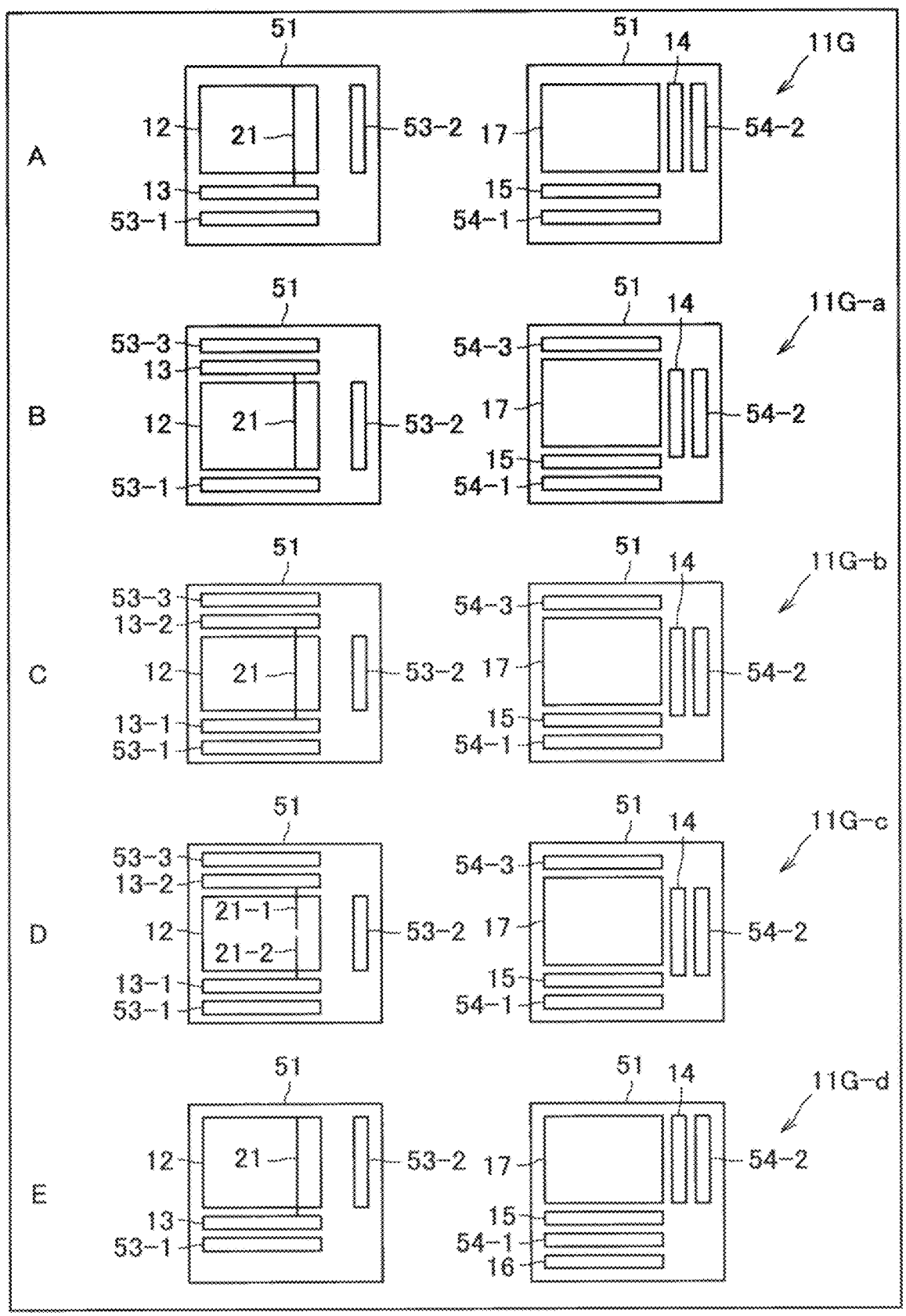
FIG. 26 is a block diagram depicting a configuration example of an eight embodiment of the sensor chip and a modification of the same.

In particular, the disposition of the global controlling circuit 13 in the sensor chip 11 is not limited to those in the embodiments described hereinabove, and such various layouts as depicted in FIG. 26 can be adopted. Naturally, in any disposition, such a layout that is not depicted may be adopted if the global controlling circuit 13 is disposed so as to extend along a long side of the pixel array section 12.

As depicted in FIG. 26A, a sensor chip 11G has such a layout that the pixel array section 12 and the global controlling circuit 13 are disposed on the sensor substrate 51 and the rolling controlling circuit 14, column ADC 15 and logic circuit 17 are disposed on the logic substrate 52. Further, in the sensor chip 11G, the global controlling circuit 13 is disposed on the lower side of the pixel array section 12 so as to extend along a long side of the pixel array section 12.

As depicted in FIG. 26B, a sensor chip 11G-a has such a layout that the pixel array section 12 and the global controlling circuit 13 are disposed on the sensor substrate 51 and the rolling controlling circuit 14, column ADC 15 and logic circuit 17 are disposed on the logic substrate 52. Further, in the sensor chip 11G-a, the global controlling circuit 13 is disposed on the upper side of the pixel array section 12 so as to extend along a long side of the pixel array section 12.

As depicted in FIG. 26C, a sensor chip 11G-b has such a layout that the pixel array section 12 and the global controlling circuits 13-1 and 13-2 are disposed on the sensor substrate 51 and the rolling controlling circuit 14, column ADC 15 and logic circuit 17 are disposed on the logic substrate 52. Further, in the sensor chip 11G-b, the global controlling circuits 13-1 and 13-2 are disposed on the upper side and the lower side of the pixel array section 12 so as to extend along a long side of the pixel array section 12, respectively.

As depicted in FIG. 26D, a sensor chip 11G-c has such a layout that the pixel array section 12 and the global controlling circuits 13-1 and 13-2 are disposed on the sensor substrate 51 and the rolling controlling circuit 14, column ADC 15 and logic circuit 17 are disposed on the logic substrate 52. Further, in the sensor chip 11G-c, the global controlling circuits 13-1 and 13-2 are disposed on the upper side and the lower side of the pixel array section 12 so as to extend along a long side of the pixel array section 12, respectively, and the two control lines 21-1 and 21-2 are disposed such that they are separate at the center of a column of the sensor elements disposed in a matrix on the pixel array section 12.

As depicted in FIG. 26E, a sensor chip 11G-d has such a layout that the pixel array section 12 and the global controlling circuits 13-1 and 13-2 are disposed on the sensor substrate 51 and the rolling controlling circuit 14, column ADC 15 and logic circuit 17 are disposed on the logic substrate 52. Further, in the sensor chip 11G-d, the inputting and outputting section 16 is disposed on the logic substrate 52 so as to extend along a long side of the pixel array section 12.

For example, the sensor chip 11G-d is configured such that it supplies power from the inputting and outputting section 16 to the global controlling circuit 13 through the TSV region 54-1 and the TSV region 53-1. It is to be noted that, in addition to utilization of a TSV, interconnection of copper (Cu) configuring wiring lines, micro bumps and so forth may be utilized to supply power to the global controlling circuit 13. Further, for the wiring line for supplying power to the global controlling circuit 13, a same connection method as that for the control line 21 may be used or a connection method of some other combination may be used. Further, in addition to the configuration in which semiconductor substrates of two layers are stacked, also in a configuration in which semiconductor substrates of three layers are stacked, preferably the global controlling circuit 13 is disposed in the proximity of the inputting and outputting section 16 similarly.

It is to be noted that, while the various layouts depicted in FIG. 26 indicate exampled in which the column ADC 15 is disposed on one side of the logic substrate 52, a layout in which the column ADC 15 is disposed on the opposite upper and lower sides of the logic substrate 52 may be adopted. Further, the position of the column ADC 15 or the logic circuit 17 is not restricted to such disposition as depicted in FIG. 26.

As described above, by applying a stacked structure to the sensor chip 11, the global controlling circuit 13 can be disposed in various layouts, which increases the degree of freedom in layout and increases the effect of controlling the global controlling circuit 13 and the rolling controlling circuit 14 individually.

<Configuration Example of Distance Image Sensor>

Figure 27:
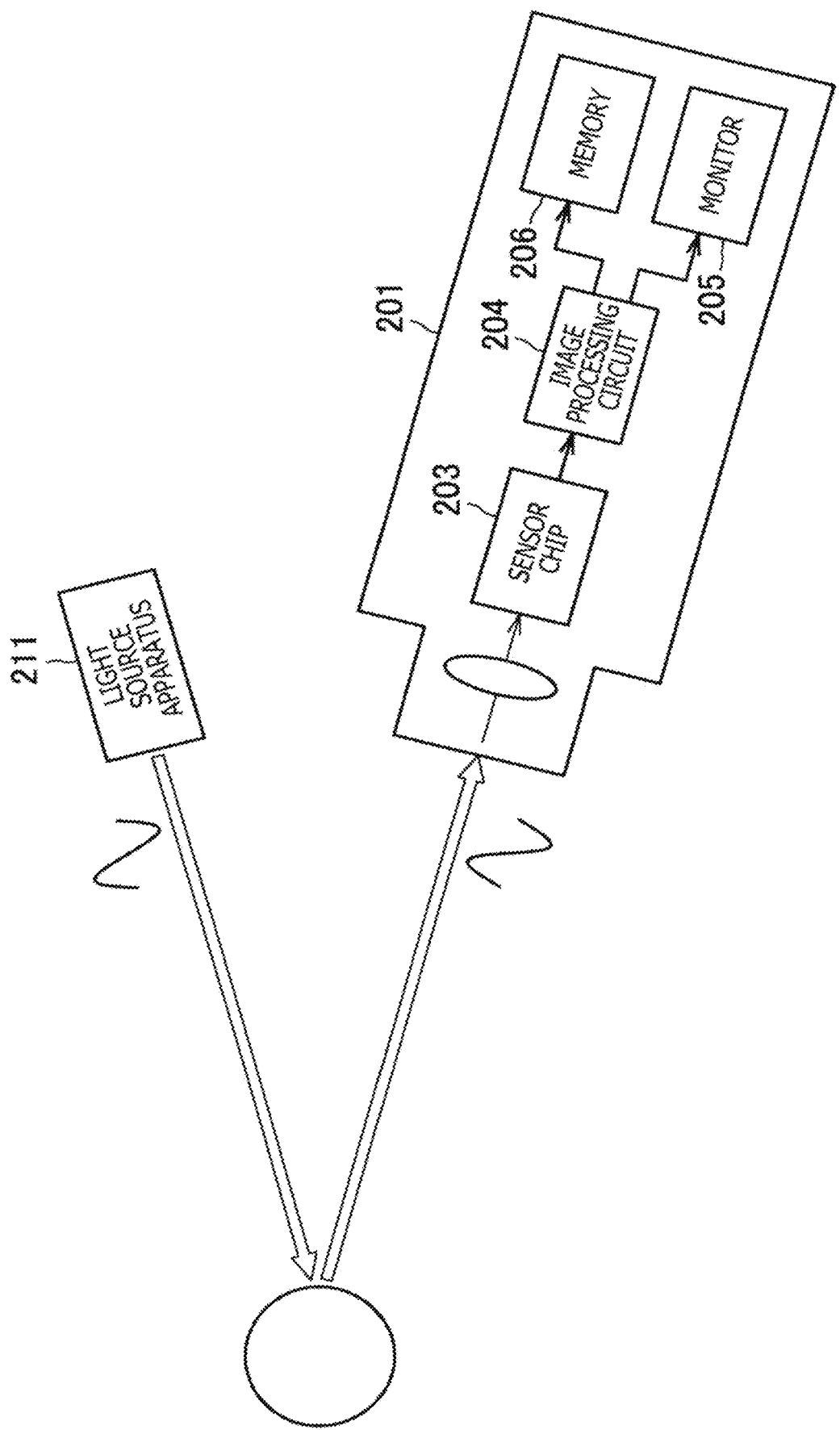
FIG. 27 is a block diagram depicting a configuration example of an imaging apparatus.

FIG. 27 is a block diagram depicting a configuration example of a distance image sensor that is an electronic apparatus utilizing the sensor chip 11.

As depicted in FIG. 27, the distance image sensor 201 is configured including an optical system 202, a sensor chip 203, an image processing circuit 204, a monitor 205 and a memory 206. Thus, the distance image sensor 201 can acquire a distance image according to the distance of an imaging object by receiving light (modulated light or pulse light) projected from a light source apparatus 211 toward the imaging object and reflected by the surface of the imaging object.

The optical system 202 is configured having one or a plurality of lenses and introduces image light (incident light) from an imaging object to the sensor chip 203 such that an image is formed on a light reception face (sensor section) of the sensor chip 203.

As the sensor chip 203, the sensor chip 11 of the embodiments described hereinabove is applied, and a distance signal indicative of a distance determined from a reception signal (APD OUT) outputted from the sensor chip 203 is supplied to the image processing circuit 204.

The image processing circuit 204 performs image processing for constructing a distance image on the basis of a distance signal supplied from the sensor chip 203, and a distance image (image data) obtained by the imaging processing is supplied to and displayed on the monitor 205 or supplied to and stored (recorded) into the memory 206.

In the distance image sensor 201 configured in this manner, by applying the sensor chip 11 described above, for example, a more accurate distance image can be acquired by performance of higher speed control.

It is to be noted that the distance image sensor 201 and the light source apparatus 211 may be configured as a unitary member. In this case, a module in which the distance image sensor 201 and the light source apparatus 211 are configured integrally can correspond to an example of the electronic equipment that utilizes the sensor chip 11 described above.

<<2. Overview of ToF>>

As an example of the technology capable of being applied to the distance measurement in which the distance image sensor according to the embodiment of the present disclosure is utilized, an overview of a technology called "ToF (time of flight)" is described. The ToF is a technology fir performing distance measurement by calculating a time period after light is projected from a distance image sensor until the light returns to the distance image sensor after reflected by an imaging object using some method. As the ToF, for example, a technology called direct ToF (Direct ToF) and another technology called indirect ToF (InDirect ToF) are available. It is to be noted that, in the following description, the time period after light is projected from the distance image sensor until the light returns to the distance image sensor after reflected by an imaging object is referred to sometimes as "flight time of light" or simply as "ToF" for the convenience of description.

The technology called direct ToF is a technique by which light flight time is measured directly to measure the distance to an imaging object. In particular, in the direct ToF, pulse light emitted only for a very short period of time from a light source provided on the distance image sensor (or a light source provided together with the distance image sensor) is projected to an imaging object to directly measure the time period until the light is reflected by the imaging object and received by a sensor chip provided on the distance image sensor. By multiplying one half the time period measured in this manner by the speed of light, the distance between the distance image sensor and the imaging object can be calculated. From such a characteristic as just described, the measurement accuracy by the direct ToF sometimes depends upon the resolution in time measurement by the distance image sensor.

On the other hand, the indirect ToF is a method by which the variation of a physical quantity, which depends upon the light flight time, is measured to indirectly measure the light flight time and then the distance to an imaging object is measured on the basis of a result of the measurement.

Figure 28:
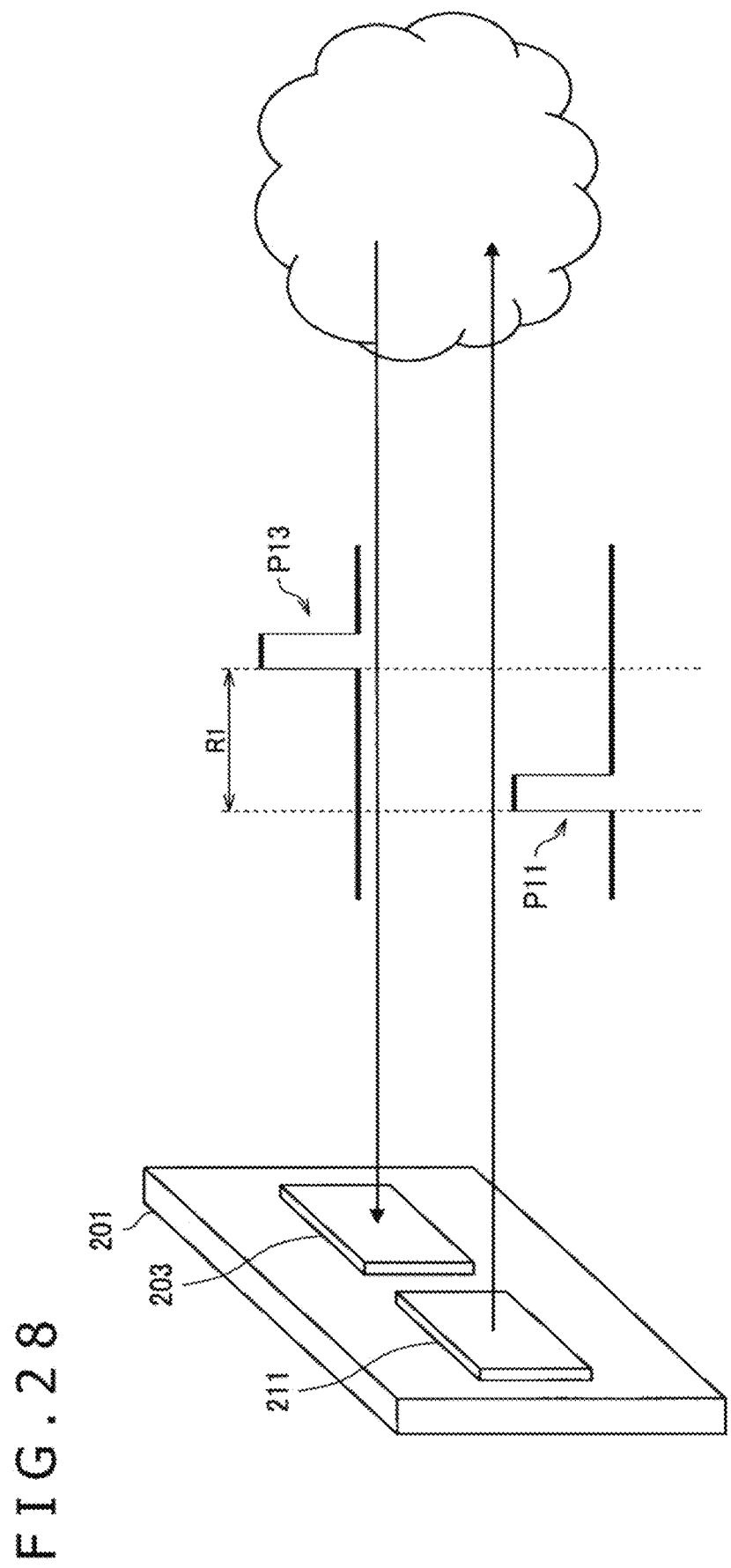
FIG. 28 is an explanatory view illustrating an overview of a principle of distance measurement by the indirect ToF.

As a particular example of the indirect ToF, a method is available by which the delay of time after light is projected from the distance image sensor until it is reflected by an imaging object and returns to the distance image sensor is detected as a phase difference. For example, FIG. 28 is an explanatory view illustrating an overview relating to the principle of the distance measurement by the indirect ToF. It is to be noted that a distance image sensor 201 depicted in FIG. 28 is a view schematically depicting the distance image sensor 201 described hereinabove with reference to FIG. 27. In particular, reference numerals 211 and 203 depicted in FIG. 28 correspond to the light source apparatus 211 and the sensor chip 203 in the distance image sensor 201 depicted in FIG. 27.

As depicted in FIG. 28, the distance image sensor 201 causes the light source apparatus 211 to project light (modulation light or pulse light) toward an imaging object and causes the sensor chip 203 to detect the light reflected by the imaging object. It is to be noted that, in the following description, while description is given focusing on a case in which pulse light is projected from the light source apparatus 211 for the convenience of description, also it is possible to replace the pulse light into modulation light.

In particular, the distance image sensor 201 projects pulse light P11 periodically from the light source apparatus 211 and controls operation of the sensor chip 203 so as to be driven in synchronism with a cycle in which the pulse light P11 is projected (in other words, the shutter is released). Consequently, the sensor elements of the sensor chip 203 receive pulse light P13 projected from the light source apparatus 211 and reflected by the imaging object to detect the light reception amount of the pulse light P13 in synchronism with the cycle described above (namely, accumulated charge is read out). In other words, a period within which the sensor elements of the sensor chip 203 detect pulse light P13 reflected by the imaging object (hereinafter referred to also as "detection period") is set in synchronism with the cycle described above.

On the basis of such a configuration as described above, the distance image sensor 201 causes the sensor elements of the sensor chip 203 to detect the pulse light P13 reflected by the imaging object individually during detection periods for individual phases according to the cycle described above within which the pulse light P11 is projected from the light source apparatus 211. As the detection periods for the individual phases according to the cycle described above, for example, taking a predetermined phase as zero degrees, a detection period from zero degrees to 180 degrees and another detection period from 180 degrees to 360 degrees are set. Further, a further detection period from 90 degrees to 270 degrees and a still further detection period from 270 degrees to 90 degrees may be set. In particular, within each of the detection periods set for the individual phases according to the cycle described, the pulse light P13 reflected by the imaging object is detected individually.

A phase difference according to the distance between the distance image sensor 201 and the imaging object appears between the pulse light P11 (irradiation light) projected from the light source apparatus 211 toward the imaging object and the pulse light P13 (reflection light) reflected by the imaging object. At this time, the difference between charge amounts (namely, light reception amounts) accumulated during the cycle for each phase (in other words, the ratio of the charge amounts accumulated during the cycle for each phase) depends upon the phase difference between the irradiation light (pulse light P11) and the reflection light (pulse light P13) (in other words, the delay time).

In particular, in the indirect ToF, the light flight time is measured indirectly in accordance with the difference between the charge amounts accumulated individually during the detection period for each phase (namely, the ratio of the charge amounts between the phases), and the distance between the distance image sensor and the imaging object is calculated on the basis of a result of the measurement. From such a characteristic as described above, the distance measurement accuracy by the indirect ToF depends upon the cycle of pulse light projected from the light source (in other words, upon the pulse width of pulse light), and there is a tendency that basically the distance measurement accuracy increases as the cycle decreases.

Note that it is assumed that, in the following description, in order to further facilitate a feature of the distance image sensor according to the embodiment of the present disclosure, unless otherwise specified, the distance measurement is performed by the indirect ToF.

<<3. Technical Feature>>

Subsequently, a technical feature of the distance image sensor according to the embodiment of the present disclosure is described particularly focusing on control of a configuration relating to the distance measurement.

As described above, in the case where distance measurement is performed by the indirect ToF, the sensor chip for detecting pulse light (reflection light) reflected by an imaging object is driven so as to synchronize with a cycle in which the pulse light is projected from the light source apparatus. Therefore, in the case where the distance measurement is performed by the indirect ToF, control for synchronizing operation of the light source apparatus for projecting pulse light (hereinafter referred to also as "operation of the light source apparatus" simply) and operation of the sensor chip for detecting the pulse light reflected by an imaging object (hereinafter referred to also as "operation of the sensor chip" simply) with each other is sometimes performed. It is to be noted that the timing at which the light source apparatus projects pulse light corresponds to an example of the "second timing." Further, the timing at which the sensor chip detects the pulse light reflected by the imaging object corresponds to an example of the "first timing." In particular, the relative time difference between the first timing and the second timing is controlled by the control described above, and after all, the synchronization between the first timing and the second timing is performed.

Comparative Example

Figure 29:
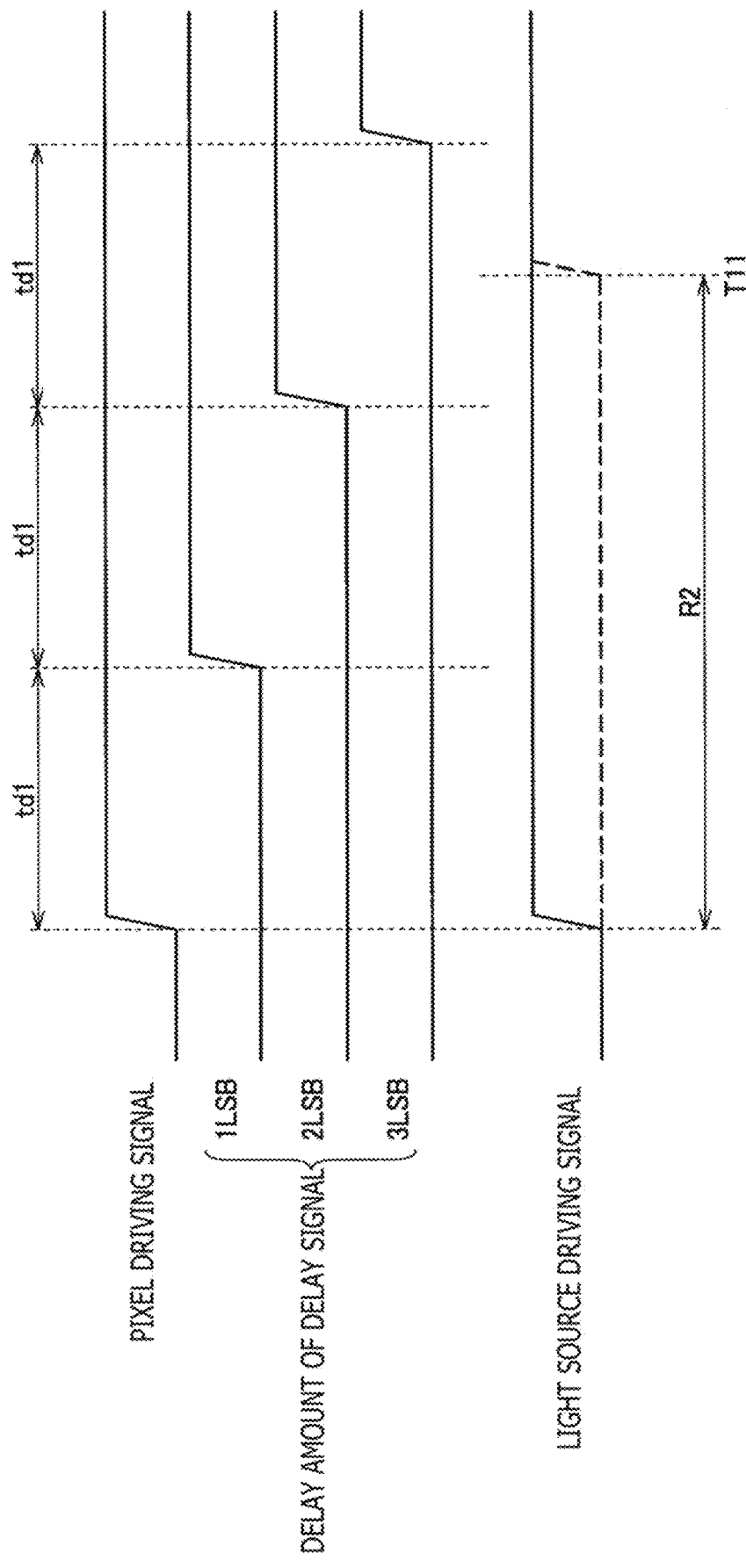
FIG. 29 is an explanatory view illustrating an example of operation control of a distance image sensor according to a comparative example.

Here, in order to further facilitate a feature of the distance image sensor according to the embodiment of the present disclosure, an example of operation control of the distance image sensor according to the comparative example is described first particularly focusing on control for synchronizing operation of the light source apparatus and operation of the sensor chip with each other. For example, FIG. 29 is an explanatory view illustrating an example of operation control of the distance image sensor according to the comparative example. In the example depicted in FIG. 29, a driving signal for driving sensor elements of the sensor chip (hereinafter referred to also as "pixel driving signal") is delayed to perform the synchronization between operation of the light source apparatus and operation of the sensor chip.

In particular, in the example depicted in FIG. 29, the resolution in delay adjustment of the pixel driving signal is td1. In particular, in the example depicted in FIG. 29, the minimum unit adjusting the delay of the pixel driving signal (LSB: Least-Significant Bit) is td1, and, in other words, the adjustment of the delay is performed in a unit of td1. It is to be noted that, in the example of FIG. 29, delay signals after delays by 1 LSB to 3 LSB are performed for the pixel driving signal are depicted together.

Further, in FIG. 29, reference character T11 schematically indicates a timing at which, in the case where the light source apparatus is driven on the basis of a light source driving signal, the light source apparatus actually emits light by a delay by a driving circuit for driving the light source apparatus or the like. In particular, reference character R2 schematically indicates a delay amount of the delay by the driving circuit for driving the light source apparatus or the like. In particular, in the example depicted in FIG. 29, a delay is performed in a unit of td1 for the pixel driving signal such that the sensor elements of the sensor chip perform light reception operation in synchronism with a light emission timing T11 of the light source apparatus thereby to perform synchronization between operation of the light source apparatus and operation of the sensor chip.

On the other hand, as depicted in FIG. 29, in the distance image sensor according to the comparative example, it is difficult to adjust the synchronization between operation of the light source apparatus and operation of the sensor chip with a resolution finer than td1 from such a characteristic that the delay of the pixel driving signal is adjusted in a unit of td1. Therefore, in the distance image sensor according to the comparative example, an error upon synchronization between the pixel driving signal and the light source driving signal (namely, an error occurring upon synchronization between operation of the light source apparatus and operation of the sensor chip) is superposed with a phase difference between the pulse light (irradiation light) projected from the light source apparatus toward the imaging object and the pulse light (reflection light) reflected by the imaging object. There is the possibility that such an error as just described may reveal, for example, as an error of a result of the distance measurement and, in particular, there is the possibility that the error may become a factor of deterioration of the distance measurement accuracy. In other words, in the distance image sensor according to the comparative example, it is difficult to set the resolution in correction for eliminating an error, which is to be superposed on the phase difference together with the synchronization between the pixel driving signal and the light source driving signal, (such resolution is hereinafter referred to also as "phase adjustment resolution") finer than the resolution td1 in adjustment of the delay of the pixel driving signal (hereinafter referred to also as "delay adjustment resolution td1"). Therefore, in the distance image sensor according to the comparative example, there is a case in which it is difficult to eliminate an error finer than the delay adjustment resolution td1 from among errors that are superposed on the phase difference together with the synchronization between the pixel driving signal and the light source driving signal.

As a countermeasure for solving the problem described above, a method is available by which a delay circuit having a finer resolution td1 for adjustment of the delay is applied. However, in this case, it becomes necessary to adopt a smaller element (for example, a capacitor, a resistor or the like) as a delay element to be applied to a delay circuit and, depending upon a resolution to be demanded, it is sometimes difficult to implement the method.

From such a background as described above, in order to measure the distance with higher accuracy, implementation of a mechanism is demanded, which makes it possible to correct an error, which is superposed on a phase difference between the irradiation light and the reflection light, with a higher resolution together with synchronization between operation of the light source apparatus and operation of the sensor chip. Therefore, the present disclosure proposes an example of a technology that makes it possible to further improve the phase adjustment resolution to improve the accuracy in distance measurement. More particularly, the present disclosure proposes an example of a technology that makes it possible to control the relative delay between operation of the light source and operation of the sensor chip (namely, the relative time difference between operation timings of the light source apparatus and the sensor chip) with a resolution finer than the resolution of a delay circuit itself applied to the control of the delay.

<Basic Idea>

Figure 30:
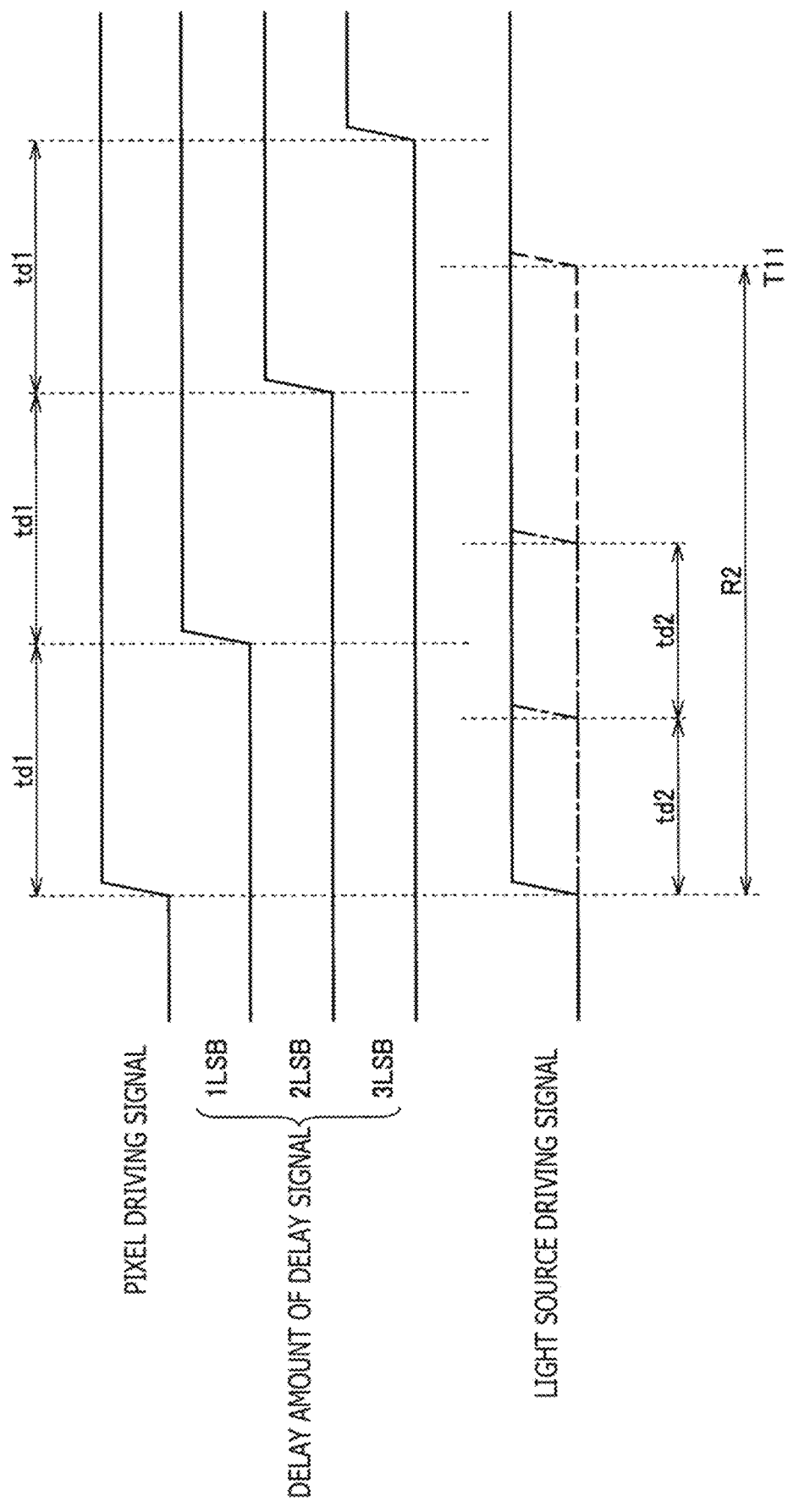
FIG. 30 is an explanatory view illustrating a basic idea of control of a distance image sensor according to an embodiment of the present disclosure.

First, an overview of a basic idea of the control of the distance image sensor according to an embodiment of the present disclosure is described with reference to FIG. 30. FIG. 30 is an explanatory view illustrating a basic idea of control of the distance image sensor according to the embodiment of the present disclosure.

In the distance image sensor according to the embodiment of the present disclosure, light that indicates periodic repetitions of a predetermined pattern like pulse light or modulation light is used as light to be projected to an image object, and the phase difference between the irradiation light and the reflection light is measured. Further, in the distance image sensor according to the embodiment of the present disclosure, the relative delay between operation of the light source apparatus and operation of the sensor chip is controlled to synchronize the operation of the light source apparatus and the operation of the sensor chip with each other. On the basis of such premises, the distance image sensor according to the embodiment of the present disclosure controls the relative delay between operation of the light source apparatus and operation of the sensor chip by applying individual delays by a plurality of delay circuits having resolutions (delay adjustment resolutions) different from each other to a pixel driving signal or a light source driving signal. It is to be noted that the pixel driving signal corresponds to an example of the "first driving signal," and the light source driving signal corresponds to one example of the "second driving signal."

For example, in the example depicted in FIG. 30, the timing at which a pixel of the sensor chip is driven and the timing at which the light source is driven are adjusted (controlled) independently of each other by delaying the pixel driving signal and the light source driving signal with delay circuits having delay adjustment resolutions different from each other. In other words, in the example depicted in FIG. 30, delay amounts whose delay adjustment resolutions are different from each other are applied individually to the control of the timing for driving a pixel of the sensor chip and the control of the timing for driving the light source apparatus. For example, in the example depicted in FIG. 30, the resolution relating to delay adjustment of the pixel driving signal is td1 while the resolution relating to delay adjustment of the light source signal is td2. It is to be noted that details of the present control are hereinafter described in detail as "first control example."

Meanwhile, as another example, one of the timing for driving a pixel of the sensor chip and the timing for driving the light source apparatus may be adjusted (controlled) by applying a plurality of delays by a plurality of delay circuits having delay adjustment resolutions different from each other to one of the pixel driving signal and the light source driving signal. In other words, a plurality of delay amounts having delay adjustment resolutions different from each other may be applied to one of the control of the timing for driving a pixel of the sensor chip and the control of the timing for driving the light source apparatus. It is to be noted that details of the present control are hereinafter described separately as "second control example."

First Control Example

First, a first control example of the distance image sensor according to the embodiment of the present disclosure is described. For example, FIGS. 31 and 32 are explanatory views illustrating the first control example of the distance image sensor according to the embodiment of the present disclosure.

First, an overview of delay control according to the present control example is described with reference to FIG. 31. In the present control example, a plurality of driving signals different from each other are individually delayed by delay circuits having delay adjustment resolutions different from each other to control the relative delay amount between the plurality of driving signals. For example, in FIG. 31, input signals $I_{11}$ and $I_{12}$ correspond individually to driving signals before the phase difference between them is adjusted, and output signals $O_{11}$ and $O_{12}$ individually correspond to driving signals after the phase difference between the input signals $I_{11}$ and $I_{12}$ is adjusted. Reference numeral 1010 corresponds to a configuration (hereinafter referred to also as "phase adjustment circuit") that delays a plurality of driving signals inputted thereto to control the relative control amount between the plurality of driving signals.

The phase adjustment circuit 1010 includes a first variable delay circuit 1011 and a second variable delay circuit 1013 that have delay adjustment resolutions different from each other. It is to be noted that the delay adjustment resolution of the first variable delay circuit 1011 is represented by td1 and the delay adjustment resolution of the second variable delay circuit 1013 is represented by td2. On the basis of such a configuration as just described, the first variable delay circuit 1011 performs a delay for the input signal $I_{11}$ and outputs the delayed input signal $I_{11}$ as the output signal $O_{11}$. At this time, the delay amount of the delay performed for the input signal $I_{11}$ by the first variable delay circuit 1011 is controlled in a unit of td1 on the basis of a delay controlling signal $D_{11}$. Meanwhile, the second variable delay circuit 1013 performs a delay for the input signal $I_{12}$ and outputs the delayed input signal $I_{12}$ as the output signal $O_{12}$. At this time, the delay amount of the delay performed for the input signal $I_{12}$ is controlled in a unit of td2 on the basis of a delay controlling signal $D_{12}$. It is to be noted that one of the input signals $I_{11}$ and $I_{12}$ corresponds to the light source driving signal before the delay is performed therefor, and the other can correspond to the pixel driving signal before the delay is performed therefor.

Figure 31:
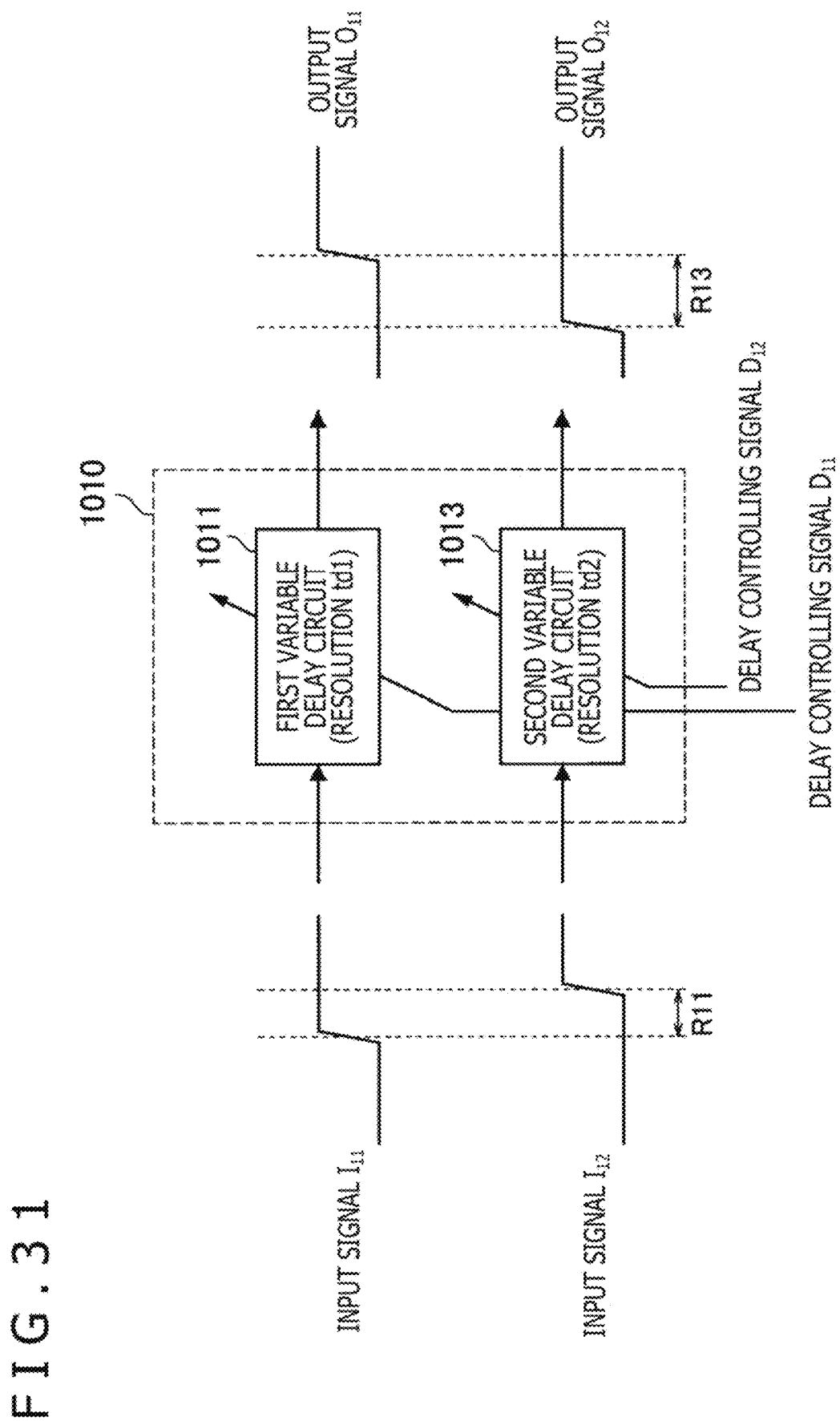
FIG. 31 is an explanatory view illustrating a first control example of the distance image sensor according to the embodiment.
Figure 32:
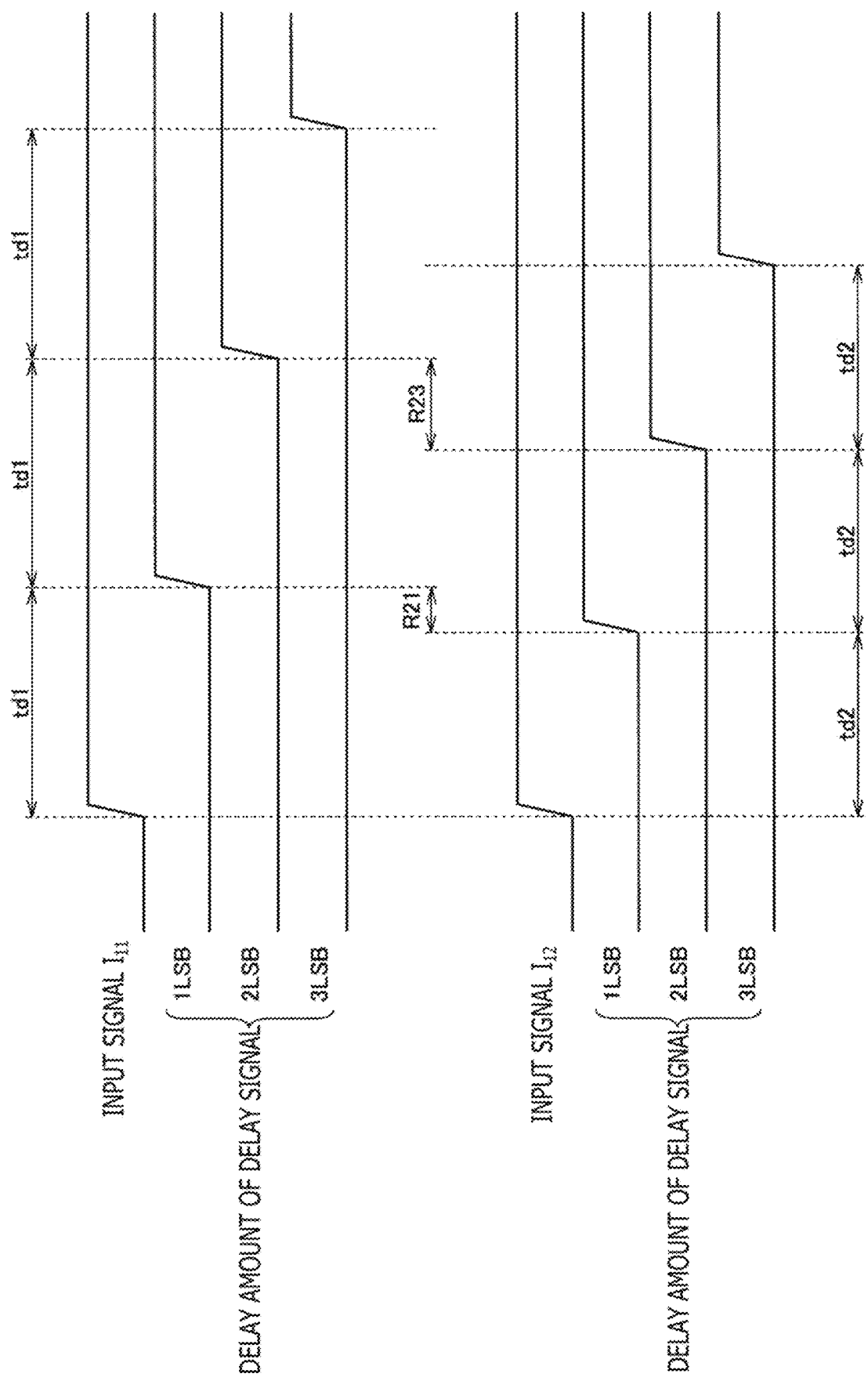
FIG. 32 is an explanatory view illustrating the first control example of the distance image sensor according to the embodiment.

Referring to FIG. 31, reference character R11 schematically denotes a delay amount of a relative delay between the input signals $I_{11}$ and $I_{12}$. Meanwhile, reference character R13 schematically denotes a delay amount of a relative delay between the output signals $O_{11}$ and $O_{12}$. As can be recognized from the comparison between the delay amounts R11 and R13, where the phase adjustment circuit 1010 performs a delay for a plurality of driving signals (for example, the input signals $I_{11}$ and $I_{12}$) inputted thereto, the relative delay amount between driving signals to be outputted from the phase adjustment circuit 1010 (namely, between the output signals $O_{11}$ and $O_{12}$). In particular, the difference between the delay amount applied to the input signal $I_{11}$ in a unit of td1 by the first variable delay circuit 1011 and the delay amount applied to the input signal $I_{12}$ in a unit of td2 by the second variable delay circuit 1013 becomes the adjustment amount of the relative delay between the input signals $I_{11}$ and $I_{12}$ (hereinafter referred to also as "phase adjustment amount").

Here, the phase adjustment amount between the input signals $I_{11}$ and $I_{12}$ in the case where a delay is performed for each of the input signals $I_{11}$ and $I_{12}$ in the example depicted in FIG. 31 is described taking a particular example with reference to FIG. 32. In the example depicted in FIG. 32, the input signals $I_{11}$ and $I_{12}$ and delay signals after a delay is performed for the input signals $I_{11}$ and $I_{12}$ (namely, the output signals $O_{11}$ and $O_{12}$) are depicted. It is to be noted that, in the example depicted in FIG. 32, as the delay signals individually corresponding to the input signals $I_{11}$ and $I_{12}$, delay signals where a delay of delay amounts 1 LSB to 3 LSB is performed by delay circuits corresponding to the input signals (namely, the input signals $I_{11}$ and $I_{12}$) are depicted.

Referring to FIG. 32, reference character R21 schematically denotes a delay amount (in other words, a phase adjustment amount) of the relative delay between a delay signal where a delay of a delay amount of 1 LSB is performed for the input signal $I_{11}$ and a delay signal where a delay of a delay amount of 1 LSB is performed for the input signal $I_{12}$. At this time, in the case where the input signals $I_{11}$ and $I_{12}$ are in a synchronized state, the phase adjustment amount R21 is represented by td1−td2.

Further, reference character R23 schematically depicts the delay amount (in other words, the phase adjustment amount) of a relative delay between the delay signal where a delay whose delay amount is 2 LSB is performed for the input signal $I_{11}$ and the delay signal where a delay whose delay amount is 2 LSB is performed for the input signal $I_{12}$. At this time, in the case where the input signals $I_{11}$ and $I_{12}$ are in a synchronized state with each other, the phase adjustment amount R23 is represented by 2*td1−2*td2.

Here, in the case where Δtd=td1−td2 and besides td2<td1, it can be recognized that the relationship of Δtd<td2<td1 is satisfied. In particular, by utilizing such a feature of the phase adjustment circuit 1010 as described above, it is possible to adjust the phase difference, for example, between the light source driving signal and the pixel driving signal (in other words, the relative delay) with a resolution finer than the resolutions td1 and td2 in adjustment of a delay performed for the driving signals. Consequently, with the distance image sensor according to the embodiment of the present disclosure, it is possible to adjust the phase difference between the light source driving signal and the pixel driving signal (namely, to synchronize the light source driving signal and the pixel driving signal with each other) with a resolution finer than the resolutions of the delay circuits that perform a delay for the driving signals.

It is to be noted that, in the present control example, the first variable delay circuit 1011 corresponds to an example of the "first delay circuit" and the delay amount of a delay performed for the driving signal (in other words, the input signal to the circuit) by the first variable delay circuit 1011 (namely, the delay amount whose delay adjustment resolution is td1) corresponds to an example of the "first delay circuit." Further, the second variable delay circuit 1013 corresponds to an example of the "second delay circuit," and the delay amount of a delay performed for the driving signal by the second variable delay circuit 1013 (namely, the delay amount whose delay adjustment resolution is td2) corresponds to an example of the "second delay amount."

The first control example of the distance image sensor according to the embodiment of the present disclosure has been described with reference to FIGS. 31 and 32.

Second Control Example

Now, a second control example of the distance image sensor according to the embodiment of the present disclosure is described. For example, FIGS. 33 and 34 are explanatory views illustrating the second control example of the distance image sensor according to the embodiment of the present disclosure.

First, an overview of delay control according to the present control example is described with reference to FIG. 33. In the present control example, one of a plurality of driving signals different from each other is delayed by a plurality of delay circuits having delay adjustment resolutions different from each other to control the relative delay between the plurality of driving signals. For example, in FIG. 33, input signals $I_{21}$ and $I_{22}$ individually correspond to driving signals before the phase difference therebetween is adjusted, and output signals $O_{21}$ and $O_{22}$ individually correspond to driving signals after the phase difference between the input signals $I_{21}$ and $I_{22}$ is adjusted. Reference character 1020 corresponds to the phase adjustment circuit 1010 in the example depicted in FIG. 31. In the present control example, the phase adjustment circuit 1020 performs a plurality of kinds of delays for one of a plurality of driving signals inputted thereto to control the phase difference between the plurality of driving signals (namely, the delay amount of the relative delay).

The phase adjustment circuit 1020 includes a first variable delay circuit 1021 and a second variable delay circuit 1023 having delay adjustment resolutions different from each other. It is to be noted that the delay adjustment resolution of the first variable delay circuit 1021 is represented by td1, and the delay adjustment resolution of the second variable delay circuit 1023 is represented by td2. On the basis of such a configuration as described above, each of the first variable delay circuit 1021 and the second variable delay circuit 1023 performs a delay for the input signal $I_{21}$ and outputs the delayed input signal $I_{21}$ as the output signal $O_{21}$. At this time, the delay amount of the delay performed for the input signal $I_{21}$ by the first variable delay circuit 1021 is controlled in a unit of td1 on the basis of a delay controlling signal $D_{21}$. Meanwhile, the delay amount of the delay performed for the input signal $I_{11}$ by the second variable delay circuit 1023 is controlled in a unit of td2 on the basis of a delay controlling signal D22. It is to be noted that one of the input signals $I_{11}$ and $I_{12}$ corresponds to the light source driving signal before the delay is performed, and the other corresponds to the pixel driving signal before the delay is performed.

Figure 33:
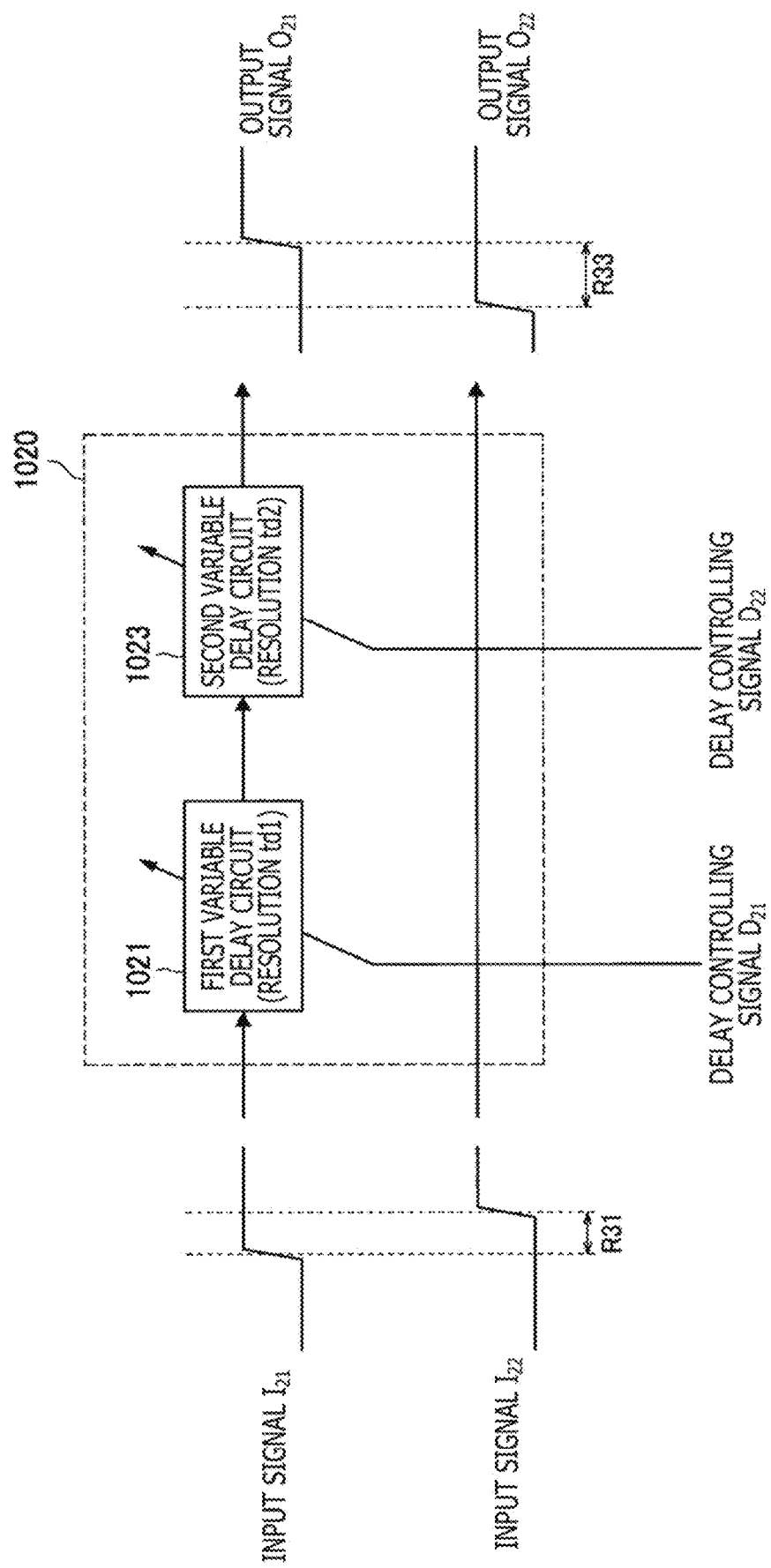
FIG. 33 is an explanatory view illustrating a second control example of the distance image sensor according to the embodiment.
Figure 34:
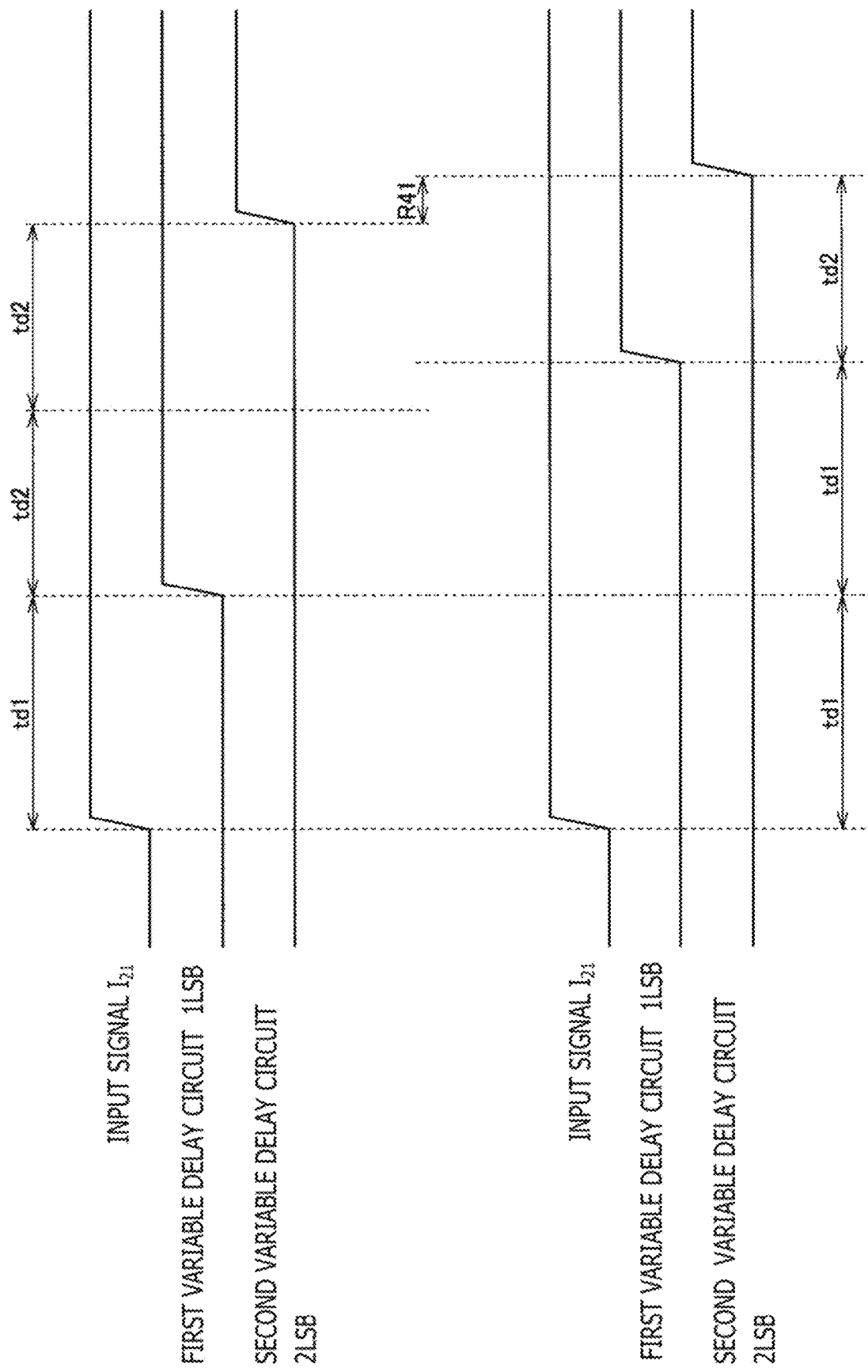
FIG. 34 is an explanatory view illustrating the second control example of the distance image sensor according to the embodiment.

Referring to FIG. 33, reference character R31 schematically depicts a delay amount of a relative delay between the input signals $I_{21}$ and $I_{22}$ (namely, the phase adjustment amount). Meanwhile, reference character R33 schematically depicts a delay amount of a relative delay between the output signals $O_{21}$ and $O_{22}$. As can be recognized by comparison between the delay amounts R31 and R33, since a delay is performed for one of a plurality of inputted driving signals (namely, the input signals $I_{21}$ and $I_{22}$) by the phase adjustment circuit 1020, the relative delay amount between the driving signals (namely, the output signals $O_{11}$ and $O_{12}$) to be outputted from the phase adjustment circuit 1020 changes. At this time, the adjustment amount (phase adjustment amount) of a relative delay between the input signals $I_{21}$ and $I_{22}$ is determined on the basis of the delay amount applied to the input signal $I_{21}$ in a unit of td1 by the first variable delay circuit 1021 and the delay amount applied to the input signal $I_{21}$ in a unit of td2 by the second variable delay circuit 1023.

Here, a phase adjustment amount between controls in the case where the delay amounts to be applied by the first variable delay circuit 1021 and the second variable delay circuit 1023 for the input signal $I_{21}$ in the example depicted in FIG. 33 are controlled is described taking a particular example with reference to FIG. 34. The example depicted on the upper side in FIG. 34 depicts an example of a case in which, for the input signal $I_{21}$, a delay whose delay amount is 1 LSB is performed by the first variable delay circuit 1021 first, and thereafter, a delay whose delay amount is 2 LSB is performed by the second variable delay circuit 1023. In contrast, the example depicted on the lower side in FIG. 34 depicts an example in which a delay whose delay amount is two LBS is performed by the first variable delay circuit 1021 first, and thereafter, a delay whose delay amount is 1 LSB is performed by the second variable delay circuit 1023.

Referring to FIG. 34, reference character R41 schematically depicts a delay amount of the relative delay between the example depicted on the upper side and the example depicted on the lower side. At this time, the delay amount R41 is represented by $(2*td1+td2)-(td1+2*td2)=td1-td2$.

Here, in the case where $\Delta td=td1-td2$ and $td2<td1$ are satisfied, it can be recognized that the relationship of $\Delta td<td2<td1$ is satisfied. In particular, by utilizing such a feature of the phase adjustment circuit 1020 as described above, it is possible to adjust the delay of one of the light source driving signal and the pixel driving signal with a resolution finer than the resolutions td1 and td2 relating to adjustment of a delay performed by each delay circuit. Consequently, with the distance image sensor according to the embodiment of the present disclosure, it is possible to adjust the phase difference between the light source driving signal and the pixel driving signal (namely, to synchronize the light source driving signal and the pixel driving signal with each other) with a resolution finer than the resolutions of the delay circuits that perform a delay for one of the light source driving signal and the pixel driving signal.

It is to be noted that, in the present control example, the first variable delay circuit 1021 corresponds to an example of the "first delay circuit" and the delay amount of a delay performed for the driving signal by the first variable delay circuit 1021 (namely, the delay amount whose delay adjustment resolution is td1) corresponds to an example of the "first delay amount." Further, the second variable delay circuit 1023 corresponds to an example of the "second delay circuit," and the delay amount of a delay performed for the driving signal by the second variable delay circuit 1023 (namely, the delay amount whose delay adjustment resolution is td2) corresponds to an example of the "second delay amount."

The second control amount of the distance image sensor according to the embodiment of the present disclosure has been described with reference to FIGS. 33 and 34.

Configuration Example of Delay Circuit

Subsequently, an example of a variable delay circuit (for example, the first variable delay circuit and the second variable delay circuit) for delaying a driving signal for the light source apparatus or the sensor chip in the distance image sensor according to the embodiment of the present disclosure is described. For example, each of FIGS. 35 to 38 is a view depicting an example of a schematic configuration of a variable delay circuit that can be applied to the distance image sensor according to the embodiment of the present disclosure.

Figure 35:
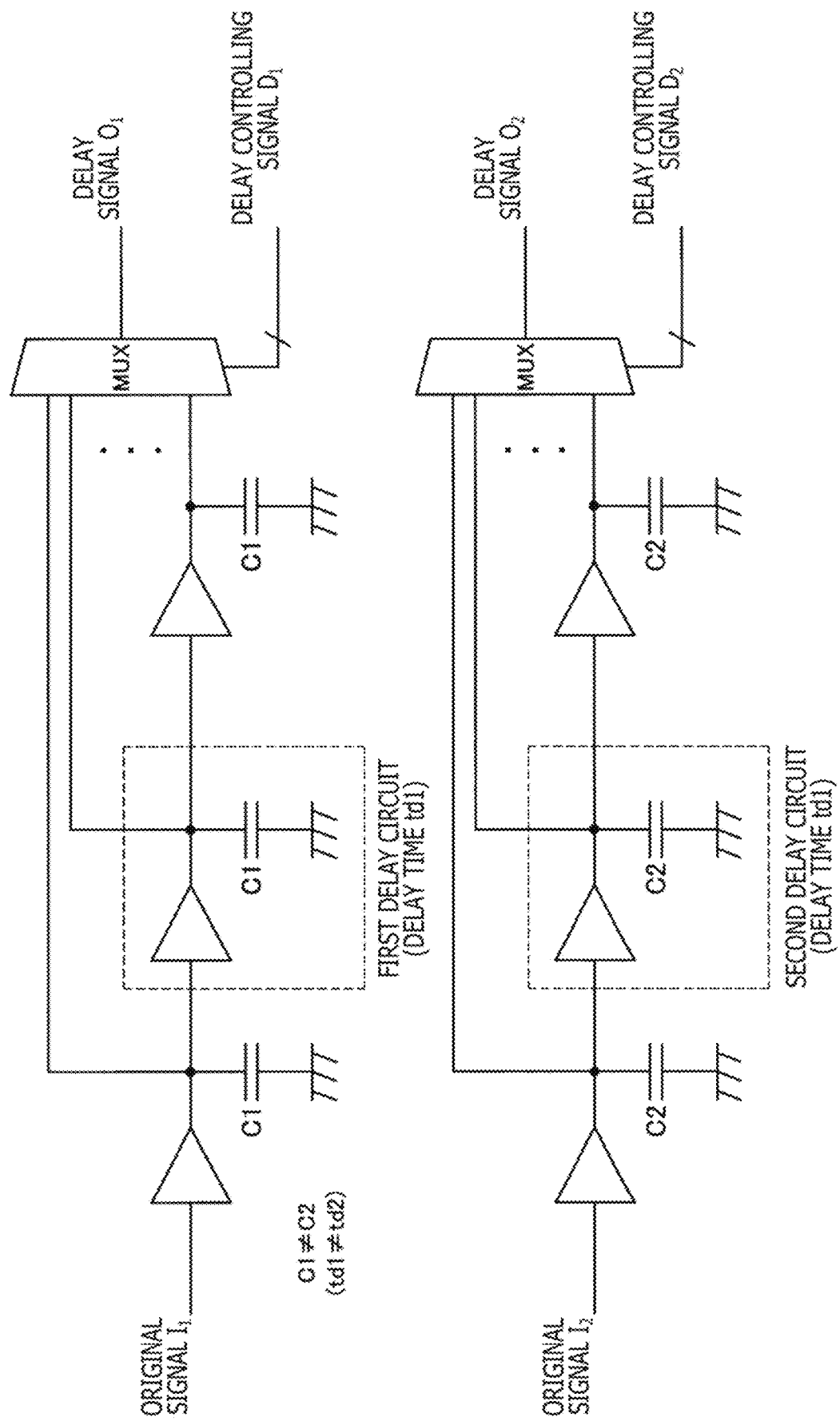
FIG. 35 is a view depicting an example of a schematic configuration of a variable delay circuit that can be applied to the distance image sensor according to the embodiment.

FIG. 35 depicts an example of a case in which a difference is provided between load capacitances of a first delay circuit and a second delay circuit to provide a delay difference between the first delay circuit and the second delay circuit. In particular, in the example depicted in FIG. 35, the delay circuits are configured such that the load capacitance C1 of the first delay circuit and the load capacitance C2 of the second delay circuit satisfy a relationship of $C1 \neq C2$. This makes it possible to configure the delay circuits such that the delay time td1 of the first delay circuit (in other words, the delay adjustment resolution td1) and the delay time td2 of the second delay circuit (in other words, the delay adjustment resolution td2) satisfy the relationship of $td1 \neq td2$.

Figure 36:
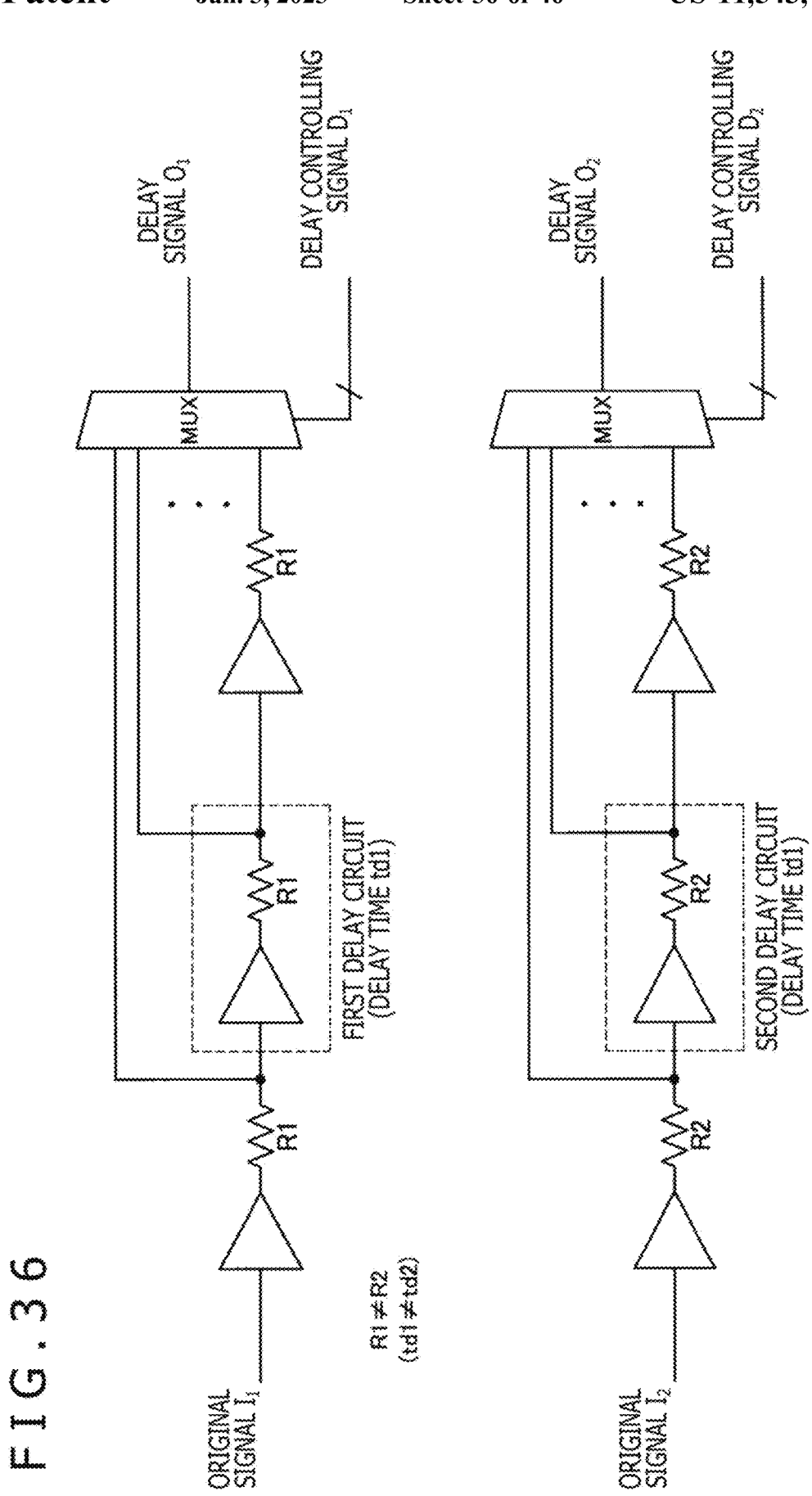
FIG. 36 is a view depicting another example of a schematic configuration of the variable delay circuit that can be applied to the distance image sensor according to the embodiment.

FIG. 36 depicts an example of a case in which a delay difference is provided between a first delay circuit and a second delay circuit by providing a difference between the load resistances of the first delay circuit and the second delay circuit. In particular, in the example depicted in FIG. 36, the delay circuits are configured such that the load resistance R1 of the first delay circuit and the load resistance R2 of the second delay circuit satisfy a relationship of R1≠R2. This makes it possible to configure the delay circuits such that the delay time td1 of the first delay circuit (in other words, the delay adjustment resolution td1) and the delay time td2 of the second delay circuit (in other words, the delay adjustment resolution td2) satisfy a relationship of td1≠td2.

Figure 37:
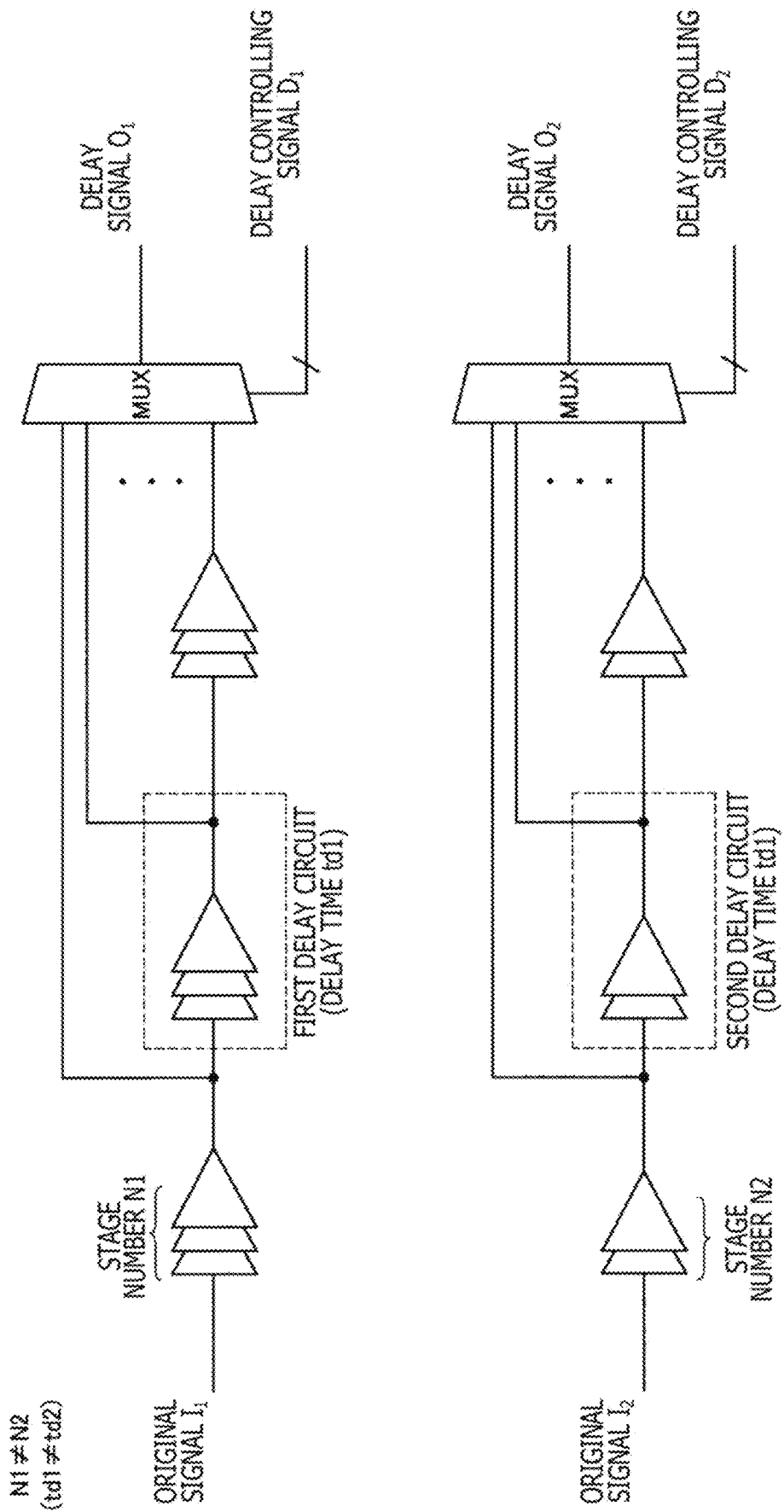
FIG. 37 is a view depicting a further example of a schematic configuration of the variable delay circuit that can be applied to the distance image sensor according to the embodiment.

FIG. 37 depicts an example of a case in which a delay difference is provided between a first delay circuit and a second delay circuit by providing a difference between stage numbers of delay elements of the first delay circuit and the second delay circuit. In particular, in the example depicted in FIG. 36, the delay circuits are configured such that the stage number N1 of the delay elements configuring the first delay circuit and the stage number N2 of the delay elements configuring the second delay circuit satisfy a relationship of N1≠N2. This makes it possible to configure the delay circuits such that the delay time td1 of the first delay circuit (in other words, the delay adjustment resolution td1) and the delay time td2 of the second delay circuit (in other words, the delay adjustment resolution td2) satisfy a relationship of td1≠td2.

Figure 38:
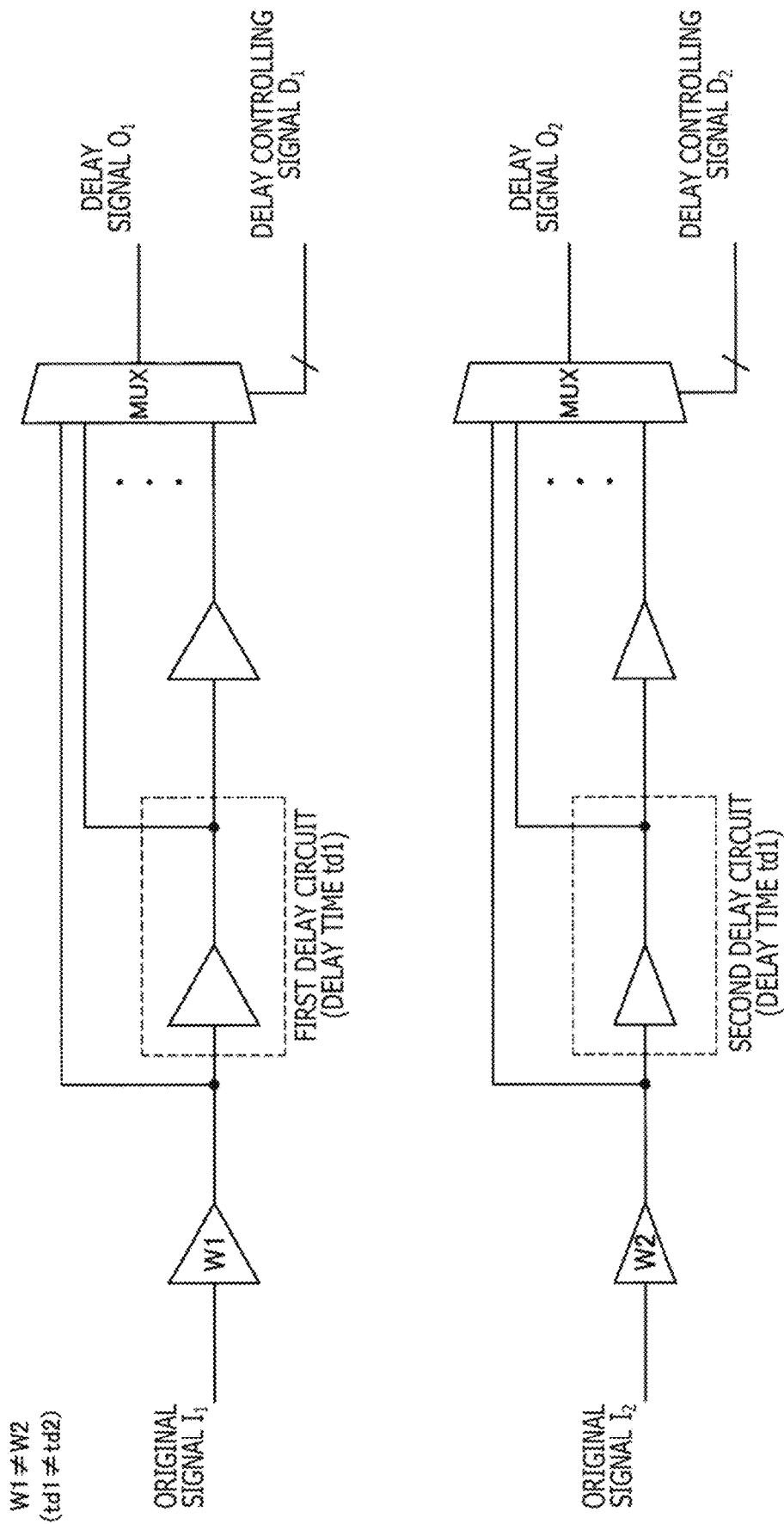
FIG. 38 is a view depicting a still further example of a schematic configuration of the variable delay circuit that can be applied to the distance image sensor according to the embodiment.

FIG. 38 depicts an example of a case in which a delay difference is provided between a first delay circuit and a second delay circuit by providing a difference between the sizes of the delay elements (for example, transistors) of the first delay circuit and the second delay circuit. In particular, in the example depicted in FIG. 37, the delay circuits are configured such that the size W1 of the delay element configuring the first delay circuit and the size W2 of the delay element configuring the second delay circuit satisfy a relationship of W1≠W2. This makes it possible to configure the delay circuits such that the delay time td1 of the first delay circuit (in other words, the delay adjustment resolution td1) and the delay time td2 of the second delay circuit (in other words, the delay adjustment resolution td2) satisfy a relationship of td1≠td2.

It is to be noted that the examples described with reference to FIGS. 35 to 38 are examples to the last and do not necessarily restrict the configuration of a delay circuit (for example, the first delay circuit and the second delay circuit) applied to a distance image sensor according to the embodiment of the present disclosure. In particular, if it is possible to provide a delay difference between the first delay circuit and the second delay circuit (namely, to provide a difference in delay adjustment resolution), then the configuration of each of the first delay circuit and the second delay circuit is not restricted specifically. As a more particular example, a plurality of ones of the examples depicted in FIGS. 35 to 38 may be used in combination. Further, a delay difference may be provided between the first delay circuit and the second delay circuit on the basis of an idea different from those of the examples depicted in FIGS. 35 to 38.

First Configuration Example of Distance Image Sensor

Figure 39:
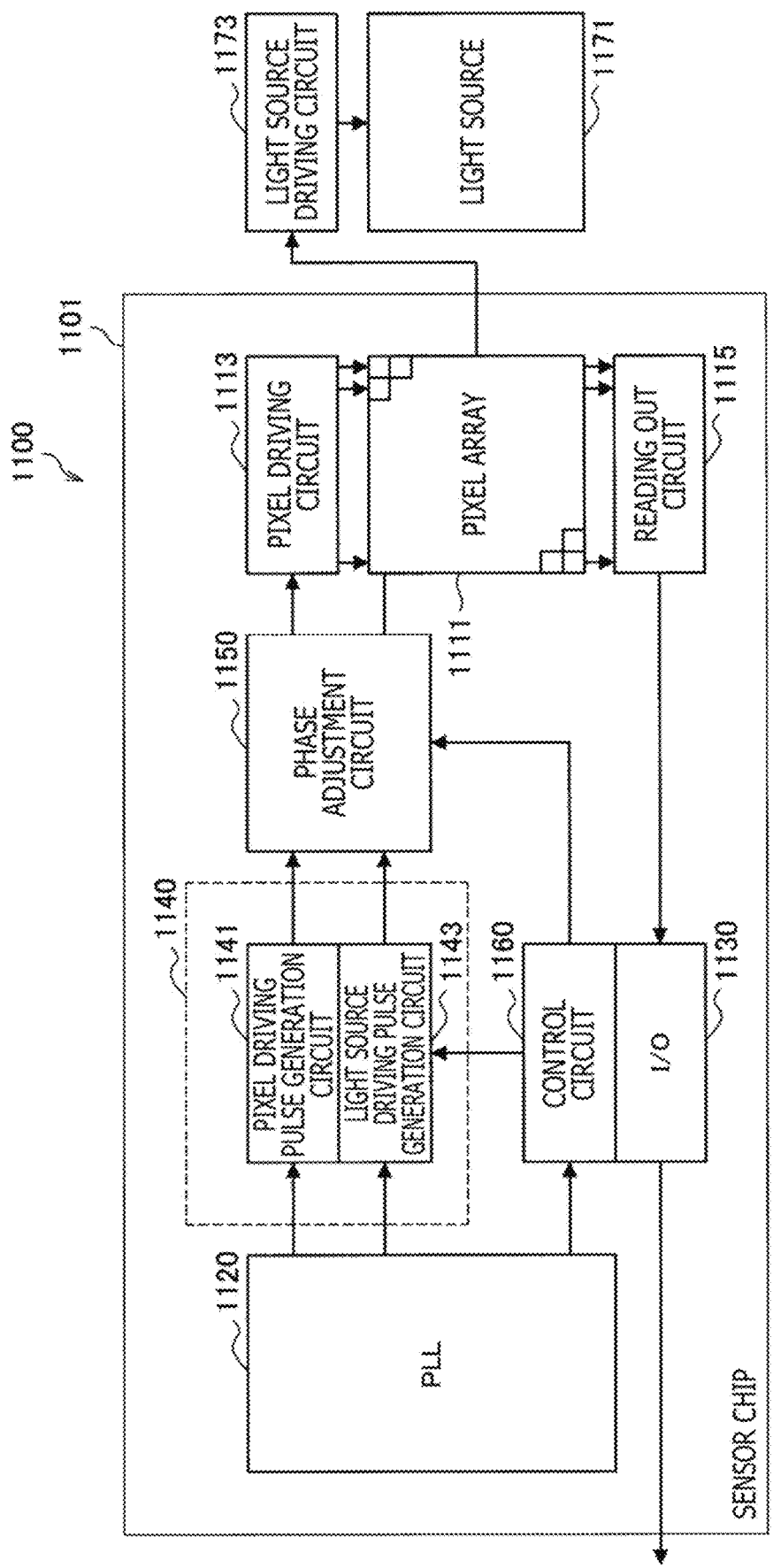
FIG. 39 is a functional block diagram depicting a first configuration example of the distance image sensor according to the embodiment.

Now, as a first configuration example of the distance image sensor according to the embodiment of the present disclosure, an example of a functional configuration of the distance image sensor is described. For example, FIG. 39 is a functional block diagram depicting a first configuration example of the distance image sensor according to the embodiment of the present disclosure and especially depicts an example of a configuration of a sensor chip applied to the distance image sensor. It is to be noted that, in the following description, for the convenience of description, the distance image sensor according to the first configuration example is sometimes referred to as "distance image sensor 1100" in order to distinguish the same from the other configuration examples.

Referring to FIG. 39, reference character 1101 denotes a sensor chip applied to the distance image sensor 1100 and corresponds, for example, to the sensor chip 203 in the distance image sensor 201 described hereinabove with reference to FIG. 27. Further, in FIG. 39, a light source 1171 and a light source driving circuit 1173 correspond, for example, to the light source and the light source driving circuit of the light source apparatus 211 described hereinabove with reference to FIG. 27.

The sensor chip 1101 includes a pixel array 1111, a pixel driving circuit 1113, a reading out circuit 1115, a PLL (Phase-Locked Loop) 1120, an inputting and outputting (I/O) section 1130, a driving signal generation circuit 1140, a phase adjustment circuit 1150 and a control circuit 1160. Further, the driving signal generation circuit 1140 includes a pixel driving pulse generation circuit 1141 and a light source driving pulse generation circuit 1143.

The pixel array 1111 corresponds to the pixel array section 12 in the sensor chip 11 described hereinabove. Meanwhile, the pixel driving circuit 1113 corresponds to a circuit for driving the pixels of the pixel array 1111 and corresponds, for example, to the global controlling circuit 13 or the rolling controlling circuit 14 in the sensor chip 11 described hereinabove. Further, the reading out circuit 1115 corresponds to a circuit for reading out a sensor signal from each pixel of the pixel array 1111 and corresponds, for example, to the column ADC 15 and so forth in the sensor chip 11 described hereinabove. Therefore, detailed description of the pixel array 1111, pixel driving circuit 1113 and reading out circuit 1115 is omitted.

The PLL 1120 generates a reference signal (clock pulse) that makes a reference for controlling operation timings of the components of the sensor chip 1101. In particular, the components in the sensor chip 1101 operate in synchronism with the clock pulse generated by the PLL 1120. The PLL 1120 supplies the clock pulse generated thereby to the driving signal generation circuit 1140 and the control circuit 1160.

The pixel driving pulse generation circuit 1141 generates a pulse signal for controlling the driving timing of the pixel driving circuit 1113 (namely, a pixel driving signal) on the basis of the clock pulse supplied thereto from the PLL 1120. The pixel driving pulse generation circuit 1141 outputs the generated pixel driving signal to the phase adjustment circuit 1150 positioned in the succeeding stage. Further, the light source driving pulse generation circuit 1143 generates a pulse signal for controlling the driving timing of the light source driving circuit 1173 (namely, a light source driving signal) on the basis of the clock pulse supplied thereto from the PLL 1120. The light source driving pulse generation circuit 1143 outputs the generated light source driving signal to the phase adjustment circuit 1150 positioned in the succeeding stage. It is to be noted that the timings at which the pixel driving pulse generation circuit 1141 and the light source driving pulse generation circuit 1143 are to operate are controlled by the control circuit 1160.

The phase adjustment circuit 1150 delays at least one of the pixel driving signal outputted from the pixel driving pulse generation circuit 1141 or the light source driving signal outputted from the light source driving pulse generation circuit 1143 to adjust the phase difference between the pixel driving signal and the light source driving signal. Then, the phase adjustment circuit 1150 supplies the light source driving signal after the phase adjustment to the light source driving circuit 1173. Consequently, the timing at which the light source driving circuit 1173 is to drive the light source 1171, namely, the timing at which the light source 1171 is to project pulse light, is controlled on the basis of the light source driving signal supplied from the phase adjustment circuit 1150. Further, the phase adjustment circuit 1150 supplies the pixel driving signal after the phase adjustment to the pixel driving circuit 1113. Consequently, the timing at which the pixel driving circuit 1113 is to drive each pixel of the pixel array 1111, namely, the timing at which each pixel of the pixel array 1111 is to detect the pulse light reflected by an imaging object, is controlled on the basis of the pixel driving signal supplied from the phase adjustment circuit 1150. From the foregoing, it is possible to synchronize operation of the light source 1171 and operation of the sensor chip 1101 (especially the pixel array 1111 and the reading out circuit 1115) with each other.

It is to be noted that the control relating to the adjustment of the phase difference between the pixel driving signal and the light source driving signal by the phase adjustment circuit 1150 is, for example, described hereinabove as the first control example and the second control example. In other words, the phase adjustment circuit 1150 can adjust the phase difference between the pixel driving signal and the light source driving signal with a resolution finer than the delay adjustment resolutions of the delay circuits that delay the pixel driving signal and the light source driving signal.

Consequently, for example, operation of the light source driving circuit 1173 and operation of the pixel driving circuit 1113 are controlled so as to be synchronized with each other. In particular, operation of the light source 1171 for projecting pulse light and operation of each of the pixels (sensor elements) of the pixel array 1111 for detecting the pulse light reflected by an imaging object are controlled so as to be synchronized with each other. It is to be noted that the timing at which the phase adjustment circuit 1150 is to operate is controlled by the control circuit 1160.

The control circuit 1160 controls operation of the components of the sensor chip 1101. For example, the control circuit 1160 controls operation timings of the driving signal generation circuit 1140 and the phase adjustment circuit 1150 on the basis of the clock pulse outputted from the PLL 1120.

Further, the control circuit 1160 may measure the distance to an imaging object on the basis of a result of reading out of sensor signals from the pixels of the pixel array 1111 (namely, of charge amounts accumulated in the pixels) by the reading out circuit 1115. In this case, the control circuit 1160 may output information according to a result of the measurement of the distance to the outside of the sensor chip 1101 through the inputting and outputting section 1130.

The inputting and outputting section 1130 is an input/output interface for sensor chip 1101 performing transmission and reception of information to and from an outside element. For example, information according to a reading out result of the sensor signal from each pixel of the pixel array 1111 by the reading out circuit 1115 may be outputted to the outside of the sensor chip 1101 through the inputting and outputting section 1130. Further, information according to a result of various arithmetic operations by the control circuit 1160 may be outputted to the outside of the sensor chip 1101 through the inputting and outputting section 1130. For example, information according to a result of measurement of the distance to an imaging object by the control circuit 1160 may be outputted to the outside of the sensor chip 1101 through the inputting and outputting section 1130 as described hereinabove.

It is to be noted that the pixel array 1111 and the reading out circuit 1115 correspond to an example of the "light reception section" in measurement of the distance to an image object, and the light source 1171 corresponds to an example of the "light source" in measurement of the distance to an imaging object. Further, the phase adjustment circuit 1150 corresponds to an example of the "control section" that controls the relative time difference (in other words, the phase difference) between the first timing at which the light reception section (each pixel of the pixel array 1111) is to detect the light reception amount and the second timing at which the light source is to project light. Further, the configuration for measuring the distance to an imaging object on the basis of a sensor signal read out from each pixel of the pixel array 1111 by the reading out circuit 1115 corresponds to an example of the "measurement section," and, for example, the control circuit 1160 can correspond to this.

Further, the functional configuration described above is an example to the last, and if operation of the components is implemented, then the configuration of the distance image sensor 1100 is not necessarily restricted only to the example depicted in FIG. 39. As a particular example, the sensor chip 1101 and the components corresponding to the light source (namely, the light source 1171 and the light source driving circuit 1173) may be configured integrally with each other.

Further, the sensor chip 1101 may have the stacked structure described hereinabove. In this case, part of the components of the sensor chip 1101 and the other components different from the part of the components may be provided on boards different from each other. As a more particular example, among the components of the sensor chip 1101, the pixel array 1111 and the components other than the pixel array 1111 may be provided on boards different from each other.

Further, part of the components of the sensor chip 1101 may be provided outside of the sensor chip 1101. As a particular example, the PLL 1120, driving signal generation circuit 1140, phase adjustment circuit 1150 and control circuit 1160 may be provided outside the sensor chip 1101 (for example, in a different chip, electronic equipment, apparatus or the like provided for the control).

Further, of the phase adjustment circuit 1150, part that applies a delay to the pixel driving signal and part that applies a delay to the light source driving signal may be provided on chips different from each other, in electronic equipment different from each other or in apparatus different from each other. As a particular example, part that applies a delay to the light source driving signal may be provided outside the sensor chip 1101 (for example, on the light source apparatus side). It is to be noted that, in this case, the function of the phase adjustment circuit 1150 can be implemented by interlinking of the part that applies a delay to the pixel driving signal and the part that applies a delay to the light source driving signal. As a particular example, by controlling the delay to be applied to the pixel driving signal in response to the delay applied to the light source driving signal, it is possible to control the phase difference between the pixel driving signal and the light source driving signal with a resolution finer than the delay adjustment resolutions for the delays.

As the first configuration example of the distance image sensor according to the embodiment of the present disclosure, an example of the functional configuration of the distance image sensor has been described with reference to FIG. 39.

Second Configuration Example of Distance Image Sensor

Figure 40:
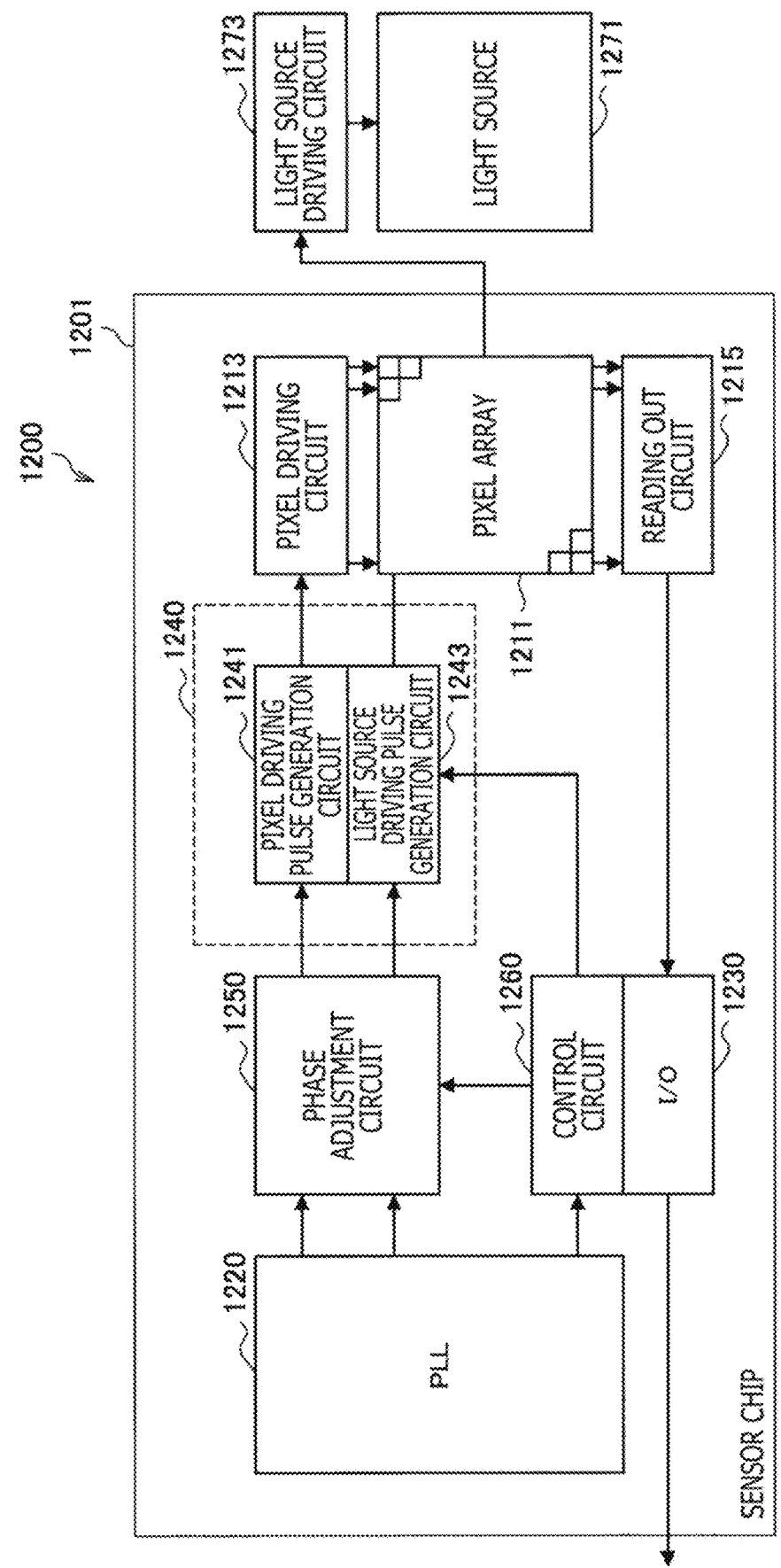
FIG. 40 is a functional block diagram depicting a second configuration example of the distance image sensor according to the embodiment.

Now, as a second configuration example of the distance image sensor according to the embodiment of the present disclosure, another example of the functional configuration of the distance image sensor is described. For example, FIG. 40 is a functional block diagram depicting the second configuration example of the distance image sensor according to the embodiment of the present disclosure and especially depicts an example of a configuration of a sensor chip applied to the distance image sensor. It is to be noted that, in the following description, for the convenience of description, the distance image sensor according to the second configuration example is sometimes referred to as "distance image sensor 1200" in order to distinguish the same from any other configuration example.

Referring to FIG. 40, reference numeral 1201 denotes a sensor chip applied to the distance image sensor 1200 and corresponds, for example, to the sensor chip 203 in the distance image sensor 201 described hereinabove with reference to FIG. 27. Further, in FIG. 40, a light source 1271 and a light source driving circuit 1273 correspond, for example, to the light source and the light source driving circuit of the light source apparatus 211 described hereinabove with reference to FIG. 27.

The sensor chip 1201 includes a pixel array 1211, a pixel driving circuit 1213, a reading out circuit 1215, a PLL 1220, an inputting and outputting circuit (I/O) 1230, a driving signal generation circuit 1240, a phase adjustment circuit 1250 and a control circuit 1260. Further, the driving signal generation circuit 1240 includes a pixel driving pulse generation circuit 1241 and a light source driving pulse generation circuit 1243. It is to be noted that the pixel array 1211, pixel driving circuit 1213, reading out circuit 1215, PLL 1220 and inputting and outputting circuit 1230 are substantially similar to the pixel array 1111, pixel driving circuit 1113, reading out circuit 1115, PLL 1120 and inputting and outputting section 1130 in the distance image sensor 1100 described hereinabove with reference to FIG. 39. Therefore, in the following description, description is given focusing on part of the functional configuration of the distance image sensor 1200 substantially different from that of the distance image sensor 1100 described hereinabove while detailed description of substantially similar portions to those of the distance image sensor 1200 is omitted.

The PLL 1220 generates reference signals (clock pulses) that make a reference for controlling operation timings of the components of the sensor chip 1201 and outputs the clock pulses to the phase adjustment circuit 1250 and the control circuit 1260.

The phase adjustment circuit 1250 supplies the clock pulses supplied thereto from the PLL 1220 individually to the pixel driving pulse generation circuit 1241 and the light source driving pulse generation circuit 1243 positioned in the succeeding stage. It is to be noted that, in the following description, for the convenience of description, the clock pulse supplied to the pixel driving pulse generation circuit 1241 is referred to also as "first clock pulse," and the clock pulse supplied to the light source driving pulse generation circuit 1243 is referred to also as "second clock pulse." At this time, the phase adjustment circuit 1250 adjusts the phase difference between the first clock pulse and the second clock pulse by delaying at least one of the first clock pulse or the second clock pulse. In particular, the first clock pulse and the second clock pulse having the adjusted phases are supplied to the light source driving pulse generation circuit 1243 and the pixel driving pulse generation circuit 1241, respectively.

It is to be noted that, in the control for adjustment of the phase difference between the first clock pulse and the second clock pulse by the phase adjustment circuit 1250 is such as described above, for example, as the first control example and the second control example. In particular, the phase adjustment circuit 1250 can adjust the phase difference between the first clock pulse and the second clock pulse with a resolution finer than the delay adjustment resolution of the delay circuits that delay the clock pulses supplied from the PLL 1220.

The pixel driving pulse generation circuit 1241 generates a pulse signal for controlling the driving timing of the pixel driving circuit 1213 (namely, a pixel driving signal) on the basis of the first clock pulse supplied from the phase adjustment circuit 1250. The pixel driving pulse generation circuit 1141 outputs the generated pixel driving signal to the pixel driving circuit 1213. Further, the light source driving pulse generation circuit 1243 generates a pulse signal for controlling the driving timing of the light source driving circuit 1273 (namely, a light source driving signal) on the basis of the second clock pulse supplied from the phase adjustment circuit 1250. The light source driving pulse generation circuit 1243 outputs the generated light source driving signal to the light source driving circuit 1273.

It is to be noted that, as described hereinabove, the phase difference between the first clock pulse and the second clock pulse is adjusted by the phase adjustment circuit 1250. Therefore, the phase difference between the light source driving signal generated on the basis of the first clock pulse and the pixel driving signal generated on the basis of the second clock pulse is adjusted together with the phase difference between the first clock pulse and the second clock pulse. In particular, also it is possible to synchronize the timing at which the light source 1171 is to project pulse light and the timing at which each of the pixels of the pixel array 1111 detects the pulse light reflected by an imaging object with each other in response to the phase difference between the light source driving signal and the pixel driving signal (in other words, the phase difference between the first clock pulse and the second clock pulse).

The operation timings of the phase adjustment circuit 1250 and the driving signal generation circuit 1240 are controlled on the basis of the clock pulses outputted from the PLL 1220 by the control circuit 1260. Further, the control circuit 1260 may measure the distance to an imaging object on the basis of a result of reading out of sensor signals from the pixels of the pixel array 1211 (namely, of the charging amounts accumulated in the pixels) by the reading out circuit 1215. In this case, the control circuit 1260 may output information according to a result of the measurement of the distance to the outside of the sensor chip 1101 through the inputting and outputting circuit 1230.

Further, similarly as in the example described hereinabove with reference to FIG. 39, the functional configuration described above is an example to the last, and if operation of the components is implemented, then the functional configuration of the distance image sensor 1200 is not necessarily restricted only to the example depicted in FIG. 40.

As the second configuration of the distance image sensor according to the embodiment of the present disclosure, another example of the functional configuration of the distance image sensor has been described with reference to FIG. 40.

Third Configuration Example of Distance Image Sensor

Figure 41:
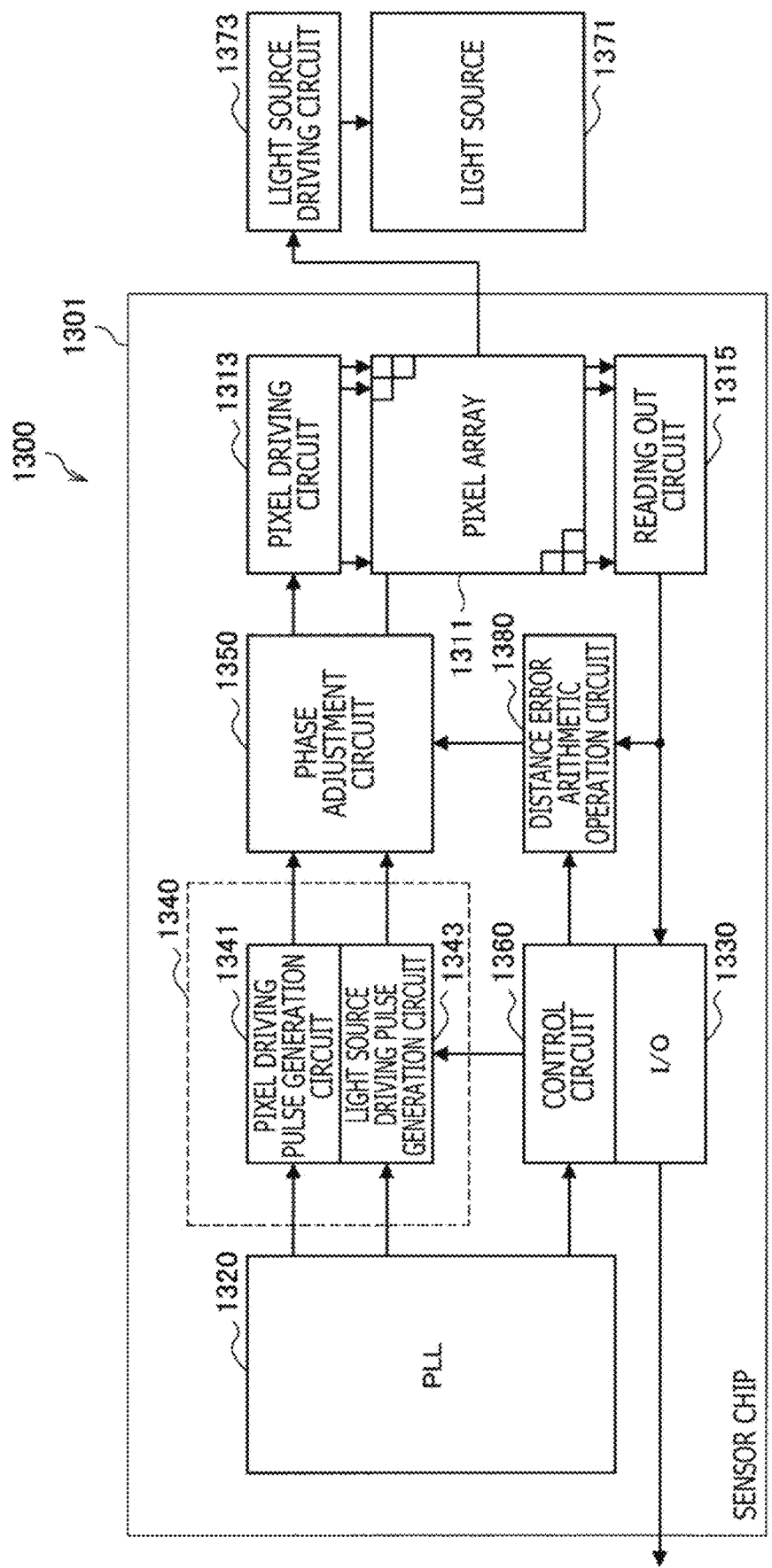
FIG. 41 is a functional block diagram depicting a third configuration example of the distance image sensor according to the embodiment.

Now, as a third configuration example of the distance image sensor according to the embodiment of the present disclosure, a further example of the functional configuration of the distance image sensor is described. For example, FIG. 41 is a functional block diagram depicting the third configuration example of the distance image sensor according to the embodiment of the present disclosure and especially depicts an example of a configuration of a sensor chip applied to the distance image sensor. It is to be noted that, in the following description, for the convenience of description, the distance image sensor according to the third configuration example is sometimes referred to as "distance image sensor 1300" in order to distinguish the same from any other configuration example.

Referring to FIG. 41, reference numeral 1301 denotes a sensor chip applied to the distance image sensor 1300 and corresponds, for example, to the sensor chip 203 in the distance image sensor 201 described hereinabove with reference to FIG. 27. Further, in FIG. 41, a light source 1371 and a light source driving circuit 1373 correspond, for example, to the light source and the light source driving circuit of the light source apparatus 211 described with reference to FIG. 27.

The sensor chip 1301 includes a pixel array 1311, a pixel driving circuit 1313, a reading out circuit 1315, a PLL 1320, an inputting and outputting section (I/O) 1330, a driving signal generation circuit 1340, a phase adjustment circuit 1350, a control circuit 1360 and a distance error arithmetic operation circuit 1380. It is to be noted that the pixel array 1311, pixel driving circuit 1313 and reading out circuit 1315 and the PLL 1320, inputting and outputting section 1330 and driving signal generation circuit 1340 are substantially similar to the pixel array 1111, pixel driving circuit 1113, reading out circuit 1115, PLL 1120, inputting and outputting section 1130 and driving signal generation circuit 1140 in the distance image sensor 1100 described hereinabove with reference to FIG. 39. Therefore, in the following description, in regard to the functional configuration of the distance image sensor 1300, description is given focusing on part different from that of the distance image sensor 1100 described hereinabove while detailed description of part substantially similar to that of the distance image sensor 1100 is omitted.

The distance error arithmetic operation circuit 1380 calculates an error in measurement of the distance to an imaging object on the basis of a reading out result of the sensor signals from the pixels of the pixel array 1211 (namely, of charge amounts accumulated in the pixels) by the reading out circuit 1215 and feeds back a calculation result of the error to the phase adjustment circuit 1350. As a particular example, the distance error arithmetic operation circuit 1380 acquires an ideal value of a reading out result of the sensor signal relating to the measurement of a distance from the control circuit 1360 and calculates an error between the reading out result of the sensor signal outputted from the reading out circuit 1215 and the acquired ideal value. Then, the distance error arithmetic operation circuit 1380 outputs the calculated error to the phase adjustment circuit 1350. In this case, the phase adjustment circuit 1350 controls the phase difference between the light source driving signal and the pixel driving signal on the basis of the error fed back from the distance error arithmetic operation circuit 1380 such that the error decreases (namely, the reading out result of the sensor signal approaches the ideal value). At this time, the phase adjustment circuit 1350 can adjust the phase difference between the light source driving signal and the pixel driving signal with a resolution finer than the delay adjustment resolutions of the delay circuits that delay the light source driving signal and the pixel driving signal.

It is to be noted that the method of the control circuit 1360 for deriving the ideal value is not specifically limited. For example, in the case where an imaging target the distance to which is known is imaged as in a mode in which a measurement result of the distance is corrected or a like mode, information according to the known distance may be outputted as the ideal value to the distance error arithmetic operation circuit 1380. Further, as another example, the control circuit 1360 may calculate the ideal value by utilizing a detection result by some other detection device like a GPS device. Naturally, the foregoing is an example to the last, and if the ideal value can be derived or determined, then the method therefor is not specifically limited. Further, the distance error arithmetic operation circuit 1380 corresponds to an example of the "error arithmetical operation section."

It is to be noted that the foregoing description is directed to an example of a case in which the distance error arithmetic operation circuit 1380 is added to the distance image sensor 1100 depicted in FIG. 39 such that an error relating to measurement of the distance to an imaging object is fed back to the phase adjustment circuit 1350 in response to a reading out result of a sensor signal from each pixel. Meanwhile, also in regard to the distance image sensor 1200 depicted in FIG. 40, by adding the distance error arithmetic operation circuit 1380, an error in measurement of the distance to an imaging object can be similarly fed back to the phase adjustment circuit 1250 in response to a reading out result of a sensor signal from each pixel.

Further, similarly to the example described hereinabove with reference to FIG. 39, the functional configuration described above is an example to the last, and if operation of the components is implemented, then the configuration of the distance image sensor 1300 is not necessarily limited only to the example depicted in FIG. 41.

As the third configuration example of the distance image sensor according to the embodiment of the present disclosure, a further example of the functional configuration of the distance image sensor has been described with reference to FIG. 41.

<<4. Usage Example and Application Example>>

Subsequently, usage examples and application examples of the technology according to the present disclosure are described.

<Usage Example of Image Sensor>

Figure 42:
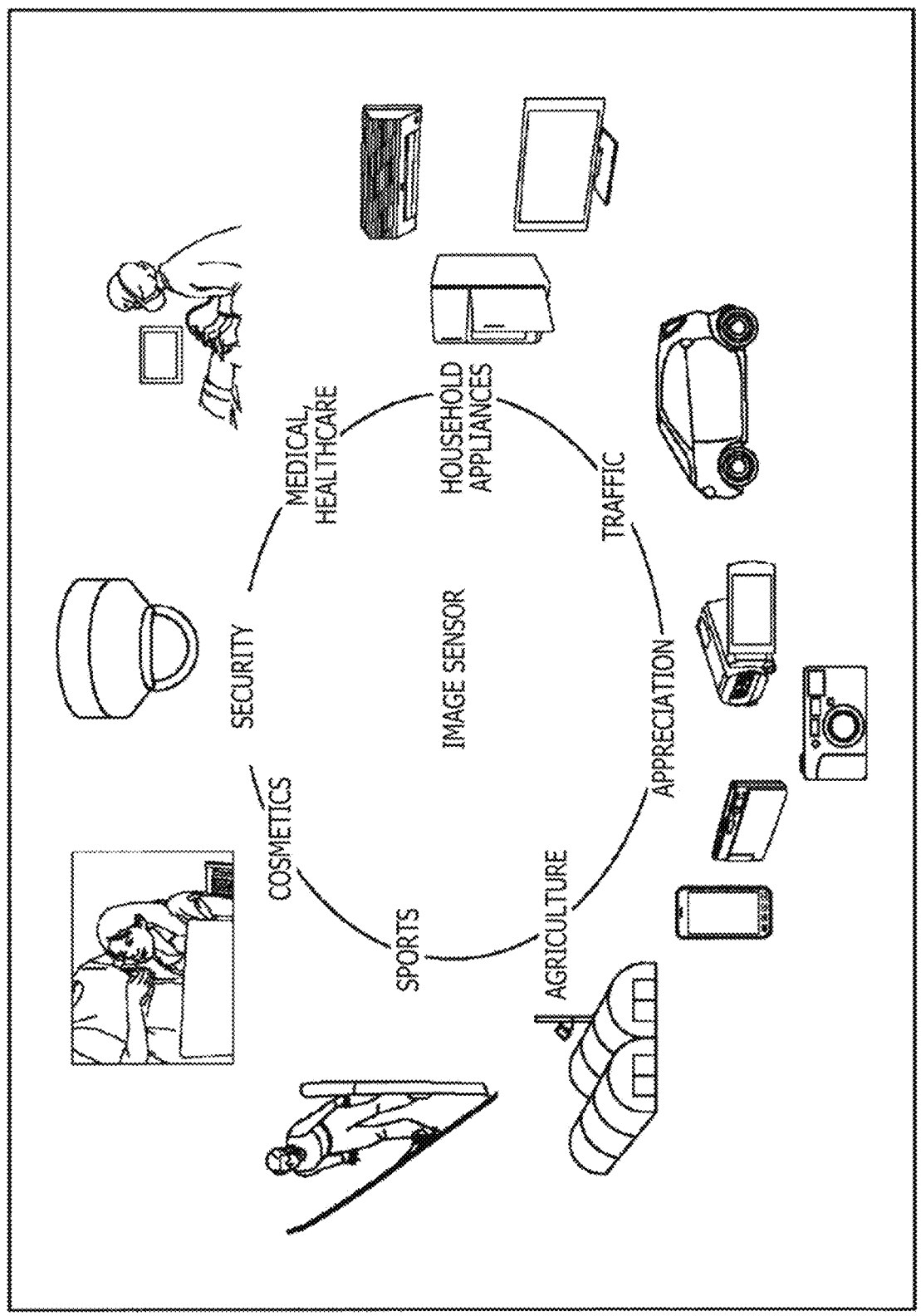
FIG. 42 is a view depicting an example of usage in which an image sensor is used.

FIG. 42 is a view depicting usage examples in which the image sensor (imaging element) described hereinabove is used.

The image sensor described above can be used in various cases in which visible light, infrared light, ultraviolet light, an X-ray or the like is sensed, for example, as described below.

Apparatus that captures an image to be used for appreciation such as a digital camera, a portable apparatus with a camera function and so forth Apparatus used for traffic such as an automotive sensor for imaging the front or back, surroundings, inside or the like of an automobile for safe driving such as automatic stopping, recognition of the state of the driver and so forth, a security camera for monitoring a traveling vehicle or the road, a distance measurement sensor for performing distance measurement between automobiles and so forth Apparatus for use with household appliances such as a TV set, a refrigerator or an air conditioner for imaging a gesture of a user and performing apparatus operation in accordance with the gesture Apparatus for medical use or healthcare use such as an endoscope, an apparatus for performing angiography by reception of infrared light or the like Apparatus for use for security such as a surveillance camera for security applications, a camera for a person authentication application or the like Apparatus for cosmetic use such as a skin measuring instrument for imaging the skin, a microscope for imaging the scalp or the like Apparatus for use for sports such as an action camera, a wearable camera or the like for sports applications Apparatus for agricultural applications such as a camera for monitoring the state of a field or crops Further, the distance image sensor according to the embodiment of the present disclosure can be used for various apparatus that provide various functions utilizing, for example, a distance measurement technology such as the ToF. As an example of such apparatus, an apparatus configured for movement by being held by a user, for example, a smartphone, a wearable device (for example, a wristwatch type or glasses-type device), an HMD (Head Mounted Display) or the like can be listed. Further, as another example of the apparatus described above, a moving body such as a vehicle and an apparatus configured such that it itself is movable like a drone, a robot (for example, an industrial robot, an autonomously actable robot or the like), FA (Factor Automation) equipment, agricultural equipment or the like can be listed. Naturally, the foregoing is an example to the last, and the apparatus to which the distance image sensor is applied is not specifically restricted if it can utilize a distance measurement result by the distance image sensor according to the embodiment of the present disclosure.

<Application Example to Endoscopic Surgery System>

The technology according to the present disclosure (present technology) can be applied to various products. For example, the technology according to the present disclosure may be applied to an endoscopic surgery system.

Figure 43:
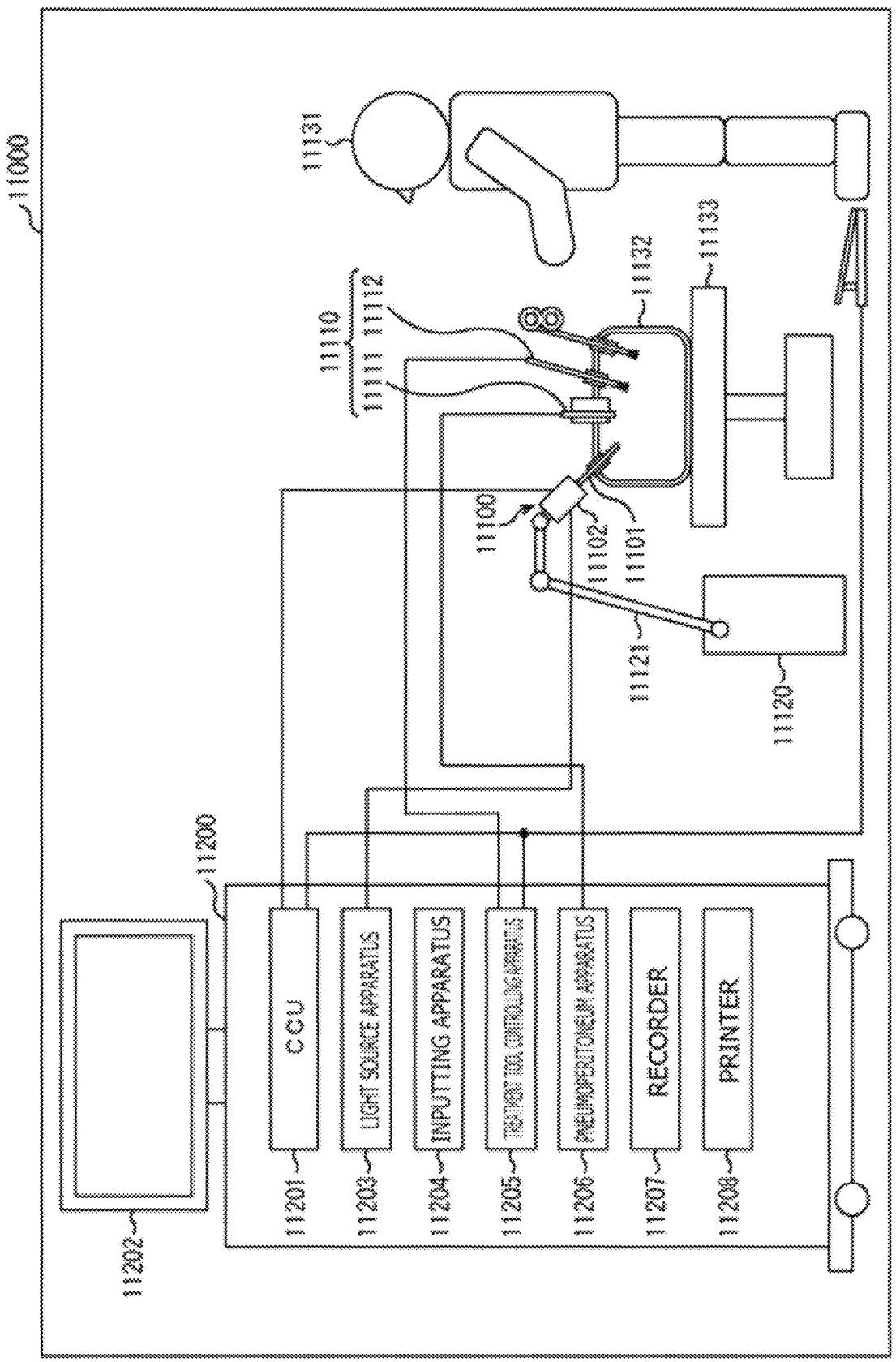
FIG. 43 is a view depicting an example of a schematic configuration of an endoscopic surgery system.

FIG. 43 is a view depicting an example of a schematic configuration of an endoscopic surgery system to which the technology according to an embodiment of the present disclosure (present technology) can be applied.

In FIG. 43, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a LED (Light Emitting Diode) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 44:
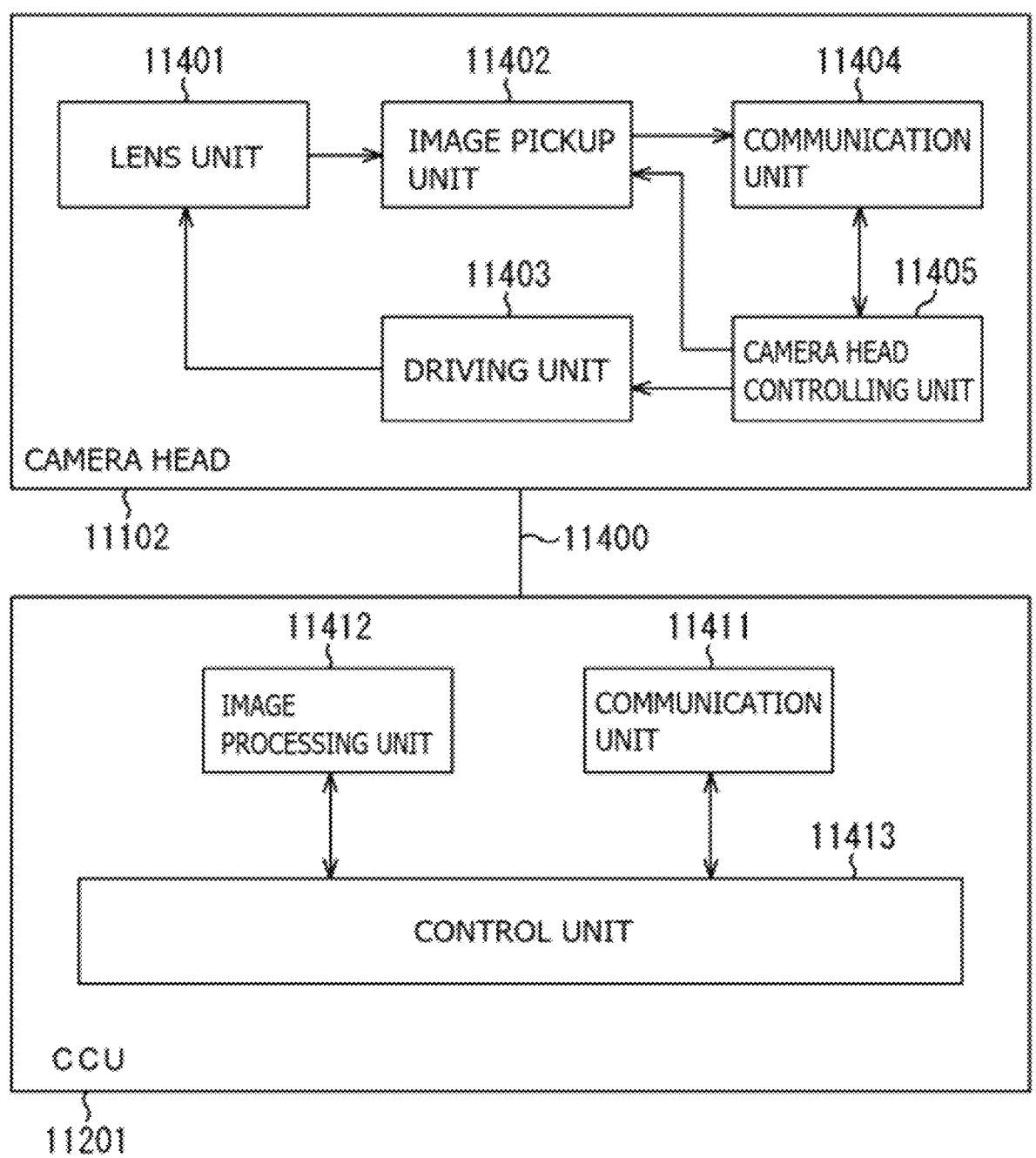
FIG. 44 is a block diagram depicting an example of a functional configuration of a camera head and a CCU.

FIG. 44 is a block diagram depicting an example of a functional configuration of the camera head 11102 and the CCU 11201 depicted in FIG. 43.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

An image pickup unit 11402 includes the image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described. The technology according to the present disclosure can be applied, from within the configuration described above, for example, to the endoscope 11100, (the image pickup unit 11402 of) the camera head 11102, (the image processing unit 11412 of) the CCU 11201 and so forth.

It is to be noted here that, while an endoscopic surgery system has been described as an example, the technology according to the present disclosure may be applied, for example, to a microscopic surgery system or the like.

<Application Example of Moving Body>

The technology according to the present disclosure (present technology) can be applied to various products. For example, the technology according to the present disclosure may be implemented as an apparatus that is incorporated in any type of moving body such as an automobile, an electric car, a hybrid electric car, a motorcycle, a bicycle, a personal mobility, an airplane, a drone, a ship, a robot and so forth.

Figure 45:
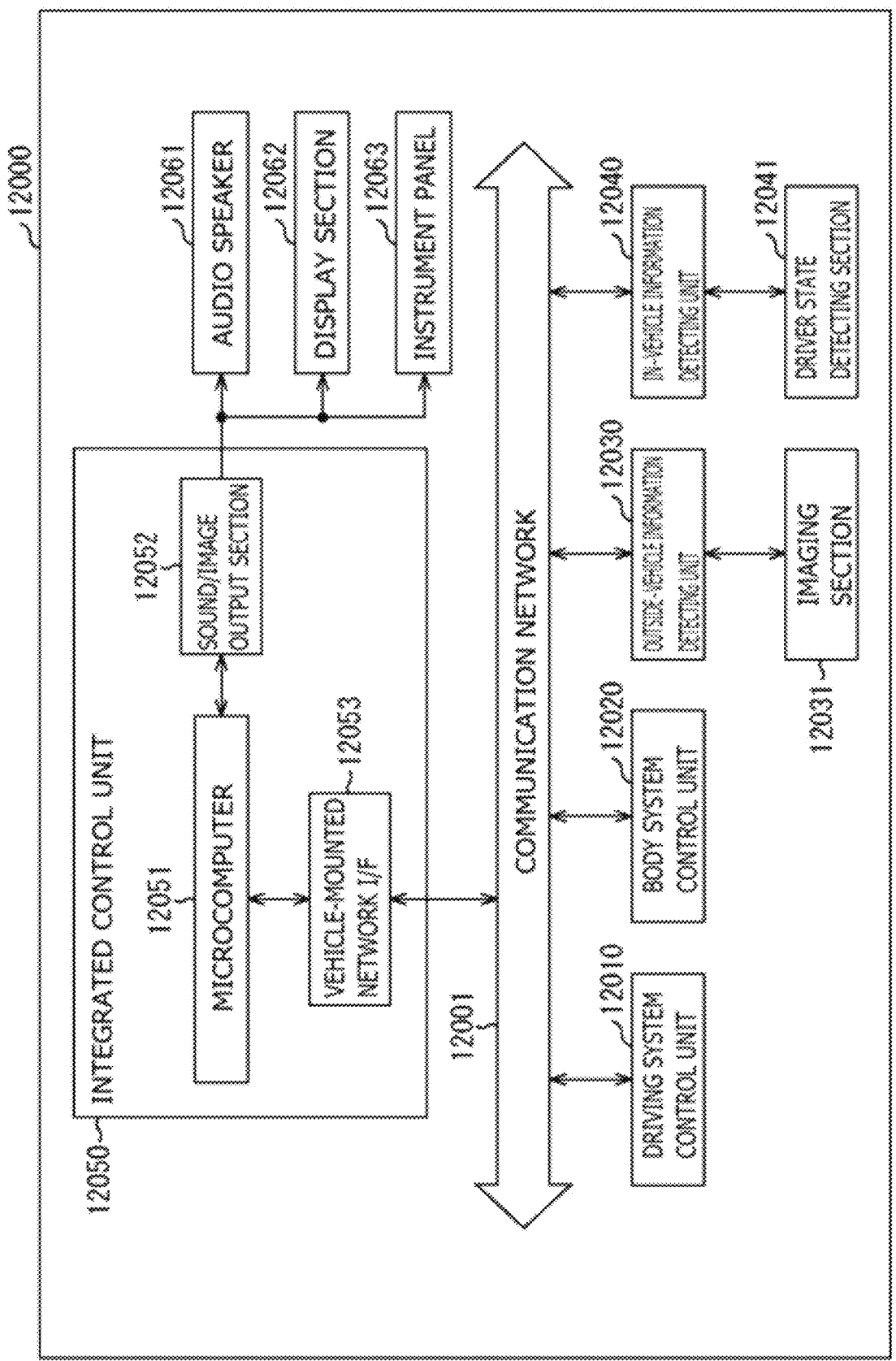
FIG. 45 is a block diagram depicting an example of schematic configuration of a vehicle control system.

FIG. 45 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 45, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 45, an audio speaker 12061, a display section 12062, and an instrument panel 12063 are illustrated as the output device. The display section 12062 may, for example, include at least one of an on-board display or a head-up display.

Figure 46:
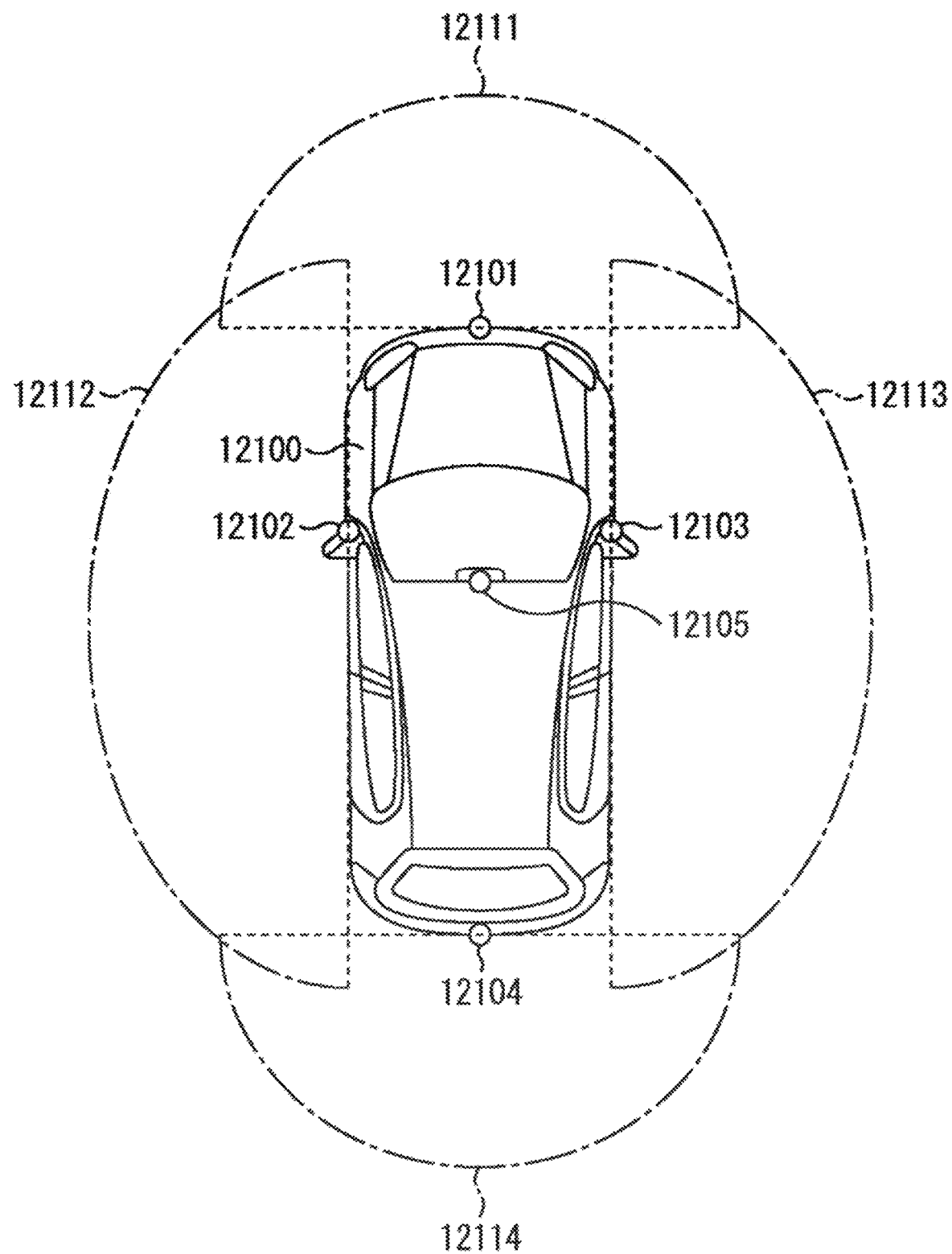
FIG. 46 is a diagram of assistance in explaining an example of installation positions of an outside-vehicle information detecting section and an imaging section.

FIG. 46 is a diagram depicting an example of the installation position of the imaging section 12031.

In FIG. 46, on the vehicle 12100, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The image of the front of the vehicle 12100. The imaging sections 12101 and 12105 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 46 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described. The technology according to the present disclosure can be applied to the imaging section 12031 or the like in the configuration described above.

<<5. Conclusion>>

As described above, in the distance image sensor according to the embodiment of the present disclosure, the light reception section receives light projected from the light source and reflected by an imaging object to detect, for every predetermined detection period, a reception light amount of the reflected light within the detection period. Further, the measurement section measures the distance to the imaging object on the basis of the reception light amount. Further, the control section applies each of a first delay amount and a second delay amount between which a resolution in control is different to control of one of a first timing at which the light reception section is to detect the light reception apparatus and a second timing at which the light source is to project light. On the basis of such a configuration as just described, the control section controls the relative time difference between the first timing and the second timing with a resolution finer than the resolutions of the first delay amount and the second delay amount.

By such a configuration as described above, it is possible to synthesize operation of the light source and operation of the light reception section with each other with a higher degree of accuracy in comparison with an alternative case in which the relative time difference between the first timing and the second timing is controlled on the basis of only one of the first delay amount and the second delay amount. In other words, with the distance image sensor according to the embodiment of the present disclosure, it becomes possible to further reduce the influence of an error caused by a resolution in processing relating to measurement of the distance, and after all, it becomes possible to anticipate an effect of further improving the accuracy relating to measurement of the distance.

Although the preferred embodiments of the present disclosure have been described in detail with reference to the accompanying drawings, the technical scope of the present disclosure is not limited to such embodiments as described above. It is apparent that those who have common knowledge in the technical field of the present disclosure can conceive various alternations or modifications without departing from the technical scope described in the claims, and it is recognized that also they naturally belong to the technical scope of the present disclosure.

As a particular example, the number of types of delay amounts that are applied to control of a timing at which the reception section is to detect a light reception amount or a timing at which the light source is to project light is not limited to two. In particular, each of three or more types of delay amounts whose delay adjustment resolutions are different from each other may be applied to control of the timing at which the light reception section is to detect a reception light amount or the timing at which the light source is to project light. As a more particular example, the number of types of delay amounts to be used for the control may be determined in response to a resolution required for the control of the relative time difference between the timing at which the light reception section is to detect the light reception amount and the timing at which the light source is to project light.

Further, in the case where three or more types of delay amounts are utilized, also it is possible to utilize both of the first control example and the second control example described hereinabove in combination. As a particular example, in the case where first to third delay amounts whose delay adjustment resolutions are different from each other are utilized, the first delay amount and the second delay amount may be applied to control of the timing at which the light reception section is to detect the light reception amount while the third delay amount is applied to control of the timing at which the light source is to project light.

Further, as another example, the number of types of signals to which delays whose delay adjustment resolutions are different from each other are applied is not necessarily limited to two. In particular, three or more kinds of signals (for example, driving signals) may be made a target of the control relating to a delay described above. It is to be noted that, in this case, for example, the number of types of delay amounts to be used for control relating to a delay may be determined in response to the number of types of signals that are made a target of the control.

Further, the advantageous effects described in the present specification are explanatory and exemplary to the last and are not restrictive. In other words, the technology according to the present disclosure can play, together with or in places of the advantageous effects described above, other advantageous effects that are apparent to those skilled in the art from the description of the present specification.

It is to be noted that also such configurations as described below belong to the technical scope of the present disclosure.

(1)

A sensor chip, including:

a light reception section configured to receive light projected from a light source and reflected by an imaging target to detect, for each given detection period, a reception light amount of the reflected light within the given period;

a measurement section configured to measure a distance to the imaging object based on the reception light amount; and a control section configured to apply at least one of a first delay amount or a second delay amount, whose resolutions relating to control are different from each other, to control of a first timing at which the light reception section is to detect the reception light amount thereby to control a relative time difference between the first timing and a second timing at which the light source is to project light with a resolution finer than the resolutions of the first delay amount and the second delay amount in response to the first delay amount and the second delay amount.

(2)

The sensor chip according to (1) above, in which the control section controls the time difference by controlling the first delay amount to be applied to the control of the first timing in response to the second delay amount applied to the control of the second timing.

(3)

The sensor chip according to (1) above, in which the control section controls the time difference by controlling the first delay amount and the second delay amount to be applied to the control of the first timing.

(4)

Electronic equipment, including:

a light source;

a light reception section configured to receive light projected from the light source and reflected by an imaging target to detect, for each given detection period, a reception light amount of the reflected light within the given period;

a measurement section configured to measure a distance to the imaging object based on the reception light amount; and a control section configured to apply each of a first delay amount and a second delay amount, whose resolutions relating to control are different from each other, to control of one of a first timing at which the light reception section is to detect the reception light amount and a second timing at which the light source is to project light thereby to control a relative time difference between the first timing and the second timing with a resolution finer than the resolutions of the first delay amount and the second delay amount.

(5)

The electronic equipment according to (4) above, in which the control section applies one of the first delay amount and the second delay amount to the control of the first timing and applies the other to the control of the second timing thereby to control the time difference.

(6)

The electronic equipment according to (4) above, in which the control section applies both of the first delay amount and the second delay amount to one of the control of the first timing and the control of the second timing to control the time difference.

(7)

The electronic equipment according to any one of (4) to (6) above, in which the control section controls the first delay amount and the second delay amount individually to control the time difference.

(8)

The electronic equipment according to any one of (4) to (7) above, further including:

a generation circuit configured to generate a first driving signal and a second driving signal, in which the light reception section is driven based on the first driving signal, and the light source is driven based on the second driving signal.

(9)

The electronic equipment according to (8) above, in which the control section controls the time difference by delaying the generated first driving signal or second driving signal based on the first delay amount and the second delay amount.

(10)

The electronic equipment according to (8) above, in which the generation circuit generates the first driving signal and the second driving signal in response to the first delay amount and the second delay amount, and the driving of the light source and the light reception section is controlled based on the generated first driving signal and second driving signal thereby to control the time difference.

(11)

The electronic equipment according to any one of (4) to (10) above, in which the control section includes a first delay circuit configured to perform a delay for an input signal in accordance with the first delay amount, and a second delay circuit configured to perform a delay for the input signal in accordance with the second delay amount, and the first delay circuit and the second delay circuit are different in at least one of an additional capacitance of delay elements provided in each of the first delay circuit and the second delay circuit, a load resistance of the delay elements, a connection stage number of the delay elements or a size of a transistor applied to the delay elements.

(12)

The electronic equipment according to any one of (4) to (11) above, further including:

an error arithmetic operation section configured to calculate an error relating to measurement of a distance in response to a detection result of the reception light amount, in which the control section controls at least one of the first delay amount or the second delay amount in response to a calculation result of the error.

(13)

An apparatus, including:

a light source;

a light reception section configured to receive light projected from the light source and reflected by an imaging target to detect, for each given detection period, a reception light amount of the reflected light within the given period;

a measurement section configured to measure a distance to the imaging object based on the reception light amount; and a control section configured to apply each of a first delay amount and a second delay amount, whose resolutions relating to control are different from each other, to control of one of a first timing at which the light reception section is to detect the reception light amount and a second timing at which the light source is to project light thereby to control a relative time difference between the first timing and the second timing with a resolution finer than the resolutions of the first delay amount and the second delay amount.

(14)

An apparatus, including:

a control section configured to control operation of each of a light source and a light reception section configured to receive light projected from the light source and reflected by an imaging target to detect, for each given detection period, a reception light amount of the reflected light within the given period, in which the control section applies each of a first delay amount and a second delay amount, whose resolutions relating to control are different from each other, to control of one of a first timing at which the light reception section is to detect the reception light amount and a second timing at which the light source is to project light thereby to control a relative time difference between the first timing and the second timing with a resolution finer than the resolutions of the first delay amount and the second delay amount, and a distance to the imaging object is measured based on the reception light amount.

REFERENCE SIGNS LIST

201: Distance image sensor
202: Optical system
203: Sensor chip
204: Image processing circuit
205: Monitor
206: Memory
211: Light source apparatus
1010, 1020: Phase adjustment circuit
1011, 1021: First variable delay circuit
1013, 1023: Second variable delay circuit
1100: Distance image sensor
1101: Sensor chip
1111: Pixel array
1113: Pixel driving circuit
1115: Reading out circuit
1120: PLL
1130: Inputting and outputting section
1140: Driving signal generation circuit
1141: Pixel driving pulse generation circuit
1143: Light source driving pulse generation circuit
1150: Phase adjustment circuit
1160: Control circuit
1171: Light source
1173: Light source driving circuit

The invention claimed is:

1. A sensor chip, comprising:
a light sensor configured to receive light projected from a light source and reflected by an imaging target to detect, for each given detection period, a reception light amount of the reflected light within the given detection period; and
circuitry configured to:
measure a distance to the imaging target based on the reception light amount; and
apply a first delay amount and a second delay amount to a relative time difference between a first timing at which the sensor detects the reception light and a second timing at which the light source projects light, wherein the first delay amount and the second delay amount have different resolutions, such that the relative time difference has a resolution finer than the resolutions of the first delay amount and the second delay amount.

2. The sensor chip according to claim 1, wherein
the circuitry is configured to control the relative time difference by controlling the first delay amount to be applied to the control of the first timing in response to the second delay amount applied to the control of the second timing.

3. The sensor chip according to claim 1, wherein
the circuitry is configured to control the relative time difference by controlling the first delay amount and the second delay amount to be applied to the control of the first timing.

4. Electronic equipment, comprising:
a light source;
a light sensor configured to receive light projected from the light source and reflected by an imaging target to detect, for each given detection period, a reception light amount of the reflected light within the given detection period; and
circuitry configured to:
measure a distance to the imaging target based on the reception light amount; and
apply a first delay amount and a second delay amount to a relative time difference between a first timing at which the sensor detects the reception light and a second timing at which the light source projects light, wherein the first delay amount and the second delay amount have different resolutions, such that the relative time difference has a resolution finer than the resolutions of the first delay amount and the second delay amount.

5. The electronic equipment according to claim 4, wherein
the circuitry is configured to apply one of the first delay amount and the second delay amount to the control of the first timing and to apply the other to the control of the second timing thereby to control the relative time difference.

6. The electronic equipment according to claim 4, wherein
the circuitry is configured to apply both of the first delay amount and the second delay amount to one of the control of the first timing and the control of the second timing to control the relative time difference.

7. The electronic equipment according to claim 4, wherein
the circuitry is configured to control the first delay amount and the second delay amount individually to control the relative time difference.

8. The electronic equipment according to claim 4,
wherein the circuitry is further configured to generate a first driving signal and a second driving signal, wherein
the light sensor is driven based on the first driving signal, and
the light source is driven based on the second driving signal.

9. The electronic equipment according to claim 8, wherein
the circuitry is configured to control the time difference by delaying the generated first driving signal or second driving signal based on the first delay amount and the second delay amount.

10. The electronic equipment according to claim 8, wherein
the circuitry is configured to generate the first driving signal and the second driving signal in response to the first delay amount and the second delay amount, and
the driving of the light source and the light sensor is controlled based on the generated first driving signal and second driving signal thereby to control the relative time difference.

11. The electronic equipment according to claim 4, wherein
the circuitry includes
a first delay circuit configured to perform a delay for an input signal in accordance with the first delay amount, and a second delay circuit configured to perform a delay for the input signal in accordance with the second delay amount, and the first delay circuit and the second delay circuit are different in at least one of an additional capacitance of delay elements provided in each of the first delay circuit and the second delay circuit, a load resistance of the delay elements, a connection stage number of the delay elements or a size of a transistor applied to the delay elements.

12. The electronic equipment according to claim 4, wherein the circuitry is further configured to calculate an error relating to measurement of a distance in response to a detection result of the reception light amount, and to control at least one of the first delay amount or the second delay amount in response to a calculation result of the error.

13. An apparatus, comprising:

a light source;

a light sensor configured to receive light projected from the light source and reflected by an imaging target to detect, for each given detection period, a reception light amount of the reflected light within the given detection period; and circuitry configured to:

measure a distance to the imaging target based on the reception light amount; and apply each of a first delay amount and a second delay amount, whose resolutions relating to control are different from each other, to control of one of a first timing at which the light sensor is to detect the reception light amount and a second timing at which the light source is to project light thereby to control a relative time difference between the first timing and the second timing with a resolution finer than the resolutions of the first delay amount and the second delay amount.

14. An apparatus, comprising:

circuitry configured to control operation of each of a light source and a light sensor configured to receive light projected from the light source and reflected by an imaging target to detect, for each given detection period, a reception light amount of the reflected light within the given detection period, wherein the circuitry applies each of a first delay amount and a second delay amount, whose resolutions relating to control are different from each other, to control of one of a first timing at which the light sensor is to detect the reception light amount and a second timing at which the light source is to project light thereby to control a relative time difference between the first timing and the second timing with a resolution finer than the resolutions of the first delay amount and the second delay amount, and a distance to the imaging target is measured based on the reception light amount.

\* \* \* \* \*